United States Patent
de Brouwer et al.

(10) Patent No.: US 9,299,898 B2
(45) Date of Patent: Mar. 29, 2016

(54) POLYCARBONATE COMPOSITIONS CONTAINING CONVERSION MATERIAL CHEMISTRY AND HAVING ENHANCED OPTICAL PROPERTIES, METHODS OF MAKING AND ARTICLES COMPRISING THE SAME

(71) Applicant: SABIC Global Technologies B.V., Bergen op Zoom (NL)

(72) Inventors: Johannes de Brouwer, Oisterwijk (NL); Christopher Luke Hein, Evansville, IN (US); Thomas L. Evans, Mount Vernon, IN (US); Paulus Johannes Maria Eijsbouts, Nieuwkuijk (NL); Hatem Abdallah Belfadhel, Roosendaal (NL); Jos Arie van den Bogerd, Tholen (NL); Peter Anthony DiMattia, Pittsfield, MA (US)

(73) Assignee: SABIC GLOBAL TECHNOLOGIES B.V. (NL)

( * ) Notice: Subject to any disclaimer, the term of this patent is extended or adjusted under 35 U.S.C. 154(b) by 0 days.

(21) Appl. No.: 14/797,417

(22) Filed: Jul. 13, 2015

(65) Prior Publication Data

US 2015/0318450 A1    Nov. 5, 2015

Related U.S. Application Data

(63) Continuation of application No. 13/779,324, filed on Feb. 27, 2013.

(60) Provisional application No. 61/604,951, filed on Feb. 29, 2012.

(51) Int. Cl.
*H01L 33/56* (2010.01)
*C09K 11/77* (2006.01)
(Continued)

(52) U.S. Cl.
CPC ............... *H01L 33/56* (2013.01); *C08G 64/06* (2013.01); *C08L 69/00* (2013.01); *C09K 11/592* (2013.01);
(Continued)

(58) Field of Classification Search
CPC ............. H01L 33/502; C09K 11/7774; C09K 11/7734; C09K 11/7783; C09K 11/7728; C09K 11/7715; C09K 11/592; C09K 11/646; Y10T 428/13; Y10T 428/1352
See application file for complete search history.

(56) References Cited

U.S. PATENT DOCUMENTS

| 489,803 A | 1/1893 | Gillespie et al. |
| 825,010 A | 7/1906 | Snow |

(Continued)

FOREIGN PATENT DOCUMENTS

| CN | 1853118 A | 10/2006 |
| CN | 101205358 A | 6/2008 |

(Continued)

OTHER PUBLICATIONS

Advisory Action for U.S. Appl. No. 13/565,292, filed Aug. 2, 2012; Date of Notification: Oct. 20, 2014; 10 Pages.
(Continued)

*Primary Examiner* — Michael C Miggins
(74) *Attorney, Agent, or Firm* — Cantor Colburn LLP

(57) ABSTRACT

In some embodiments, a composition includes: a conversion material and a bisphenol-A polycarbonate; wherein a molded article of the bisphenol-A polycarbonate has a transmission level of greater than or equal to 90.0% at a thickness of 2.5 mm as measured by ASTM D1003-00; and wherein the molded article comprises an increase in the yellow index of less than 2 during 2,000 hours of heat aging at 130° C.; and wherein the conversion material comprises a yellow conversion material, a green conversion material, a red conversion material, or a combination comprising at least one of the foregoing.

20 Claims, 7 Drawing Sheets

(51) Int. Cl.

| | | |
|---|---|---|
| *C09K 11/59* | (2006.01) | |
| *C09K 11/64* | (2006.01) | |
| *C08G 64/06* | (2006.01) | |
| *C08L 69/00* | (2006.01) | |
| *H01L 23/29* | (2006.01) | |
| *H01L 33/50* | (2010.01) | |

(52) U.S. Cl.
CPC ............ *C09K 11/646* (2013.01); *C09K 11/7715* (2013.01); *C09K 11/7728* (2013.01); *C09K 11/7734* (2013.01); *C09K 11/7774* (2013.01); *C09K 11/7783* (2013.01); *H01L 23/293* (2013.01); *H01L 33/50* (2013.01); *H01L 33/501* (2013.01); *H01L 33/502* (2013.01); *C08L 2205/02* (2013.01); *H01L 2924/0002* (2013.01); *H01L 2933/0091* (2013.01)

(56) References Cited

U.S. PATENT DOCUMENTS

| | | |
|---|---|---|
| 3,049,568 A | 8/1962 | Apel et al. |
| 3,394,089 A | 7/1968 | McNutt et al. |
| 3,673,262 A | 6/1972 | Prahl et al. |
| 3,839,247 A | 10/1974 | Bialous et al. |
| 4,045,379 A | 8/1977 | Kwantes et al. |
| 4,052,466 A | 10/1977 | Sun |
| 4,076,686 A | 2/1978 | Calkins |
| 4,191,843 A | 3/1980 | Kwantes et al. |
| 4,294,995 A | 10/1981 | Faler et al. |
| 4,308,404 A | 12/1981 | Kwantes et al. |
| 4,308,405 A | 12/1981 | Kwantes |
| 4,346,247 A | 8/1982 | Faler et al. |
| 4,365,099 A | 12/1982 | Faler et al. |
| 4,391,997 A | 7/1983 | Mendiratta |
| 4,396,728 A | 8/1983 | Faler |
| 4,400,555 A | 8/1983 | Mendiratta |
| 4,423,252 A | 12/1983 | Maki et al. |
| 4,424,283 A | 1/1984 | Faler et al. |
| 4,455,409 A | 6/1984 | Faler et al. |
| 4,478,956 A | 10/1984 | Maki et al. |
| 4,584,416 A | 4/1986 | Pressman et al. |
| 4,590,303 A | 5/1986 | Mendiratta |
| 4,595,704 A | 6/1986 | Fazio |
| 4,820,740 A | 4/1989 | Li |
| 4,822,923 A | 4/1989 | Li |
| 4,918,245 A | 4/1990 | Iimuro et al. |
| 5,015,784 A | 5/1991 | Rudolph et al. |
| 5,064,885 A | 11/1991 | Muller et al. |
| 5,087,767 A | 2/1992 | Okamoto et al. |
| 5,212,206 A | 5/1993 | Rudolph et al. |
| 5,233,096 A | 8/1993 | Lundquist |
| 5,284,981 A | 2/1994 | Rudolph et al. |
| 5,288,926 A | 2/1994 | Patrascu et al. |
| 5,302,774 A | 4/1994 | Berg et al. |
| 5,364,895 A | 11/1994 | Stevenson et al. |
| 5,395,857 A | 3/1995 | Berg et al. |
| 5,414,151 A | 5/1995 | Pressman et al. |
| 5,414,152 A | 5/1995 | Cipullo |
| 5,424,006 A | 6/1995 | Murayama et al. |
| 5,438,086 A | 8/1995 | Stevenson et al. |
| 5,455,282 A | 10/1995 | Berg et al. |
| 5,463,140 A | 10/1995 | Wehmeyer et al. |
| 5,470,938 A | 11/1995 | Sakashita et al. |
| 5,475,154 A | 12/1995 | Lundquist et al. |
| 5,502,153 A | 3/1996 | Sakashita et al. |
| 5,530,062 A | 6/1996 | Bradtke et al. |
| 5,589,517 A | 12/1996 | Sugawara et al. |
| 5,631,338 A | 5/1997 | Inoue et al. |
| 5,672,664 A | 9/1997 | DeRudder et al. |
| 5,698,600 A | 12/1997 | Wulff et al. |
| 5,747,632 A | 5/1998 | Adachi et al. |
| 5,780,690 A | 7/1998 | Berg et al. |
| 5,783,733 A | 7/1998 | Kissinger |
| 5,837,757 A | 11/1998 | Nodera et al. |
| 5,883,218 A | 3/1999 | Gordon et al. |
| 5,914,431 A | 6/1999 | Fennhoff |
| 5,939,494 A | 8/1999 | Wehmeyer et al. |
| 6,066,861 A | 5/2000 | Hohn et al. |
| 6,069,225 A | 5/2000 | Gerace et al. |
| 6,133,190 A | 10/2000 | Wehmeyer et al. |
| 6,174,987 B1 | 1/2001 | Gordon et al. |
| 6,211,417 B1 | 4/2001 | Fengler et al. |
| 6,329,556 B1 | 12/2001 | Sakura et al. |
| 6,355,946 B1 | 3/2002 | Ishinaga |
| 6,373,262 B1 | 4/2002 | Herring et al. |
| 6,414,199 B1 | 7/2002 | Saruwatari |
| 6,429,343 B1 | 8/2002 | Iwahara |
| 6,486,222 B2 | 11/2002 | Kissinger et al. |
| 6,586,637 B2 | 7/2003 | Iwahara |
| 6,613,823 B1 | 9/2003 | Battiste et al. |
| 6,653,513 B1 | 11/2003 | Iwahara |
| 6,653,613 B1 | 11/2003 | Bucourt et al. |
| 6,664,313 B2 | 12/2003 | Hirai et al. |
| 6,676,852 B2 | 1/2004 | Brown et al. |
| 6,692,659 B2 | 2/2004 | Brown et al. |
| 6,706,846 B2 | 3/2004 | Brack et al. |
| 6,710,211 B1 | 3/2004 | Heydenreich et al. |
| 6,716,368 B1 | 4/2004 | Schottland et al. |
| 6,727,394 B2 | 4/2004 | Saruwatari |
| 6,730,816 B2 | 5/2004 | Lundquist |
| 6,740,784 B2 | 5/2004 | Iwahara et al. |
| 6,995,294 B2 | 2/2006 | Webb et al. |
| 7,112,702 B2 | 9/2006 | Carvill et al. |
| 7,112,703 B2 | 9/2006 | Neumann et al. |
| 7,129,382 B2 | 10/2006 | Iwahara et al. |
| 7,148,313 B2 | 12/2006 | Koga et al. |
| 7,227,046 B2 | 6/2007 | Commarieu |
| 7,491,837 B2 | 2/2009 | Schlosberg et al. |
| 7,852,428 B2 | 12/2010 | Byoun et al. |
| 7,879,927 B2 | 2/2011 | Vlottes et al. |
| 7,923,586 B2 | 4/2011 | Stahlbush et al. |
| 7,959,827 B2 | 6/2011 | Comanzo et al. |
| 7,964,273 B2 | 6/2011 | Kogure et al. |
| 7,989,531 B2 | 8/2011 | Bersted et al. |
| 8,735,634 B2 | 5/2014 | Hasyagar et al. |
| 9,090,759 B2 | 7/2015 | Flores et al. |
| 2002/0115762 A1 | 8/2002 | Chung et al. |
| 2002/0147256 A1 | 10/2002 | Eckel et al. |
| 2003/0180542 A1 | 9/2003 | Pickett et al. |
| 2003/0232957 A1 | 12/2003 | Silvi et al. |
| 2004/0077820 A1 | 4/2004 | Silva et al. |
| 2004/0116751 A1 | 6/2004 | Carvill et al. |
| 2004/0181100 A1 | 9/2004 | Lundquist |
| 2004/0227465 A1 | 11/2004 | Menkara et al. |
| 2005/0035331 A1 | 2/2005 | Sun |
| 2005/0177007 A1 | 8/2005 | Neumann et al. |
| 2005/0209434 A1 | 9/2005 | Abad et al. |
| 2005/0215833 A1 | 9/2005 | Neumann et al. |
| 2005/0261414 A1 | 11/2005 | Mitsuhashi et al. |
| 2005/0272857 A1 | 12/2005 | Kawato et al. |
| 2006/0047037 A1 | 3/2006 | Kawato et al. |
| 2006/0135690 A1 | 6/2006 | Juikar et al. |
| 2006/0159926 A1 | 7/2006 | Funaki et al. |
| 2006/0247356 A1 | 11/2006 | Agarwal |
| 2006/0263547 A1 | 11/2006 | Cojocariu et al. |
| 2007/0004941 A1 | 1/2007 | Blaschke et al. |
| 2007/0054110 A1 | 3/2007 | Kawato et al. |
| 2007/0139949 A1 | 6/2007 | Tanda et al. |
| 2007/0299169 A1 | 12/2007 | Ohira et al. |
| 2008/0029720 A1 | 2/2008 | Li |
| 2008/0081855 A1 | 4/2008 | Mullen |
| 2008/0113117 A1 | 5/2008 | Coenjarts et al. |
| 2008/0132614 A1 | 6/2008 | Jung et al. |
| 2009/0043053 A1 | 2/2009 | Gorney et al. |
| 2009/0054586 A1 | 2/2009 | Hein et al. |
| 2009/0118406 A1 | 5/2009 | Tomoda |
| 2010/0137549 A1 | 6/2010 | Takahashi et al. |
| 2011/0127904 A1 | 6/2011 | Tsai |
| 2011/0140593 A1 | 6/2011 | Negley et al. |
| 2011/0151262 A1 | 6/2011 | Heuer et al. |
| 2011/0278614 A1 | 11/2011 | Maier-Richter et al. |
| 2012/0043552 A1 | 2/2012 | David et al. |
| 2012/0131835 A1 | 5/2012 | Barrett et al. |

(56) References Cited

U.S. PATENT DOCUMENTS

| | | | |
|---|---|---|---|
| 2012/0248102 A1 | 10/2012 | Van De Wetering et al. |
| 2012/0283485 A1 | 11/2012 | Hasyagar et al. |
| 2013/0094179 A1 | 4/2013 | Dai et al. |
| 2013/0108820 A1 | 5/2013 | Belfadhel et al. |
| 2013/0200415 A1 | 8/2013 | Evans et al. |
| 2013/0221837 A1 | 8/2013 | De Brouwer et al. |
| 2013/0265771 A1 | 10/2013 | Flores et al. |
| 2013/0270591 A1 | 10/2013 | De Brouwer et al. |
| 2013/0274391 A1 | 10/2013 | An et al. |
| 2014/0051802 A1 | 2/2014 | De Brouwer et al. |
| 2014/0051803 A1 | 2/2014 | De Brouwer et al. |
| 2014/0117393 A1 | 5/2014 | Van Heerbeek et al. |
| 2014/0226342 A1 | 8/2014 | Flores et al. |
| 2014/0339586 A1 | 11/2014 | Morizur et al. |
| 2015/0267059 A1 | 9/2015 | Florest et al. |

FOREIGN PATENT DOCUMENTS

| | | |
|---|---|---|
| CN | 101885907 A | 11/2010 |
| CN | 102134383 A | 7/2011 |
| CN | 202091807 U | 12/2011 |
| DE | 19503470 A1 | 8/1996 |
| DE | 102006016548 A1 | 10/2006 |
| EP | 0320658 A1 | 6/1989 |
| EP | 0475893 A1 | 3/1992 |
| EP | 0313165 B1 | 1/1993 |
| EP | 0523931 A2 | 1/1993 |
| EP | 0524731 A1 | 1/1993 |
| EP | 0693470 B1 | 5/1998 |
| EP | 0885929 A1 | 12/1998 |
| EP | 0676237 B1 | 3/1999 |
| EP | 1160229 A1 | 12/2001 |
| EP | 1201303 A1 | 5/2002 |
| EP | 1234845 A2 | 8/2002 |
| EP | 1273563 A1 | 1/2003 |
| EP | 0788839 B1 | 5/2003 |
| EP | 1371623 A1 | 12/2003 |
| EP | 1459805 A1 | 9/2004 |
| EP | 1500671 A1 | 1/2005 |
| EP | 2143750 A1 | 1/2005 |
| EP | 1555296 A1 | 7/2005 |
| EP | 1222960 B1 | 8/2005 |
| EP | 1808726 A1 | 7/2007 |
| EP | 1925874 A1 | 5/2008 |
| EP | 1520617 B1 | 2/2009 |
| EP | 2248841 A1 | 11/2010 |
| FR | 2685221 A1 | 6/1993 |
| FR | 2685323 A1 | 6/1993 |
| GB | 1377227 A | 12/1974 |
| JP | 5271132 A | 10/1993 |
| JP | 5294875 A | 11/1993 |
| JP | 5294876 A | 11/1993 |
| JP | 8038910 A | 2/1996 |
| JP | 08071433 A | 3/1996 |
| JP | 08319248 A | 12/1996 |
| JP | 08325185 A | 12/1996 |
| JP | 10211434 A | 8/1998 |
| JP | 10251180 A | 9/1998 |
| JP | 10314595 A | 12/1998 |
| JP | 10328573 A | 12/1998 |
| JP | 11179210 A | 7/1999 |
| JP | 11246458 A | 9/1999 |
| JP | 11255748 A | 9/1999 |
| JP | 2000281607 A | 10/2000 |
| JP | 2000281608 A | 10/2000 |
| JP | 2000319216 A | 11/2000 |
| JP | 2001233812 A | 8/2001 |
| JP | 2004149623 A | 5/2004 |
| JP | 2004231935 A | 8/2004 |
| JP | 2005037591 A | 2/2005 |
| JP | 2005048154 A | 2/2005 |
| JP | 2005082713 A | 3/2005 |
| JP | 2005115051 A | 4/2005 |
| JP | 2006339033 A | 12/2006 |
| JP | 2008184482 A | 8/2008 |
| JP | 2011029051 A | 2/2011 |
| JP | 2012131835 A | 7/2012 |
| KR | 20110033772 A | 3/2011 |
| WO | 9209550 A1 | 6/1992 |
| WO | 9708122 A1 | 3/1997 |
| WO | 0050372 A1 | 8/2000 |
| WO | 0055249 A1 | 9/2000 |
| WO | 0059853 A1 | 10/2000 |
| WO | 2008100165 A1 | 8/2008 |
| WO | 2011082204 A1 | 7/2011 |
| WO | 2011134674 A1 | 11/2011 |
| WO | 2012150559 A1 | 11/2012 |
| WO | 2012150560 A1 | 11/2012 |
| WO | 2013021332 A1 | 2/2013 |
| WO | 2013061274 A1 | 5/2013 |

OTHER PUBLICATIONS

Anderson et al.; "Quantitative Analysis of Commercial Bisphenol A by Paper Chromatography"; Analytical Chemistry; vol. 31, No. 7; 1959; p. 1214-1217.

Brunelle, D.J.: "Polycarbonates", Encyclopedia of Polymer Science and Technology, Jan. 1, 2006, pp. I.1-33, XP002525090, DOI: 10.1002/0471440264PST255.PUB2, Retrieved from the Internet: URL: http://mrw.interscience.wiley.com/emrw/9780471440260/epst/article/p.

Brydia; "Determination of Bisphenol A and Impurities by Gas Chromatography of Their Trimethylsilyl Ether Derivatives" Analytical Chemistry; vol. 40, No. 14; 1968; pp. 2212-2215.

Chan et al., "Facile Quantitative Analysis of Hydroxyl End Groups of Poly (2,6-dimethyl-1,4-phenylene oxide)s by 31P NMR Spectroscopy", Macromolecules (1994), vol. 27, pp. 6371-6375.

Chinese Patent No. 101205358 (A); Publication Date: Jun. 25, 2008; Abstract Only; 1 Page.

Chinese Patent No. 101885907 (A); Publication Date: Nov. 17, 2010; Abstract Only; 1 Page.

Chinese Patent No. 102134383 (A); Publication Date: Jul. 27, 2011; Abstract Only; 1 Page.

Chinese Patent No. 202091807 (U); Publication Date: Dec. 28, 2011; Abstract Only; 1 Page.

Chou et al.; "The Optimum Conditions for Solid-State-Prepared (Y3-xCex)Al5O12 Phosphor Using the Taguchi Method"; Advanced Powder Technology; vol. 12; 2012; pp. 97-103.

De Brouwer et al.; "Lexan* Polycarbonate for Optical Applications"; SABIC Innovative Plsatics; Received Aug. 2, 2011; 5 Pages.

Factor et al.; "The Use of 31P NMR to Identify Color Bodies in y-irradiated Bisphenol-A Polycarbonate*"; Polymer Degradation and Stability; vol. 57; 1997; pp. 83-86.

Factor; "Search for the Sources of Color in Thermally Aged, Weathered and y-Ray Irradiated Bisphenol A Polycarbonate"; Die Angewandte Makromolekulare Chemie; vol. 232; 1995; pp. 27-43.

Final Office Action for U.S. Appl. No. 13/565,292, filed Aug. 2, 2012; Date of Notification: Aug. 5, 2014; 11 Pages.

Final Office Action for U.S. Appl. No. 13/565,292, filed Aug. 2, 2012; Date of Notification: May 4, 2015; 9 Pages.

Godinez et al.; "Experimental Study of the Influence of Raw Material Impurities on Yellowness Index of Transesterification Polycarbonate"; Journal of Applied Polymer Science; vol. 119; 2011; pp. 1348-1356.

International Search Report; International Application No. PCT/US2013/028024; International Filing Date: Feb. 27, 2013; Date of Mailing: Jun. 10, 2013; 5 Pages.

Japanese Patent No. 2004149623 (A); Publication Date: May 27, 2004; Abstract Only; 1 Page.

Japanese Patent No. 2004231935 (A); Publication Date: Aug. 19, 2004; Abstract Only; 1 Page.

Japanese Patent No. 2005037591 (A); Publication Date: Feb. 10, 2005; Abstract Only; 2 Pages.

Japanese Patent No. 2005048154 (A); Publication Date: Feb. 24, 2005; Abstract Only; 1 Page.

Japanese Patent No. 2005082713 (A); Publication Date: Mar. 31, 2005; Abstract Only; 2 Pages.

(56) References Cited

OTHER PUBLICATIONS

Japanese Patent No. 2005115051 (A); Publication Date: Apr. 28, 2005; Abstract Only; 1 Page.
Japanese Patent No. 2006339033 (A); Publication Date: Dec. 14, 2006; Abstract Only; 2 Pages.
Japanese Patent No. 2008184482 (A); Publication Date: Aug. 14, 2008; Abstract Only; 1 Page.
Japanese Patent No. 2011029051 (A); Publication Date: Feb. 10, 2011; Abstract Only; 2 Pages.
Li et al.; "Design of Mechanically Robust High-Tg Polymers: Synthesis and Dynamic Machanical Relaxation Behavior of Glassy Poly-(ester carbonate)s with Cyclohexylene Rings in the Backbone"; Macromolecules; vol. 36; 2003; pp. 9411-9420.
Liptak et al.; "Absolute pKa Determination for Substituted Phenols"; J. Am. Chem. Soc.; vol. 124; 2002; pp. 6421-6427.
Non-Final Office Action for U.S. Appl. No. 13/565,292, filed Aug. 2, 2012; Date of Notification: Apr. 29, 2014; 35 Pages.
Non-Final Office Action for U.S. Appl. No. 13/565,292, filed Aug. 2, 2012; Date of Notification: Dec. 31, 2014; 16 Pages.
Nowakowska et al.; "Studies of Some Impurities in Commercial Bisphenol-A"; Polish Journal of Applied Chemistry; vol. 3; 1996; pp. 247-254.
Poskrobko et al.; "High-Performance Liquid Chromatography with Multi-Wavelength Detection of the Bisphenol A Impurities"; Journal of Chromatography A; vol. 883; 2000; pp. 291-297.
Written Opinion of the International Searching Authority; International Application No. PCT/US2013/028024; International Filing Date: Feb. 27, 2013; Date of Mailing: Jun. 10, 2013; 4 Pages.
Anonymous, "Polycarbonate preparation with a low yellowness index," Research Disclosure, Mason Publications, Hampshire GB vol. 449, No. 49 (Sep. 1, 2001) ISSN: 0374-4353 pp. 1-3.
English Abstract of JP08038910(A); Date of Publication: Feb. 13, 1996; 1 Page.
English Abstract of JP08071433(A); Date of Publication: Mar. 19, 1996; 1 Page.
English Abstract of JP08325185(A); Date of Publication: Dec. 10, 1996; 2 Pages.
English Abstract of JP10211434(A); Date of Publication: Aug. 11, 1998; 2 Pages.
English Abstract of JP10251180(A); Date of Publication: Sep. 22, 1998; 1 Page.
English Abstract of JP10314595(A); Date of Publication: Dec. 2, 1998; 2 Pages.
English Abstract of JP10328573(A); Date of Publication: Dec. 15, 1998; 1 Page.
English Abstract of JP11179210(A); Date of Publication: Jul. 6, 1999; 2 Pages.
English Abstract of JP11246458(A); Date of Publication: Sep. 14, 1999; 1 Page.
English Abstract of JP11255748(A); Date of Publication: Sep. 21, 1999; 1 Page.
English Abstract of JP2000281607(A); Date of Publication: Oct. 10, 2000; 1 Page.
English Abstract of JP2000281608(A); Date of Publication: Oct. 10, 2000; 1 Page.
English Abstract of JP2000319216(A); Date of Publication: Nov. 21, 2000; 1 Page.
English Abstract of JP2001233812(A); Date of Publication: Aug. 28, 2001; 1 Page.
English Abstract of JP5271132(A); Date of Publication: Oct. 19, 1993; 2 Pages.
English Abstract of JP5294875(A); Date of Publication: Nov. 9, 1993; 2 Pages.
English Abstract of JP5294876(A); Date of Publication: Nov. 9, 1993; 1 Page.
International Search Report for International Application No. PCT/IB2012/052192; International Filing Date: May 2, 2012; Date of Mailing Aug. 3, 2015; 5 Pages.
International Search Report for International Application No. PCT/IB2012/052194; International Filing Date: May 2, 2012; Date of Mailing: Aug. 3, 2012; 5 Pages.
International Search Report for International Application No. PCT/IB2012/052198 International Filing Date: May 2, 2012; Date of Mailing: Aug. 3, 2012; 4 Pages.
International Search Report for International Application No. PCT/IB2012/052199; International Filing Date: May 2, 2012; Date of Mailing: Aug. 3, 2012; 5 pages.
Machine Translation of FR2685221(A1); Date of Publication: Jun. 25, 1993; 26 Pages.
Machine Translation of FR2685323(A1); Date of Publication: Jun. 25, 1993; 26 Pages.
Machine Translation of JP08319248(A); Date of Publication: Dec. 3, 1996; 8 Pages.
Cytec; Cyasorb UV-5411 Product Safety Summary; Cytec; Dec. 2012; pp. 1-5.
DE 19503470 A1; Date of Publication Aug. 8, 1996; 2 pages; English Abstract.
DuPont T-Pure—Titanium Dioxide; Polymers, Light and the Science of TiO2; Copyright 2007; 20 Pages.
Ishihara Sangyo; "Titanium Dioxide Products " WHITE Pigments; Ishihara Sangyo KK; 2012; 7 pages.
Japanese Patent No. 2012131835 (A); Publication Date: Jul. 12, 2012; Machine Translation from the Japanese Patent Office; 13 Pages.
Machine Translation of CN1853118(A); Date of Publication: Oct. 25, 2006; 48 Pages.
Yamada et al.; Sequential-color LCD based on OCB with an LED backlight; Journal of the SID; 10/1; 2002; 5 pages.

POLYCARBONATE COMPOSITIONS CONTAINING CONVERSION MATERIAL CHEMISTRY AND HAVING ENHANCED OPTICAL PROPERTIES, METHODS OF MAKING AND ARTICLES COMPRISING THE SAME

CROSS REFERENCE TO RELATED APPLICATIONS

The present application is a continuation of U.S. application Ser. No. 13/779,324, filed Feb. 27, 2013, which claims priority to U.S. Provisional Application Ser. No. 61/604,951, filed Feb. 29, 2012, the contents of which are hereby incorporated by reference.

BACKGROUND

The present disclosure generally relates to polycarbonate compositions, and more particularly, to polycarbonate compositions containing conversion material chemistry and having enhanced optical properties, methods of manufacture, and uses thereof.

Polycarbonate is a high-performance plastic with good impact strength (ductility). Polycarbonates, however, can age under the influence of heat, light, and time, causing reduced light transmission and color changes. A use of polycarbonate is with lighting devices such as those that use light emitting diodes (LEDs). Light emitting diodes (LEDs) are currently used as replacements for incandescent light bulbs and fluorescent lamps. LEDs are semiconductor devices that emit incoherent narrow-spectrum light when electrically biased in the forward direction of their p-n junctions (boundary between P-type and N-type semiconductor), and are thus referred to as solid-state lighting devices.

When a light-emitting diode is forward biased (switched on), electrons are able to recombine with electron holes within the device, releasing energy in the form of photons. This effect is called electroluminescence and the color of the light (corresponding to the energy of the photon) is determined by the energy gap of the semiconductor. An LED is often small in area (less than 1 square millimeter ($mm^2$)), and integrated optical components may be used to shape its radiation pattern. LEDs powerful enough for room lighting are relatively expensive and require more precise current and heat management than compact fluorescent lamp sources of comparable output.

There accordingly remains a need for polycarbonate compositions having enhanced optical properties, methods of making and articles comprising the polycarbonate compositions. There is also a need for polycarbonate containing material that meets these industry requirements as well as processes that effectuate the manufacture of materials that meet industry requirements.

BRIEF DESCRIPTION

Disclosed herein are polycarbonate compositions having enhanced optical properties, methods for making the polycarbonate composition, and articles comprising the polycarbonate compositions.

In one embodiment, a composition includes: a conversion material and a bisphenol-A polycarbonate; wherein a molded article of the bisphenol-A polycarbonate has a transmission level of greater than or equal to 90.0% at a thickness of 2.5 mm as measured by ASTM D1003-00; and wherein the molded article comprises an increase in the yellow index of less than 2 during 2,000 hours of heat aging at 130° C.; and wherein the conversion material comprises a yellow conversion material, a green conversion material, a red conversion material, or a combination comprising at least one of the foregoing.

In one embodiment, an article comprises: a composition comprising a conversion material and a bisphenol-A polycarbonate; wherein a molded article of the bisphenol-A polycarbonate has a transmission level of greater than or equal to 90.0% at a thickness of 2.5 mm as measured by ASTM D1003-00; and wherein the molded article comprises an increase in the yellow index of less than 2 during 2,000 hours of heat aging at 130° C.; and wherein the conversion material comprises a yellow conversion material, a green conversion material, a red conversion material, or a combination comprising at least one of the foregoing; wherein the article is an illumination device.

These and other non-limiting characteristics are more particularly described below.

DETAILED DESCRIPTION

Figure 1:
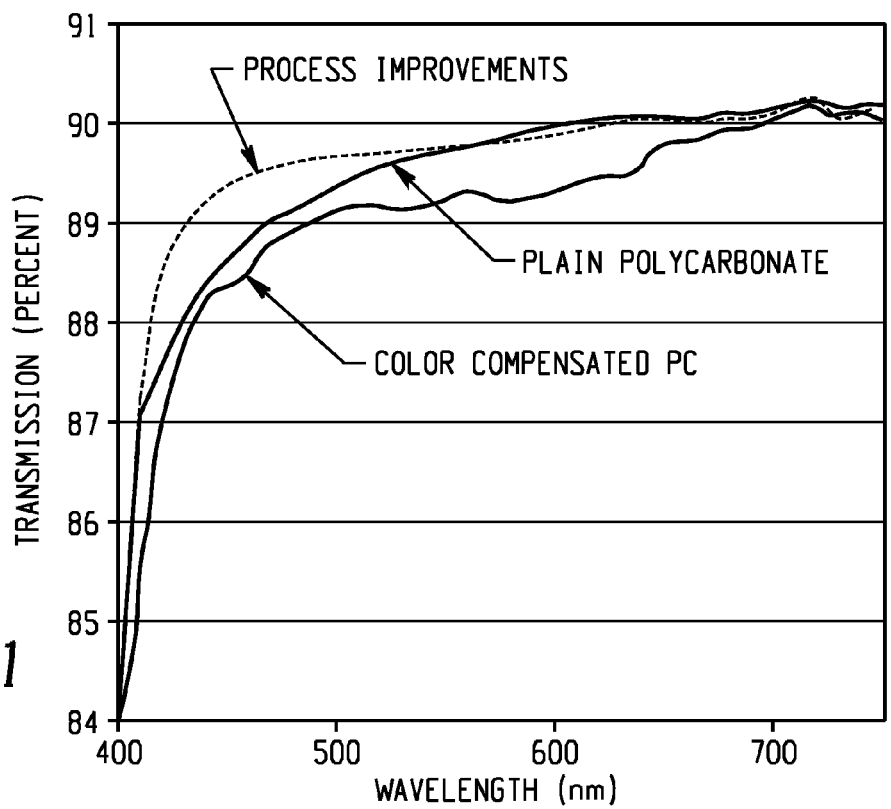
FIG. 1 is a graph depicting transmission (%) versus wavelength (nanometers (nm)) of polycarbonates.

One avenue for achieving the desired white light is to utilize conversion material chemistry in LED housings, specifically incorporating conversion materials throughout the LED housing, e.g., in close proximity to the LED. Conversion materials, e.g., luminescent materials, which emit light of longer wavelengths than that of the excitation source, include those having a solid inorganic host lattice doped with rare-earth element(s). Conversion materials can be incorporated within a polymeric substrate by either coatings or being compounded directly into the polymer matrix during extrusion. However, such conversion materials are expected to degrade the polymer (e.g., polycarbonate) when incorporated into the polymer melt during extrusion. For example, polycarbonate melt stability is expected to decrease and the general color of the conversion material, before and during LED excitation will likely produce an undesirable effect. Loss of melt stability could lead to at least one of the following: embrittlement; undesirable resin color. Resin yellowing can affect correlated color temperature (downward shift), color rendering index; and decreased luminous efficacy. Furthermore, loss of melt stability could negatively affect the molder's ability to accurately mold a flat disk or sphere shaped optic, wherein the molded conversion material optic needs uniform surface features and reliable shrink properties for optimal light modeling (ray tracing), production quality, and angular color uniformity.

It is further noted that diminished flame retardant properties are anticipated in parts molded from degraded resin. As a result, luminaire designers will be limited while attempting to specify a plastic material with an inadequate UL rating, e.g., a thin wall flame retardancy is desired (e.g., a UL94 V0 rating at less than or equal to 1.5 millimeters (mm)).

Optimized polymer and conversion material and optical properties are needed so that the LED lighting products can meet Department of Energy (DOE) Energy Star rating using measurement methods described in IESNA LM-79 and IES LM-80-08. Thus, there is a need in the art to satisfy this requirement.

Some or all of the above needs can be met with a light emitting device comprising a lighting element located in a housing, wherein the housing is formed from a plastic composition comprising a plastic material and a conversion material (e.g., a coated conversion material). The conversion material can, for example, absorb at least a portion of a first wavelength range radiation that is emitted from the light emitting device and emits radiation having a second wavelength range. This results in an altered light color perception by the viewer. For example, the conversion material can convert some of the blue light from a blue LED to yellow light and the overall combination of available light is perceived as white light to an observer. In this manner light emitting LEDs can effectively be tuned to result in different color than those immediately emitted from the LED. Further by incorporating the conversion material(s) into the plastic housing, industry requirements as well as processes that effectuate the manufacture of materials can be met.

According to embodiments, polycarbonate compositions having enhanced optical properties are disclosed, as well as their methods of manufacture and uses thereof, and articles made therefrom.

In accordance with an embodiment, and as further described below, the inventors have developed an interfacial process to manufacture a composition comprising a polycarbonate, such as a BPA polycarbonate, with transmission levels higher than 90.0% at 2.5 millimeter (mm) thickness, and a YI lower than 1.5, with an increase in YI of less than 2 during 2,000 hours of heat aging at 130° C. As used herein, YI is measured in accordance with ASTM D1925, while transmission is measured in accordance with ASTM D-1003-00, Procedure A, measured, e.g., using a HAZE-GUARD DUAL from BYK-Gardner, using and integrating sphere (0°/diffuse geometry), wherein the spectral sensitivity conforms to the International Commission on Illumination (CIE) standard spectral value under standard lamp D65.

The enhanced optical properties can be achieved by employing in the interfacial process a starting BPA monomer having both an organic purity (e.g., measured by HPLC of greater than or equal to 99.65 wt %) and a sulfur level of less than or equal to 2 ppm. The organic purity can be defined as 100 wt % minus the sum of known and unknown impurities detected using ultraviolet (UV) (see HPLC method in Nowakowska et al., Polish J. Appl. Chem., XI (3), 247-254 (1996)). The use of an end-capping agent can be employed in the reaction such that the resultant composition comprising BPA polycarbonate comprises a free hydroxyl level less than or equal to 150 ppm. Also, the sulfur level in the resultant composition (resin) can be less than or equal to 2 ppm, as measured by a commercially available Total Sulfur Analysis based on combustion and coulometric detection.

It has been discovered that a surprising synergist effect can be achieved resulting in enhanced optical qualities (e.g., transmission levels higher than 90.0% at 2.5 mm thickness and a YI less than or equal to 1.5) by reacting, in an interfacial process (as opposed to a melt process), a low sulfur (less than or equal to 2 ppm) and highly pure (purity greater than or equal to 99.65 wt %) BPA starting material to form a BPA polycarbonate comprising a free hydroxyl level of less than or equal to 150 ppm.

The disclosed interfacial process enhances the optical properties of BPA polycarbonate (e.g., LEXAN™ polycarbonate), upgrading transparency and improving the durability of this transparency by lowering the blue light absorption.

While various types of polycarbonates could potentially be used in accordance with embodiments and are described in detail below, of particular interest are BPA polycarbonates, such as LEXAN™ polycarbonate (LEXAN™ is a trademark of SABIC Innovative Plastics IP B. V.). More particularly, according to embodiments, LEXAN™ polycarbonate can be used for a wide range of applications that make use of its interesting combination of mechanical and optical properties. Its high impact resistance can make it an important component in numerous consumer goods such as mobile phones, MP3 players, computers, laptops, etc. Due to its transparency this BPA polycarbonate can find use in optical media, automotive lenses, roofing elements, greenhouses, photovoltaic devices, and safety glass. The developments in light emitting diode (LED) technology have led to significantly prolonged lifetimes for the lighting products to which this technology can be applied. This has led to increased requirements on the durability of polycarbonates, in particular on its optical properties. In other applications such as automotive lighting, product developers may feel the need to design increasingly complex shapes which cannot be made out of glass and for which the heat requirements are too stringent for polymethyl methacrylate (PMMA). Also in these applications polycarbonate is the material of choice, but the high transparency of PMMA and glass should be approached as closely as possible.

Figure 2:
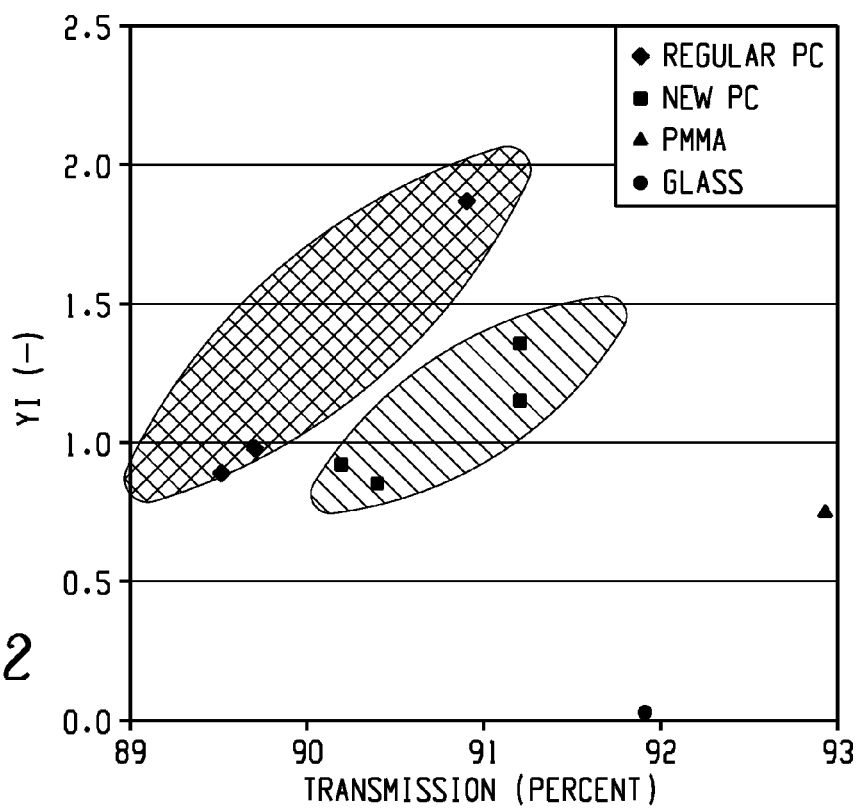
FIG. 2 is a graph depicting the yellowness and transmission of polycarbonate (PC) compared to PMMA (polymethyl methacrylate) and standard uncoated glass (yellowness index (YI (–)) versus transmission (%)).

Polycarbonate has the tendency to develop a yellow tint due to light absorption stretching into the blue regions of the spectrum (FIG. 1, line-R); a tint which gets worse upon heat aging. FIG. 1 is a graph depicting transmission spectra of polycarbonates (transmission (%) versus wavelength (nm)). This tint can be compensated for through the addition of colorants which absorb light in the yellow region to give a neutral tint (FIG. 1, line-B). Absorbing blue and yellow light lowers the overall transmission of the material, see FIG. 2. FIG. 2 is a graph depicting the yellowness and transmission of PC compared to PMMA and standard uncoated glass (YI (–) versus transmission (%)). With colorants it is possible to move within one of the ellipsoid areas, lowering yellowness at the expense of transmission. By making process improvements, one can move from the darker area to the lighter one, lowering yellowness while gaining transmission. The inventors have determined that it would thus be desirable to have a colorless material by preventing or removing the blue light absorption which will increase the overall transmission (FIG. 1, dotted line-G).

As noted above, although BPA polycarbonates, such as LEXAN™ polycarbonates are of particular interest, various polycarbonates could potentially be employed in the embodiments disclosed herein. For example, in general, various types of polycarbonates that have a repeating structural background of the following formula:

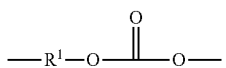

can be utilized for embodiments encompassed by this disclosure.

The selection of a polycarbonate backbone of choice depends on many factors such as end use and other factors understood by one of ordinary skill the art.

In one embodiment, the polycarbonates have repeating structural carbonate units of the formula (1):

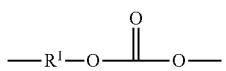
(1)

wherein at least 60 percent of the total number of $R^1$ groups contains aromatic organic groups and the balance thereof are aliphatic, alicyclic, or aromatic groups.

In another embodiment, the polycarbonate is derived from bisphenol-A.

In another embodiment, each $R^1$ group is a divalent aromatic group, for example derived from an aromatic dihydroxy compound of the formula (2):

$$HO-A^1-Y^1-A^2-OH \qquad (2)$$

wherein each of $A^1$ and $A^2$ is a monocyclic divalent arylene group, and $Y^1$ is a single bond or a bridging group having one or two atoms that separate $A^1$ from $A^2$. In an exemplary embodiment, one atom separates $A^1$ from $A^2$. In another embodiment, when each of $A^1$ and $A^2$ is phenylene, $Y^1$ is para to each of the hydroxyl groups on the phenylenes. Illustrative non-limiting examples of groups of this type are —O—, —S—, —S(O)—, —S(O)$_2$—, —C(O)—, methylene, cyclohexyl-methylene, 2-[2.2.1]-bicycloheptylidene, ethylidene, isopropylidene, neopentylidene, cyclohexylidene, cyclopentadecylidene, cyclododecylidene, and adamantylidene. The bridging group $Y^1$ can be a hydrocarbon group or a saturated hydrocarbon group such as methylene, cyclohexylidene, or isopropylidene.

Included within the scope of formula (2) are bisphenol compounds of general formula (3):

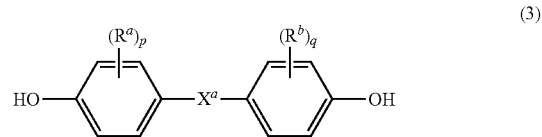
(3)

wherein $R^a$ and $R^b$ each represent a halogen atom or a monovalent hydrocarbon group and can be the same or different; p and q are each independently integers of 0 to 4; and $X^a$ represents a single bond or one of the groups of formulas (4) or (5):

wherein $R^c$ and $R^d$ are each independently hydrogen, $C_{1-12}$ alkyl, $C_{1-12}$ cycloalkyl, $C_{7-12}$ arylalkyl, $C_{1-12}$ heteroalkyl, or cyclic $C_{7-12}$ heteroarylalkyl, and $R^e$ is a divalent $C_{1-12}$ hydrocarbon group. In particular, $R^c$ and $R^d$ are each the same hydrogen or $C_{1-4}$ alkyl group, specifically the same $C_{1-3}$ alkyl group, even more specifically, methyl.

In an embodiment, $R^c$ and $R^d$ taken together represent a $C_{3-20}$ cyclic alkylene group or a heteroatom-containing $C_{3-20}$ cyclic alkylene group comprising carbon atoms and heteroatoms with a valency of two or greater. These groups can be in the form of a single saturated or unsaturated ring, or a fused polycyclic ring system wherein the fused rings are saturated, unsaturated, or aromatic. A specific heteroatom-containing cyclic alkylene group comprises at least one heteroatom with a valency of 2 or greater, and at least two carbon atoms. Exemplary heteroatoms in the heteroatom-containing cyclic alkylene group include —O—, —S—, and —N(Z)—, where Z is a substituent group selected from hydrogen, hydroxy, $C_{1-12}$ alkyl, $C_{1-12}$ alkoxy, or $C_{1-12}$ acyl.

In a specific exemplary embodiment, $X^a$ is a substituted $C_{3-18}$ cycloalkylidene of the formula (6):

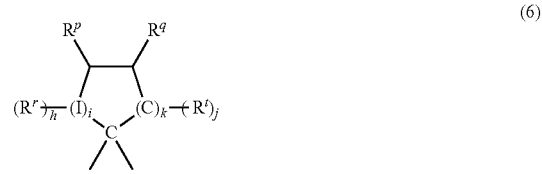
(6)

wherein each $R^r$, $R^p$, $R^q$, and $R^t$ is independently hydrogen, halogen, oxygen, or $C_{1-12}$ organic group; I is a direct bond, a carbon, or a divalent oxygen, sulfur, or —N(Z)— wherein Z is hydrogen, halogen, hydroxy, $C_{1-12}$ alkyl, $C_{1-12}$ alkoxy, or $C_{1-12}$ acyl; h is 0 to 2, j is 1 or 2, i is an integer of 0 or 1, and k is an integer of 0 to 3, with the proviso that at least two of $R^r$, $R^p$, $R^q$, and $R^t$ taken together are a fused cycloaliphatic, aromatic, or heteroaromatic ring. It will be understood that where the fused ring is aromatic, the ring as shown in formula (6) will have an unsaturated carbon-carbon linkage where the ring is fused. When k is 1 and i is 0, the ring as shown in formula (6) contains 4 carbon atoms, when k is 2, the ring as shown contains 5 carbon atoms, and when k is 3, the ring contains 6 carbon atoms. In one embodiment, two adjacent groups (e.g., $R^q$ and $R^t$ taken together) form an aromatic group, and in another embodiment, $R^q$ and $R^t$ taken together form one aromatic group and $R^r$ and $R^p$ taken together form a second aromatic group.

Non-limiting examples of dihydroxy compounds that can provide polycarbonates with Tgs greater than 170° C. include 3,3-bis(4-hydroxyphenyl)-2-phenylisoindolin-1-one (PP-PBP), 1,1-bis(4-hydroxyphenyl)-3,3,5-trimethylcyclohexane (Bisphenol TMC), 4,4'-(1-phenylethane-1,1-diyl)diphenol (bisphenol AP) as well as adamantyl containing aromatic dihydroxy compounds and flourene containing aromatic dihydroxy compounds.

Specific example of dihydroxy compounds of formula (2) can be the following formula (7):

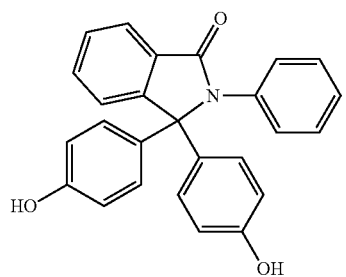

(7)

(also known as 3,3-bis(4-hydroxyphenyl)-2-phenylisoindolin-1-one (PPPBP)) also known as 2-phenyl-3,3-bis(4-hydroxyphenyl)phthalimidine.

Alternatively, the dihydroxy compounds of formula (2) may be the following formula (8):

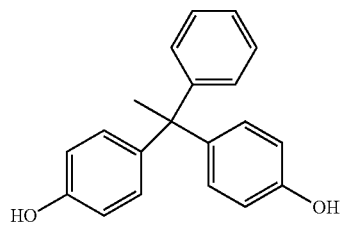

(8)

(also known as 4,4'-(1-phenylethane-1,1-diyl)diphenol (bisphenol AP) also known as 1,1-bis(4-hydroxyphenyl)-1-phenyl-ethane).

Alternatively, the dihydroxy compounds of formula (2) may be the following formula (9):

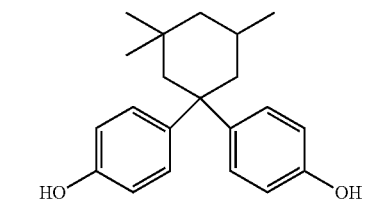

(9)

4,4'-(3,3,5-trimethylcyclohexane-1,1-diyl)diphenol (bisphenol TMC) also known as 1,1-bis(4-hydroxyphenyl)-3,3,5-trimethylcyclohexane). Examples of adamantyl containing aromatic dihydroxy compounds and flourene containing aromatic dihydroxy compounds are set forth in Formulas (A) and (B) respectively.

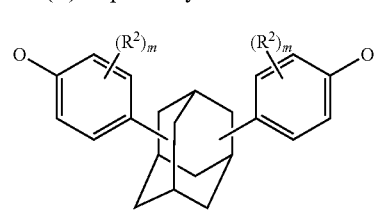

(A)

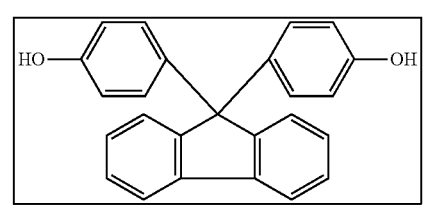

(B)

Another possible polycarbonate with high Tg is set forth in formula (C):

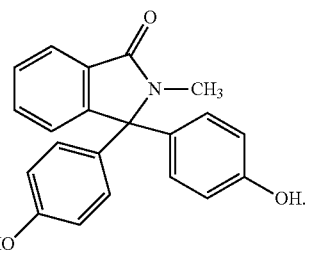

(C)

A polycarbonate can have a bisphenol of formula (D) as a repeating monomer unit therein:

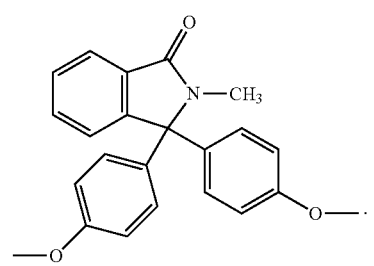

(D)

When k is 3 and i is 0, bisphenols containing substituted or unsubstituted cyclohexane units are used, for example bisphenols of formula (10):

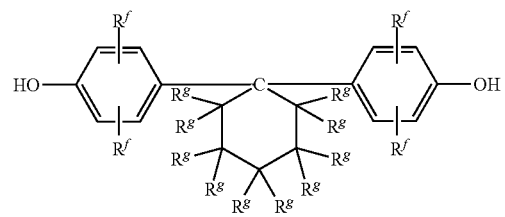

(10)

wherein each $R^f$ is independently hydrogen, $C_{1-12}$ alkyl, or halogen; and each $R^g$ is independently hydrogen or $C_{1-12}$ alkyl. The substituents can be aliphatic or aromatic, straight chain, cyclic, bicyclic, branched, saturated, or unsaturated. Such cyclohexane-containing bisphenols, for example the reaction product of two moles of a phenol with one mole of a hydrogenated isophorone, are useful for making polycarbonate polymers with high glass transition temperatures and high heat distortion temperatures. Cyclohexyl bisphenol containing polycarbonates, or a combination comprising at least one of the foregoing with other bisphenol polycarbonates, are supplied by Bayer Co. under the APEC™ trade name.

Other useful dihydroxy compounds having the formula HO—$R^1$—OH include aromatic dihydroxy compounds of formula (11):

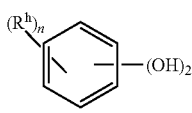
(11)

wherein each $R^h$ is independently a halogen atom, a $C_{1-10}$ hydrocarbyl such as a $C_{1-10}$ alkyl group, a halogen substituted $C_{1-10}$ hydrocarbyl such as a halogen-substituted $C_{1-10}$ alkyl group, and n is 0 to 4. The halogen is usually bromine.

Some illustrative examples of dihydroxy compounds include the following: 4,4'-dihydroxybiphenyl, 1,6-dihydroxynaphthalene, 2,6-dihydroxynaphthalene, bis(4-hydroxyphenyl)methane, bis(4-hydroxyphenyl)diphenylmethane, bis(4-hydroxyphenyl)-1-naphthylmethane, 1,2-bis(4-hydroxyphenyl)ethane, 1,1-bis(4-hydroxyphenyl)-1-phenylethane, 2-(4-hydroxyphenyl)-2-(3-hydroxyphenyl)propane, bis(4-hydroxyphenyl)phenylmethane, 2,2-bis(4-hydroxy-3-bromophenyl)propane, 1,1-bis(hydroxyphenyl)cyclopentane, 1,1-bis(4-hydroxyphenyl)cyclohexane, 1,1-bis(4-hydroxyphenyl)isobutene, 1,1-bis(4-hydroxyphenyl)cyclododecane, trans-2,3-bis(4-hydroxyphenyl)-2-butene, 2,2-bis(4-hydroxyphenyl)adamantine, alpha,alpha'-bis(4-hydroxyphenyl)toluene, bis(4-hydroxyphenyl)acetonitrile, 2,2-bis(3-methyl-4-hydroxyphenyl)propane, 2,2-bis(3-ethyl-4-hydroxyphenyl)propane, 2,2-bis(3-n-propyl-4-hydroxyphenyl)propane, 2,2-bis(3-isopropyl-4-hydroxyphenyl)propane, 2,2-bis(3-sec-butyl-4-hydroxyphenyl)propane, 2,2-bis(3-t-butyl-4-hydroxyphenyl)propane, 2,2-bis(3-cyclohexyl-4-hydroxyphenyl)propane, 2,2-bis(3-allyl-4-hydroxyphenyl)propane, 2,2-bis(3-methoxy-4-hydroxyphenyl)propane, 2,2-bis(4-hydroxyphenyl)hexafluoropropane, 1,1-dichloro-2,2-bis(4-hydroxyphenyl)ethylene, 1,1-dibromo-2,2-bis(4-hydroxyphenyl)ethylene, 1,1-dichloro-2,2-bis(5-phenoxy-4-hydroxyphenyl)ethylene, 4,4'-dihydroxybenzophenone, 3,3-bis(4-hydroxyphenyl)-2-butanone, 1,6-bis(4-hydroxyphenyl)-1,6-hexanedione, ethylene glycol bis(4-hydroxyphenyl)ether, bis(4-hydroxyphenyl)ether, bis(4-hydroxyphenyl)sulfide, bis(4-hydroxyphenyl)sulfoxide, bis(4-hydroxyphenyl)sulfone, 9,9 to bis (4-hydroxyphenyl)fluorine, 2,7-dihydroxypyrene, 6,6'-dihydroxy-3,3,3',3'-tetramethylspiro(bis)indane ("spirobiindane bisphenol"), 3,3-bis(4-hydroxyphenyl)phthalide, 2,6-dihydroxydibenzo-p-dioxin, 2,6-dihydroxythianthrene, 2,7-dihydroxyphenoxathin, 2,7-dihydroxy-9,10-dimethylphenazine, 3,6-dihydroxydibenzofuran, 3,6-dihydroxydibenzothiophene, and 2,7-dihydroxycarbazole, resorcinol, substituted resorcinol compounds such as 5-methyl resorcinol, 5-ethyl resorcinol, 5-propyl resorcinol, 5-butyl resorcinol, 5-t-butyl resorcinol, 5-phenyl resorcinol, 5-cumyl resorcinol, 2,4,5,6-tetrafluoro resorcinol, 2,4,5,6-tetrabromo resorcinol, or the like; catechol; hydroquinone; substituted hydroquinones such as 2-methyl hydroquinone, 2-ethyl hydroquinone, 2-propyl hydroquinone, 2-butyl hydroquinone, 2-t-butyl hydroquinone, 2-phenyl hydroquinone, 2-cumyl hydroquinone, 2,3,5,6-tetramethyl hydroquinone, 2,3,5,6-tetra-t-butyl hydroquinone, 2,3,5,6-tetrafluoro hydroquinone, 2,3,5,6-tetrabromo hydroquinone, and the like, as well as combinations comprising at least one of the foregoing dihydroxy compounds.

Specific examples of bisphenol compounds that can be represented by formula (2) include 1,1-bis(4-hydroxyphenyl) methane, 1,1-bis(4-hydroxyphenyl)ethane, 2,2-bis(4-hydroxyphenyl)propane (hereinafter "bisphenol-A" or "BPA"), 2,2-bis(4-hydroxyphenyl)butane, 2,2-bis(4-hydroxyphenyl) octane, 1,1-bis(4-hydroxyphenyl)propane, 1,1-bis(4-hydroxyphenyl)n-butane, 2,2-bis(4-hydroxy-1-methylphenyl)propane, 1,1-bis(4-hydroxy-t-butylphenyl)propane, 3,3-bis(4-hydroxyphenyl)phthalimidine, 2-phenyl-3,3-bis(4-hydroxyphenyl)phthalimidine (PPPBP), and 1,1-bis(4-hydroxy-3-methylphenyl)cyclohexane (DMBPC). Combinations comprising at least one of the foregoing dihydroxy compounds can also be used.

"Polycarbonate" as used herein includes homopolycarbonates, copolymers comprising different $R^1$ moieties in the carbonate (referred to herein as "copolycarbonates"), and copolymers comprising carbonate units and other types of polymer units, such as ester units. In one specific embodiment, the polycarbonate is a linear homopolymer or copolymer comprising units derived from bisphenol-A, in which each of $A^1$ and $A^2$ is p-phenylene and $Y^1$ is isopropylidene in formula (2). More specifically, at least 60%, particularly at least 80% of the $R^1$ groups in the polycarbonate are derived from bisphenol-A.

Another specific type of copolymer is a polyester carbonate, also known as a polyester-polycarbonate. Such copolymers further contain, in addition to recurring carbonate chain units of the formula (1), repeating units of formula (12):

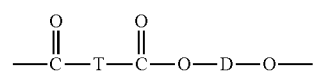
(12)

wherein D is a divalent group derived from a dihydroxy compound, and can be, for example, a $C_{2-10}$ alkylene group, a $C_{6-20}$ alicyclic group, a $C_{6-20}$ aromatic group or a polyoxyalkylene group in which the alkylene groups contain 2 to 6 carbon atoms, specifically 2, 3, or 4 carbon atoms; and T divalent group derived from a dicarboxylic acid, and can be, for example, a $C_{2-10}$ alkylene group, a $C_{6-20}$ alicyclic group, a $C_{6-20}$ alkyl aromatic group, or a $C_{6-20}$ aromatic group.

In one embodiment, D is a $C_{2-30}$ alkylene group having a straight chain, branched chain, or cyclic (including polycyclic) structure. In another embodiment, D is derived from an aromatic dihydroxy compound of formula (3) above. In another embodiment, D is derived from an aromatic dihydroxy compound of formula (8) above.

Examples of aromatic dicarboxylic acids that can be used to prepare the polyester units include isophthalic or terephthalic acid, 1,2-di(p-carboxyphenyl)ethane, 4,4'-dicarboxydiphenyl ether, 4,4'-bisbenzoic acid, and combinations comprising at least one of the foregoing acids. Acids containing fused rings can also be present, such as in 1,4-, 1,5-, or 2,6-naphthalenedicarboxylic acids. Specific dicarboxylic acids are terephthalic acid, isophthalic acid, naphthalene dicarboxylic acid, cyclohexane dicarboxylic acid, or combinations thereof. A specific dicarboxylic acid comprises a combination of isophthalic acid and terephthalic acid wherein the weight ratio of isophthalic acid to terephthalic acid is 91:9 to 2:98. In another specific embodiment, D is a $C_{2-6}$ alkylene group and T is p-phenylene, m-phenylene, naphthalene, a divalent cycloaliphatic group, or a combination thereof. This class of polyester includes the poly(alkylene terephthalates).

The molar ratio of ester units to carbonate units in the copolymers can vary broadly, for example 1:99 to 99:1, specifically 10:90 to 90:10, more specifically 25:75 to 75:25, depending on the desired properties of the final composition.

In a specific embodiment, the polyester unit of a polyester-polycarbonate can be derived from the reaction of a combination of isophthalic and terephthalic diacids (or derivatives thereof) with resorcinol. In another specific embodiment, the polyester unit of a polyester-polycarbonate is derived from the reaction of a combination of isophthalic acid and terephthalic acid with bisphenol-A. In a specific embodiment, the polycarbonate units are derived from bisphenol-A. In another specific embodiment, the polycarbonate units are derived from resorcinol and bisphenol-A in a molar ratio of resorcinol carbonate units to bisphenol-A carbonate units of 1:99 to 99:1.

A specific example of a polycarbonate-polyester is a copolycarbonate-polyester-polysiloxane terpolymer comprising carbonate units of formula (1), ester units of formula (12), and polysiloxane (also referred to herein as "polydiorganosiloxane") units of formula (13):

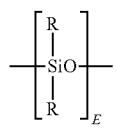

(13)

wherein each occurrence of R is same or different, and is a $C_{1-13}$ monovalent organic group. For example, R may independently be a $C_{1-13}$ alkyl group, $C_{1-13}$ alkoxy group, $C_{2-13}$ alkenyl group, $C_{2-13}$ alkenyloxy group, $C_{3-6}$ cycloalkyl group, $C_{3-6}$ cycloalkoxy group, $C_{6-14}$ aryl group, $C_{6-10}$ aryloxy group, $C_{7-13}$ arylalkyl group, $C_{7-13}$ arylalkoxy group, $C_{7-13}$ alkylaryl group, or $C_{7-13}$ alkylaryloxy group. The foregoing groups may be fully or partially halogenated with fluorine, chlorine, bromine, or iodine, or a combination thereof. Combinations of the foregoing R groups may be used in the same copolymer. In an embodiment, the polysiloxane comprises R groups that have a minimum hydrocarbon content. In a specific embodiment, an R group with a minimum hydrocarbon content is a methyl group.

The value of E in formula (13) may vary widely depending on the type and relative amount of each component in the thermoplastic composition, the desired properties of the composition, and like considerations. Herein, E can have an average value of 4 to 50. In an embodiment, E has an average value of 16 to 50, specifically 20 to 45, and more specifically 25 to 45. In another embodiment, E has an average value of 4 to 15, specifically 5 to 15, more specifically 6 to 15, and still more specifically 7 to 12.

In an embodiment, polydiorganosiloxane units are derived from dihydroxy aromatic compound of formula (14):

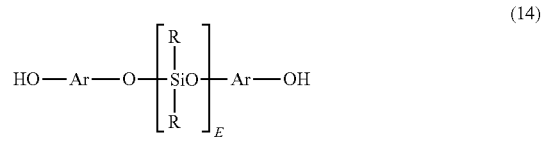

wherein E is as defined above; each R may independently be the same or different, and is as defined above; and each Ar may independently be the same or different, and is a substituted or unsubstituted $C_{6-30}$ arylene group, wherein the bonds are directly connected to an aromatic moiety. Exemplary Ar groups in formula (14) may be derived from a $C_{6-30}$ dihydroxy aromatic compound, for example a dihydroxy aromatic compound of formula (2), (3), (7), or (10) above. Combinations comprising at least one of the foregoing dihydroxy aromatic compounds may also be used. Exemplary dihydroxy aromatic compounds are resorcinol (i.e., 1,3-dihydroxybenzene), 4-methyl-1,3-dihydroxybenzene, 5-methyl-1,3-dihydroxybenzene, 4,6-dimethyl-1,3-dihydroxybenzene, 1,4-dihydroxybenzene, 1,1-bis(4-hydroxyphenyl)methane, 1,1-bis(4-hydroxyphenyl)ethane, 2,2-bis(4-hydroxyphenyl) propane, 2,2-bis(4-hydroxyphenyl)butane, 2,2-bis(4-hydroxyphenyl)octane, 1,1-bis(4-hydroxyphenyl)propane, 1,1-bis(4-hydroxyphenyl)n-butane, 2,2-bis(4-hydroxy-1-methylphenyl)propane, 1,1-bis(4-hydroxyphenyl)cyclohexane, bis(4-hydroxyphenyl sulfide), and 1,1-bis(4-hydroxy-t-butylphenyl)propane. Combinations comprising at least one of the foregoing dihydroxy compounds may also be used. In an embodiment, the dihydroxy aromatic compound is unsubstituted, or is not substituted with non-aromatic hydrocarbon-containing substituents such as, for example, alkyl, alkoxy, or alkylene substituents.

In a specific embodiment, where Ar is derived from resorcinol, the polydiorganosiloxane repeating units are derived from dihydroxy aromatic compounds of formula (15):

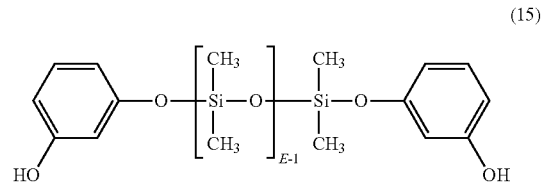

or, where Ar is derived from bisphenol-A, from dihydroxy aromatic compounds of formula (16):

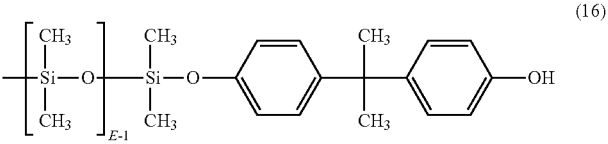

wherein E is as defined above.

In another embodiment, polydiorganosiloxane units are derived from dihydroxy aromatic compound of formula (17):

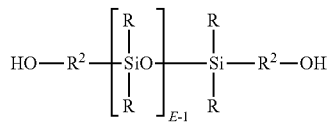
(17)

wherein R and E are as described above, and each occurrence of $R^2$ is independently a divalent $C_{1-30}$ alkylene or $C_{7-30}$ arylene-alkylene, and wherein the polymerized polysiloxane unit is the reaction residue of its corresponding dihydroxy aromatic compound. In a specific embodiment, where $R^2$ is $C_{7-30}$ arylene-alkylene, the polydiorganosiloxane units are derived from dihydroxy aromatic compound of formula (18):

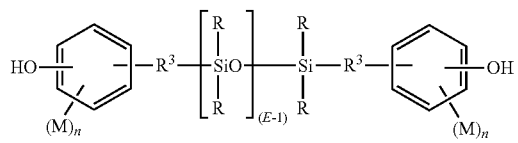
(18)

wherein R and E are as defined above. Each $R^3$ is independently a divalent $C_{2-8}$ aliphatic group. Each M may be the same or different, and may be a halogen, cyano, nitro, $C_{1-8}$ alkylthio, $C_{1-8}$ alkyl, $C_{1-8}$ alkoxy, $C_{2-8}$ alkenyl, $C_{2-8}$ alkenyloxy group, $C_{3-8}$ cycloalkyl, $C_{3-8}$ cycloalkoxy, $C_{6-10}$ aryl, $C_{6-10}$ aryloxy, $C_{7-12}$ arylalkyl, $C_{7-12}$ arylalkoxy, $C_{7-12}$ alkylaryl, or $C_{7-12}$ alkylaryloxy, wherein each n is independently 0, 1, 2, 3, or 4.

In an embodiment, M is bromo or chloro, an alkyl group such as methyl, ethyl, or propyl, an alkoxy group such as methoxy, ethoxy, or propoxy, or an aryl group such as phenyl, chlorophenyl, or tolyl; $R^3$ is a dimethylene, trimethylene or tetramethylene group; and R is a $C_{1-8}$ alkyl, haloalkyl such as trifluoropropyl, cyanoalkyl, or aryl such as phenyl, chlorophenyl or tolyl. In another embodiment, R is methyl, or a combination of methyl and trifluoropropyl, or a combination of methyl and phenyl. In still another embodiment, M is methoxy, n is 0 or 1, $R^3$ is a divalent $C_{1-3}$ aliphatic group, and R is methyl.

In a specific embodiment, the polydiorganosiloxane units are derived from a dihydroxy aromatic compound of formula (19):

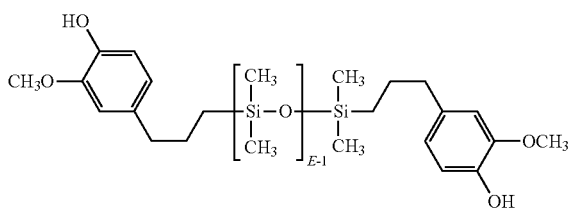
(19)

wherein E is as described above.

In another specific embodiment, the polydiorganosiloxane units are derived from dihydroxy aromatic compound of formula (20):

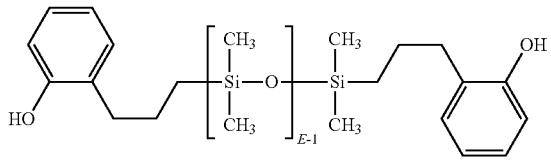
(20)

wherein E is as defined above.

Dihydroxy polysiloxanes typically can be made by functionalizing a substituted siloxane oligomer of formula (21):

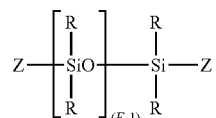
(21)

wherein R and E are as previously defined, and Z is H, halogen (e.g., Cl, Br, I), or carboxylate. Exemplary carboxylates include acetate, formate, benzoate, and the like. In an exemplary embodiment, where Z is H, compounds of formula (21) may be prepared by platinum catalyzed addition with an aliphatically unsaturated monohydric phenol. Exemplary aliphatically unsaturated monohydric phenols included, for example, eugenol, 2-allylphenol, 4-allylphenol, 4-allyl-2-methylphenol, 4-allyl-2-phenylphenol, 4-allyl-2-bromophenol, 4-allyl-2-t-butoxyphenol, 4-phenyl-2-allylphenol, 2-methyl-4-propenylphenol, 2-allyl-4,6-dimethylphenol, 2-allyl-4-bromo-6-methylphenol, 2-allyl-6-methoxy-4-methylphenol, and 2-allyl-4,6-dimethylphenol. Combinations comprising at least one of the foregoing may also be used. Where Z is halogen or carboxylate, functionalization may be accomplished by reaction with a dihydroxy aromatic compound of formulas (2), (3), (7), (10), or a combination comprising at least one of the foregoing dihydroxy aromatic compounds. In an exemplary embodiment, compounds of formula (14) may be formed from an alpha, omega-bisacetoxypolydiorangonosiloxane and a dihydroxy aromatic compound under phase transfer conditions.

Specific copolycarbonate terpolymers include those with polycarbonate units of formula (1) wherein $R^1$ is a $C_{6-30}$ arylene group, polysiloxane units derived from siloxane diols of formula (16), (19) or (20), and polyester units wherein T is a $C_{6-30}$ arylene group. In an embodiment, T is derived from isophthalic and/or terephthalic acid, or reactive chemical equivalents thereof. In another embodiment, $R^1$ is derived from the carbonate reaction product of a resorcinol of formula (11), or a combination of a resorcinol of formula (11) and a bisphenol of formula (3).

The relative amount of each type of unit in the foregoing terpolymer will depend on the desired properties of the terpolymer, and are readily determined by one of ordinary skill in the art without undue experimentation, using the guidelines provided herein. For example, the polycarbonate-polyester-polysiloxane terpolymer can comprise siloxane units in an amount of 0.1 to 25 weight percent (wt %), specifically 0.2 to 10 wt %, more specifically 0.2 to 6 wt %, even more specifically 0.2 to 5 wt %, and still more specifically 0.25 to 2 wt %, based on the total weight of the polycarbonate-polyester-polysiloxane terpolymer, with the proviso that the siloxane units are provided by polysiloxane units covalently bonded in the polymer backbone of the polycarbonate-polyester-polysiloxane terpolymer. The polycarbonate-polyester-polysiloxane terpolymer can further comprise 0.1 to 49.85 wt % carbonate units, 50 to 99.7 wt % ester units, and 0.2 to 6 wt % polysiloxane units, based on the total weight of the polysiloxane units, ester units, and carbonate units. Alternatively, the polycarbonate-polyester-polysiloxane terpolymer comprises 0.25 to 2 wt % polysiloxane units, 60 to 96.75 wt % ester units, and 3.25 to 39.75 wt % carbonate units, based on the total weight of the polysiloxane units, ester units, and carbonate units.

Various types of thermoplastic compositions are encompassed by embodiments encompassed by this disclosure.

In one embodiment, the polycarbonate can be at least one of the following: a homopolycarbonate derived from a bisphenol; a copolycarbonate derived from more than one bisphenol; and a copolymer derived from one or more bisphenols and having one or more aliphatic ester units or aromatic ester units or siloxane units.

In another embodiment, in addition to the endcapped polycarbonates described above, the thermoplastic compositions can also comprise other thermoplastic polymers, for example polyesters, polyamides, and other polycarbonate homopolymers and copolymers, including polycarbonate-polysiloxane copolymers and polyester carbonates, also known as a polyester-polycarbonates, and polyesters. The polymer component of such compositions can comprise 1 to 99 wt %, specifically 10 to 90, more specifically 20 to 80 wt % of the cyanophenyl endcapped polycarbonate, with the remainder of the polymer component being other polymers.

In another embodiment, a second polycarbonate is formulated with the composition, wherein a second polycarbonate comprises a repeating structure of

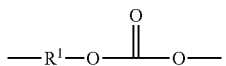

wherein said second polycarbonate is different from said polycarbonate and wherein at least 60 percent of the total number of $R^1$ groups contain aromatic organic groups and the balance thereof are aliphatic, alicyclic, or aromatic groups.

In another embodiment, the second polycarbonate is derived from bisphenol-A.

The polycarbonates according to embodiments can contain branched polycarbonate(s). Various type of branching agents can be utilized for embodiments encompassed by this disclosure.

Branched polycarbonate blocks can be prepared by adding a branching agent during polymerization. These branching agents include polyfunctional organic compounds containing at least three functional groups selected from hydroxyl, carboxyl, carboxylic anhydride, haloformyl, and mixtures of the foregoing functional groups. Specific examples include trimellitic acid, trimellitic anhydride, trimellitic trichloride (TMTC), tris-p-hydroxy phenyl ethane (THPE), 3,3-bis-(4-hydroxyphenyl)-oxindole (also known as isatin-bis-phenol), tris-phenol TC (1,3,5-tris((p-hydroxyphenyl)isopropyl)benzene), tris-phenol PA (4(4(1,1-bis(p-hydroxyphenyl)-ethyl) alpha, alpha-dimethyl benzyl)phenol), 4-chloroformyl phthalic anhydride, trimesic acid, and benzophenone tetracarboxylic acid. The branching agents can be added at a level of 0.05 to 2.0 wt %. Mixtures comprising linear polycarbonates and branched polycarbonates can be used.

In some embodiments, a particular type of branching agent is used to create branched polycarbonate materials. These branched polycarbonate materials have statistically more than two end groups. The branching agent is added in an amount (relative to the bisphenol monomer) that is sufficient to achieve the desired branching content, that is, more than two end groups. The molecular weight of the polymer may become very high upon addition of the branching agent and may lead to viscosity problems during phosgenation. Therefore, in some embodiments, an increase in the amount of the chain termination agent is used in the polymerization. The amount of chain termination agent used when the particular branching agent is used is generally higher than if only a chain termination agent alone is used. The amount of chain termination agent used is generally above 5 mole percent and less than 20 mole percent compared to the bisphenol monomer.

In some embodiments, the branching agent is a structure derived from a triacid trichloride of the formula (22)

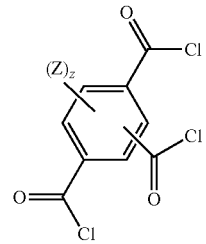

(22)

wherein Z is hydrogen, a halogen, $C_{1-3}$ alkyl group, $C_{1-3}$ alkoxy group, $C_{7-12}$ arylalkyl, alkylaryl, or nitro group, and z is 0 to 3; or a branching agent derived from a reaction with a tri-substituted phenol of the formula (23)

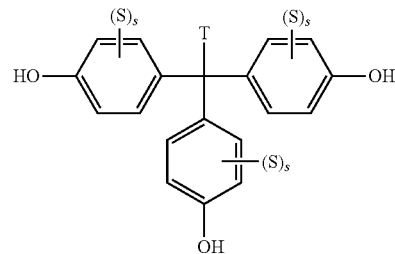

(23)

wherein T is a $C_{1-20}$ alkyl group, $C_{1-20}$ alkyleneoxy group, $C_{7-12}$ arylalkyl, or alkylaryl group, S is hydrogen, a halogen, $C_{1-3}$ alkyl group, $C_{1-3}$ alkoxy group, $C_{7-12}$ arylalkyl, alkylaryl, or nitro group, s is 0 to 4.

In another embodiment, the branching agent is a structure having formula (24)

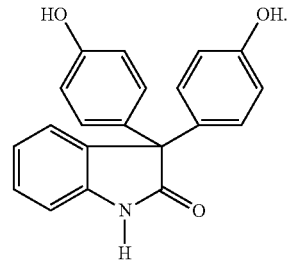

(24)

Examples of specific branching agents that are particularly effective in embodiments include trimellitic trichloride (TMTC), tris-p-hydroxy phenyl ethane (THPE) and isatin-bis-phenol. In one embodiment, in formula (21), Z is hydrogen and z is 3. In another embodiment, in formula (22), S is hydrogen, T is methyl and s is 4.

The relative amount of branching agents used in the manufacture of a polymer according to embodiments will depend on a number of considerations, for example the type of $R^1$ groups, the amount of cyanophenol, and the desired molecular weight of the polycarbonate. In general, the amount of branching agent is effective to provide about 0.1 to 10 branching units per 100 $R^1$ units, specifically about 0.5 to 8 branching units per 100 $R^1$ units, and more specifically about 0.75 to 5 branching units per 100 $R^1$ units. For branching agents having formula (21), the amount of branching agent tri-ester groups are present in an amount of about 0.1 to 10 branching units per 100 $R^1$ units, specifically about 0.5 to 8 branching units per 100 $R^1$ units, and more specifically about 0.75 to 5 tri-ester units per 100 $R^1$ units. For branching agents having formula (22), the amount of branching agent tricarbonate groups are present in an amount of about 0.1 to 10 branching units per 100 $R^1$ units, specifically about 0.5 to 8 branching units per 100 $R^1$ units, and more specifically about 0.75 to 5 tri-phenylcarbonate units per 100 $R^1$ units. In some embodiments, a combination of two or more branching agents may be used.

In one embodiment, the polycarbonate of a composition has a branching level of greater than or equal to about 1%, or greater than or equal to about 2%, or greater than or equal to about 3%, or about 1% to about 3%.

Various types of end-capping agents can be utilized for embodiments encompassed by this disclosure.

In one embodiment, the end-capping agent is selected based upon the molecular weight of said polycarbonate and said branching level imparted by said branching agent.

In another embodiment, the end-capping agents are selected from at least one of the following: phenol or a phenol containing one or more substitutions with at least one of the following: aliphatic groups, olefinic groups, aromatic groups, halogens, ester groups, and ether groups.

Examples of endcapping agents (also referred to as chain stoppers) include certain mono-phenolic compound(s), and/or mono-carboxylic acid chloride(s), and/or mono-chloroformate(s). Mono-phenolic chain stoppers are exemplified by monocyclic phenols such as phenol and $C_1$-$C_{22}$ alkyl-substituted phenols such as p-cumyl-phenol, and p-t-butyl phenol; and monoethers of diphenols, such as p-methoxyphenol, phenols with cyano-substitution such as p-cyanophenol, or with halogen substitution such as p-fluorophenol, or with nitro-substitution such as 4-nitrophenol. Alkyl-substituted phenols with branched chain alkyl substituents having 8 to 9 carbon atoms can be specifically mentioned. Certain mono-phenolic UV absorbers can also be used as an endcapping agent, for example 4-substituted-2-hydroxybenzophenones and their derivatives, aryl salicylates, monoesters of diphenols such as resorcinol monobenzoate, 2-(2-hydroxyaryl)-benzotriazoles and their derivatives, 2-(2-hydroxyaryl)-1,3,5-triazines and their derivatives, and the like. For example, the polycarbonate can have an end-cap comprising phenol, such as alkyl-substituted phenols, ether-substituted phenols, ester-substituted phenols, cyano-substituted phenols, and halogen substituted phenols, as well as combinations comprising at least one of the foregoing. Optionally, the end-capping agents can be selected from: cyanophenol and a phenol containing substitution(s) with aliphatic groups, olefinic groups, aromatic groups, halogens, ester groups, ether groups, and combinations comprising at least one of the foregoing. Of particular commercial usefulness are the end-capping agents selected from at least one of the following: phenol, para-t-butylphenol or para-cumylphenol.

Various types of additives, such as flame retardants, can be utilized in embodiments encompassed herein.

In one embodiment, the flame retardant additives include, for example, flame retardant salts such as alkali metal salts of perfluorinated $C_{1-16}$ alkyl sulfonates such as potassium perfluorobutane sulfonate (Rimar salt), potassium perfluoroctane sulfonate, tetraethylammonium perfluorohexane sulfonate, potassium diphenylsulfone sulfonate (KSS), and the like; and salts formed by reacting for example an alkali metal or alkaline earth metal (for example lithium, sodium, potassium, magnesium, calcium and barium salts) and an inorganic acid complex salt, for example, an oxo-anion, such as alkali metal and alkaline-earth metal salts of carbonic acid, such as $Na_2CO_3$, $K_2CO_3$, $MgCO_3$, $CaCO_3$, and $BaCO_3$ or fluoro-anion complex such as $Li_3AlF_6$, $BaSiF_6$, $KBF_4$, $K_3AlF_6$, $KAlF_4$, $K_2SiF_6$, and/or $Na_3AlF_6$ or the like. Rimar salt and KSS, alone or in combination with other flame retardants, are particularly useful in the polycarbonate compositions disclosed herein.

In another embodiment, the flame-retardants are selected from at least one of the following: alkali metal salts of perfluorinated $C_{1-16}$ alkyl sulfonates; potassium perfluorobutane sulfonate; potassium perfluoroctane sulfonate; tetraethylammonium perfluorohexane sulfonate; and potassium diphenylsulfone sulfonate.

In another embodiment, the flame retardant is not a bromine or chlorine containing composition.

In another embodiment, the flame retardant additives include organic compounds that include phosphorus, bromine, and/or chlorine. Non-brominated and non-chlorinated phosphorus-containing flame retardants can be used in certain applications for regulatory reasons, for example organic phosphates and organic compounds containing phosphorus-nitrogen bonds. One type of exemplary organic phosphate is an aromatic phosphate of the formula $(GO)_3P=O$, wherein each G is independently an alkyl, cycloalkyl, aryl, alkylaryl, or arylalkyl group, provided that at least one G is an aromatic group. Two of the G groups can be joined together to provide a cyclic group, for example, diphenyl pentaerythritol diphosphate. Exemplary aromatic phosphates include, phenyl bis(dodecyl)phosphate, phenyl bis(neopentyl)phosphate, phenyl bis(3,5,5'-trimethylhexyl)phosphate, ethyl diphenyl phosphate, 2-ethylhexyl di(p-tolyl)phosphate, bis(2-ethylhexyl) p-tolyl phosphate, tritolyl phosphate, bis(2-ethylhexyl)phenyl phosphate, tri(nonylphenyl)phosphate, bis (dodecyl) p-tolyl phosphate, dibutyl phenyl phosphate, 2-chloroethyl diphenyl phosphate, p-tolyl bis(2,5,5'-trimethylhexyl)phosphate, 2-ethylhexyl diphenyl phosphate, or the like. A specific aromatic phosphate is one in which each G is aromatic, for example, triphenyl phosphate, tricresyl phosphate, isopropylated triphenyl phosphate, and the like.

Di- or poly-functional aromatic phosphorus-containing compounds are also useful, for example, compounds of the formulas below:

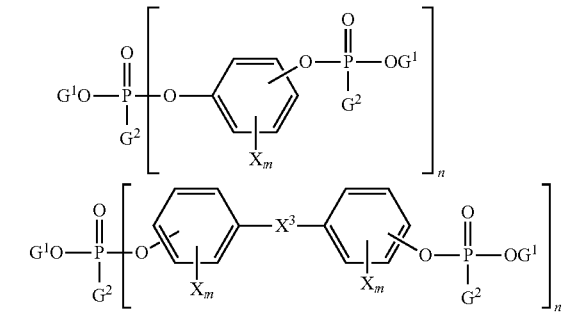

-continued

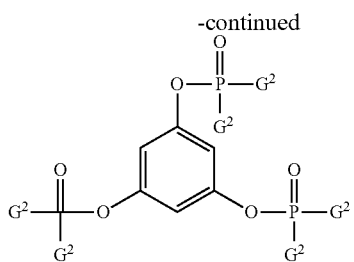

wherein each $G^1$ is independently a hydrocarbon having 1 to 30 carbon atoms; each $G^2$ is independently a hydrocarbon or hydrocarbonoxy having 1 to 30 carbon atoms; each X is independently a bromine or chlorine; m is 0 to 4, and n is 1 to 30. Exemplary di- or polyfunctional aromatic phosphorus-containing compounds include resorcinol tetraphenyl diphosphate (RDP), the bis(diphenyl)phosphate of hydroquinone and the bis(diphenyl) phosphate of bisphenol-A, respectively, their oligomeric and polymeric counterparts, and the like.

Exemplary flame retardant additives containing phosphorus-nitrogen bonds include phosphonitrilic chloride, phosphorus ester amides, phosphoric acid amides, phosphonic acid amides, phosphinic acid amides, tris(aziridinyl)phosphine oxide.

Halogenated organic flame retardant compounds can also be used as flame retardants, for example halogenated flame retardant compounds of formula (25):

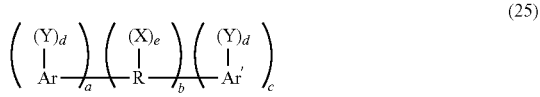

(25)

wherein R is a $C_{1-36}$ alkylene, alkylidene or cycloaliphatic linkage, e.g., methylene, ethylene, propylene, isopropylene, isopropylidene, butylene, isobutylene, amylene, cyclohexylene, cyclopentylidene, or the like; or an oxygen ether, carbonyl, amine, or a sulfur-containing linkage, e.g., sulfide, sulfoxide, sulfone, or the like. R can also consist of two or more alkylene or alkylidene linkages connected by such groups as aromatic, amino, ether, carbonyl, sulfide, sulfoxide, sulfone, or the like.

Ar and Ar' in formula (25) are each independently mono- or polycarbocyclic aromatic groups such as phenylene, biphenylene, terphenylene, naphthylene, or the like.

Y is an organic, inorganic, or organometallic radical, for example (1) halogen, e.g., chlorine, bromine, iodine, fluorine or (2) ether groups of the general formula OB, wherein B is a monovalent hydrocarbon group similar to X or (3) monovalent hydrocarbon groups of the type represented by R or (4) other substituents, e.g., nitro, cyano, and the like, said substituents being essentially inert provided that there is greater than or equal to one, specifically greater than or equal to two, halogen atoms per aryl nucleus.

When present, each X is independently a monovalent hydrocarbon group, for example an alkyl group such as methyl, ethyl, propyl, isopropyl, butyl, decyl, or the like; an aryl groups such as phenyl, naphthyl, biphenyl, xylyl, tolyl, or the like; and aralkyl group such as benzyl, ethylphenyl, or the like; a cycloaliphatic group such as cyclopentyl, cyclohexyl, or the like. The monovalent hydrocarbon group can itself contain inert substituents.

Each d is independently 1 to a maximum equivalent to the number of replaceable hydrogens substituted on the aromatic rings comprising Ar or Ar'. Each e is independently 0 to a maximum equivalent to the number of replaceable hydrogens on R. Each a, b, and c is independently a whole number, including 0. When b is not 0, neither a nor c can be 0. Otherwise either a or c, but not both, can be 0. Where b is 0, the aromatic groups are joined by a direct carbon-carbon bond.

The hydroxyl and Y substituents on the aromatic groups, Ar and Ar' can be varied in the ortho, meta or para positions on the aromatic rings and the groups can be in any possible geometric relationship with respect to one another.

Included within the scope of the above formula are bisphenols of which the following are representative: 2,2-bis-(3,5-dichlorophenyl)-propane; bis-(2-chlorophenyl)-methane; bis(2,6-dibromophenyl)-methane; 1,1-bis-(4-iodophenyl)-ethane; 1,2-bis-(2,6-dichlorophenyl)-ethane; 1,1-bis-(2-chloro-4-iodophenyl)ethane; 1,1-bis-(2-chloro-4-methylphenyl)-ethane; 1,1-bis-(3,5-dichlorophenyl)-ethane; 2,2-bis-(3-phenyl-4-bromophenyl)-ethane; 2,6-bis-(4,6-dichloronaphthyl)-propane; 2,2-bis-(2,6-dichlorophenyl)-pentane; 2,2-bis-(3,5-dibromophenyl)-hexane; bis-(4-chlorophenyl)-phenyl-methane; bis-(3,5-dichlorophenyl)-cyclohexylmethane; bis-(3-nitro-4-bromophenyl)-methane; bis-(4-hydroxy-2,6-dichloro-3-methoxyphenyl)-methane; and 2,2-bis-(3,5-dichloro-4-hydroxyphenyl)-propane 2,2 bis-(3-bromo-4-hydroxyphenyl)-propane, and the like. Also included within the above structural formula are: 1,3-dichlorobenzene, 1,4-dibromobenzene, 1,3-dichloro-4-hydroxybenzene, and biphenyls such as 2,2'-dichlorobiphenyl, polybrominated 1,4-diphenoxybenzene, 2,4'-dibromobiphenyl, and 2,4'-dichlorobiphenyl as well as decabromo diphenyl oxide, and the like.

Another useful class of flame retardant is the class of cyclic siloxanes having the general formula $(R_2SiO)_y$ wherein R is a monovalent hydrocarbon or fluorinated hydrocarbon having from 1 to 18 carbon atoms and y is a number from 3 to 12. Examples of fluorinated hydrocarbon include, but are not limited to, 3-fluoropropyl, 3,3,3-trifluoropropyl, 5,5,5,4,4,3,3-heptafluoropentyl, fluorophenyl, difluorophenyl and trifluorotolyl. Examples of exemplary cyclic siloxanes include, but are not limited to, octamethylcyclotetrasiloxane, 1,2,3,4-tetramethyl-1,2,3,4-tetravinylcyclotetrasiloxane, 1,2,3,4-tetramethyl-1,2,3,4-tetraphenylcyclotetrasiloxane, octaethylcyclotetrasiloxane, octapropylcyclotetrasiloxane, octabutylcyclotetrasiloxane, decamethylcyclopentasiloxane, dodecamethylcyclohexasiloxane, tetradecamethylcycloheptasiloxane, hexadecamethylcyclooctasiloxane, eicosamethylcyclodecasiloxane, octaphenylcyclotetrasiloxane, and the like. A particularly useful cyclic siloxane is octaphenylcyclotetrasiloxane.

When present, the foregoing flame retardant additives are generally present in amounts of 0.01 to 10 wt %, more specifically 0.02 to 5 wt %, based on 100 parts by weight of the polymer component of the thermoplastic composition.

In another embodiment the thermoplastic composition can further include an impact modifier(s), with the proviso that the additives are selected so as to not significantly adversely affect the desired properties of the thermoplastic composition. Exemplary impact modifiers are typically high molecular weight elastomeric materials derived from olefins, monovinyl aromatic monomers, acrylic and methacrylic acids and their ester derivatives, as well as conjugated dienes. The polymers formed from conjugated dienes can be fully or partially hydrogenated. The elastomeric materials can be in the form of homopolymers or copolymers, including random, block, radial block, graft, and core-shell copolymers. Combinations of impact modifiers can be used.

A specific type of impact modifier is an elastomer-modified graft copolymer comprising (i) an elastomeric (i.e., rubbery) polymer substrate having a glass transition temperature ($T_g$) less than 10° C., more specifically less than −10° C., or more specifically −40° to −80° C., and (ii) a rigid polymeric superstrate grafted to the elastomeric polymer substrate. Materials for use as the elastomeric phase include, for example, conjugated diene rubbers, for example polybutadiene and polyisoprene; copolymers of a conjugated diene with less than 50 wt % of a copolymerizable monomer, for example a monovinylic compound such as styrene, acrylonitrile, n-butyl acrylate, or ethyl acrylate; olefin rubbers such as ethylene propylene copolymers (EPR) or ethylene-propylene-diene monomer rubbers (EPDM); ethylene-vinyl acetate rubbers; silicone rubbers; elastomeric $C_{1-8}$ alkyl(meth)acrylates; elastomeric copolymers of $C_{1-8}$ alkyl(meth)acrylates with butadiene and/or styrene; or combinations comprising at least one of the foregoing elastomers. Materials for use as the rigid phase include, for example, monovinyl aromatic monomers such as styrene and alpha-methyl styrene, and monovinylic monomers such as acrylonitrile, acrylic acid, methacrylic acid, and the $C_1$-$C_6$ esters of acrylic acid and methacrylic acid, specifically methyl methacrylate. As used herein, the term "(meth)acrylate" encompasses both acrylate and methacrylate groups.

Specific exemplary elastomer-modified graft copolymers include those formed from styrene-butadiene-styrene (SBS), styrene-butadiene rubber (SBR), styrene-ethylene-butadiene-styrene (SEBS), ABS (acrylonitrile-butadiene-styrene), acrylonitrile-ethylene-propylene-diene-styrene (AES), styrene-isoprene-styrene (SIS), methyl methacrylate-butadiene-styrene (MBS), and styrene-acrylonitrile (SAN).

Impact modifiers, when present, are generally present in amounts of 1 to 30 wt %, based on 100 parts by weight of the polymer component of the thermoplastic composition.

According to an embodiment, the thermoplastic composition also can include various additives ordinarily incorporated in polycarbonate compositions of this type, with the proviso that the additives are selected so as to not significantly adversely affect the desired properties of the polycarbonate, for example, transparency and flame retardance. Combinations of additives can be used. Such additives can be mixed at a suitable time during the mixing of the components for forming the composition.

Various additives can be incorporated into the composition of matters encompassed by embodiments disclosed herein.

In one embodiment, one or more additives are selected from at least one of the following: UV stabilizing additives, thermal stabilizing additives, mold release agents, colorants, organic and inorganic fillers, and gamma-stabilizing agents.

Possible fillers or reinforcing agents include, for example, silicates and silica powders such as aluminum silicate (mullite), synthetic calcium silicate, zirconium silicate, fused silica, crystalline silica graphite, natural silica sand, or the like; boron powders such as boron-nitride powder, boron-silicate powders, or the like; oxides such as $TiO_2$, aluminum oxide, magnesium oxide, or the like; calcium sulfate (as its anhydride, dihydrate or trihydrate); calcium carbonates such as chalk, limestone, marble, synthetic precipitated calcium carbonates, or the like; talc, including fibrous, modular, needle shaped, lamellar talc, or the like; wollastonite; surface-treated wollastonite; glass spheres such as hollow and solid glass spheres, silicate spheres, cenospheres, aluminosilicate (armospheres), or the like; kaolin, including hard kaolin, soft kaolin, calcined kaolin, kaolin comprising various coatings known in the art to facilitate compatibility with the polycarbonate polymeric matrix, or the like; single crystal fibers or "whiskers" such as silicon carbide, alumina, boron carbide, iron, nickel, copper, or the like; fibers (including continuous and chopped fibers) such as asbestos, carbon fibers, glass fibers, such as E, A, C, ECR, R, S, D, or NE glasses, or the like; sulfides such as molybdenum sulfide, zinc sulfide or the like; barium compounds such as barium titanate, barium ferrite, barium sulfate, heavy spar, or the like; metals and metal oxides such as particulate or fibrous aluminum, bronze, zinc, copper and nickel or the like; flaked fillers such as glass flakes, flaked silicon carbide, aluminum diboride, aluminum flakes, steel flakes or the like; fibrous fillers, for example short inorganic fibers such as those derived from blends comprising at least one of aluminum silicates, aluminum oxides, magnesium oxides, and calcium sulfate hemihydrate or the like; natural fillers and reinforcements, such as wood flour obtained by pulverizing wood, fibrous products such as cellulose, cotton, sisal, jute, starch, cork flour, lignin, ground nut shells, corn, rice grain husks or the like; organic fillers such as polytetrafluoroethylene; reinforcing organic fibrous fillers formed from organic polymers capable of forming fibers such as poly(ether ketone), polyimide, polybenzoxazole, poly (phenylene sulfide), polyesters, polyethylene, aromatic polyamides, aromatic polyimides, polyetherimides, polytetrafluoroethylene, acrylic resins, poly(vinyl alcohol) or the like; as well as additional fillers and reinforcing agents such as mica, clay, feldspar, flue dust, fillite, quartz, quartzite, perlite, tripoli, diatomaceous earth, carbon black, or the like, or combinations comprising at least one of the foregoing fillers or reinforcing agents.

The fillers and reinforcing agents can be coated with a layer of metallic material to facilitate conductivity, or surface treated with silanes to improve adhesion and dispersion with the polycarbonate polymeric matrix. In addition, the reinforcing fillers can be provided in the form of monofilament or multifilament fibers and can be used individually or in combination with other types of fiber, through, for example, co-weaving or core/sheath, side-by-side, orange-type or matrix and fibril constructions, or by other methods known to one skilled in the art of fiber manufacture. Exemplary co-woven structures include, for example, glass fiber-carbon fiber, carbon fiber-aromatic polyimide (aramid) fiber, and aromatic polyimide fiberglass fiber or the like. Fibrous fillers can be supplied in the form of, for example, rovings, woven fibrous reinforcements, such as 0-90 degree fabrics or the like; nonwoven fibrous reinforcements such as continuous strand mat, chopped strand mat, tissues, papers and felts or the like; or three-dimensional reinforcements such as braids. Fillers are generally used in amounts of 0 to 80 parts by weight, based on 100 parts by weight of the polymer component of the composition.

Exemplary antioxidant additives include, for example, organophosphites such as tris(nonyl phenyl)phosphite, tris(2, 4-di-t-butylphenyl)phosphite (e.g., "IRGAFOS 168" or "I-168"), bis(2,4-di-t-butylphenyl)pentaerythritol diphosphite, distearyl pentaerythritol diphosphite or the like; alkylated monophenols or polyphenols; alkylated reaction products of polyphenols with dienes, such as tetrakis[methylene (3,5-di-tert-butyl-4-hydroxyhydrocinnamate)]methane, or the like; butylated reaction products of para-cresol or dicyclopentadiene; alkylated hydroquinones; hydroxylated thiodiphenyl ethers; alkylidene-bisphenols; benzyl compounds; esters of beta-(3,5-di-tert-butyl-4-hydroxyphenyl)-propionic acid with monohydric or polyhydric alcohols; esters of beta-(5-tert-butyl-4-hydroxy-3-methylphenyl)-propionic acid with monohydric or polyhydric alcohols; esters of thioalkyl or thioaryl compounds such as distearylthiopropionate, dilaurylthiopropionate, ditridecylthiodipropionate, octadecyl-3-(3,5-di-tert-butyl-4-hydroxyphenyl)propionate, pentaerythrityl-tetrakis[3-(3,5-di-tert-butyl-4-hydroxyphenyl) propionate or the like; amides of beta-(3,5-di-tert-butyl-4-hydroxyphenyl)-propionic acid or the like, or combinations comprising at least one of the foregoing antioxidants. Antioxidants are generally used in amounts of 0.0001 to 1 part by weight, based on 100 parts by weight of the polymer component of the thermoplastic composition (excluding any filler).

Exemplary heat stabilizer additives include, for example, organophosphites such as triphenyl phosphite, tris-(2,6-dimethylphenyl)phosphite, tris-(mixed mono- and di-nonylphenyl)phosphite or the like; phosphonates such as dimethylbenzene phosphonate or the like, phosphates such as trimethyl phosphate, or the like, or combinations comprising at least one of the foregoing heat stabilizers. Heat stabilizers are generally used in amounts of 0.0001 to 1 part by weight, based on 100 parts by weight of the polymer component of the thermoplastic composition.

Light stabilizers and/or ultraviolet light (UV) absorbing additives can also be used. Exemplary light stabilizer additives include, for example, benzotriazoles such as 2-(2-hydroxy-5-methylphenyl)benzotriazole, 2-(2-hydroxy-5-tert-octylphenyl)-benzotriazole and 2-hydroxy-4-n-octoxy benzophenone, or the like, or combinations comprising at least one of the foregoing light stabilizers. Light stabilizers are generally used in amounts of 0.0001 to 1 parts by weight, based on 100 parts by weight of the polymer component of the thermoplastic composition, according to embodiments.

Exemplary UV absorbing additives include for example, hydroxybenzophenones; hydroxybenzotriazoles; hydroxybenzotriazines; cyanoacrylates; oxanilides; benzoxazinones; 2-(2H-benzotriazol-2-yl)-4-(1,1,3,3-tetramethylbutyl)-phenol (CYASORB® 5411); 2-hydroxy-4-n-octyloxybenzophenone (CYASORB® 531); 2-[4,6-bis(2,4-dimethylphenyl)-1,3,5-triazin-2-yl]-5-(octyloxy)-phenol (CYASORB® 1164); 2,2'-(1,4-phenylene)bis(4H-3,1-benzoxazin-4-one) (CYASORB® UV-3638); 1,3-bis[[(2-cyano-3,3-diphenylacryloyl)oxy]-2,2-bis[[(2-cyano-3,3-diphenylacryloyl)oxy]methyl] propane (UVINUL® 3030); 2,2'-(1,4-phenylene)bis(4H-3,1-benzoxazin-4-one); 1,3-bis[(2-cyano-3,3-diphenylacryloyl) oxy]-2,2-bis[[(2-cyano-3,3-diphenylacryloyl)oxy]methyl] propane; nano-size inorganic materials such as titanium oxide, cerium oxide, and zinc oxide, all with particle size less than or equal to 100 nanometers; or the like, or combinations comprising at least one of the foregoing UV absorbers. UV absorbers are generally used in amounts of 0.0001 to 1 part by weight, based on 100 parts by weight of the polymer component of the thermoplastic composition.

Plasticizers, lubricants, and/or mold release agents can also be used. There is considerable overlap among these types of materials, which include, for example, phthalic acid esters such as dioctyl-4,5-epoxy-hexahydrophthalate; tris-(octoxycarbonylethyl)isocyanurate; tristearin; di- or polyfunctional aromatic phosphates such as resorcinol tetraphenyl diphosphate (RDP), the bis(diphenyl)phosphate of hydroquinone and the bis(diphenyl)phosphate of bisphenol-A; poly-alpha-olefins; epoxidized soybean oil; silicones, including silicone oils; esters, for example, fatty acid esters such as alkyl stearyl esters, e.g., methyl stearate, stearyl stearate, pentaerythritol tetrastearate (PETS), and the like; combinations of methyl stearate and hydrophilic and hydrophobic nonionic surfactants comprising polyethylene glycol polymers, polypropylene glycol polymers, poly(ethylene glycol-co-propylene glycol) copolymers, or a combination comprising at least one of the foregoing glycol polymers, e.g., methyl stearate and polyethylene-polypropylene glycol copolymer in a suitable solvent; waxes such as beeswax, montan wax, paraffin wax, or the like. Such materials are generally used in amounts of 0.001 to 1 part by weight, specifically 0.01 to 0.75 part by weight, more specifically 0.1 to 0.5 part by weight, based on 100 parts by weight of the polymer component of the thermoplastic composition.

The term "antistatic agent" refers to monomeric, oligomeric, or polymeric materials that can be processed into polymer resins and/or sprayed onto materials or articles to improve conductive properties and overall physical performance. Examples of monomeric antistatic agents include glycerol monostearate, glycerol distearate, glycerol tristearate, ethoxylated amines, primary, secondary and tertiary amines, ethoxylated alcohols, alkyl sulfates, alkylarylsulfates, alkylphosphates, alkylaminesulfates, alkyl sulfonate salts such as sodium stearyl sulfonate, sodium dodecylbenzenesulfonate or the like, quaternary ammonium salts, quaternary ammonium resins, imidazoline derivatives, sorbitan esters, ethanolamides, betaines, or the like, or combinations comprising at least one of the foregoing monomeric antistatic agents.

Exemplary polymeric antistatic agents include certain polyesteramides polyether-polyamide (polyetheramide) block copolymers, polyetheresteramide block copolymers, polyetheresters, or polyurethanes, each containing polyalkylene glycol moieties polyalkylene oxide units such as polyethylene glycol, polypropylene glycol, polytetramethylene glycol, and the like. Such polymeric antistatic agents are commercially available, for example PELESTAT™ 6321 (Sanyo) or PEBAX™ MH1657 (Atofina), IRGASTAT™ P18 and P22 (Ciba-Geigy). Other polymeric materials that can be used as antistatic agents are inherently conducting polymers such as polyaniline (commercially available as PANIPOL™ EB from Panipol), polypyrrole and polythiophene (commercially available from Bayer), which retain some of their intrinsic conductivity after melt processing at elevated temperatures. In one embodiment, carbon fibers, carbon nanofibers, carbon nanotubes, carbon black, or a combination comprising at least one of the foregoing can be used in a polymeric resin containing chemical antistatic agents to render the composition electrostatically dissipative. Antistatic agents are generally used in amounts of 0.0001 to 5 parts by weight, based on 100 parts by weight (pbw) of the polymer component of the thermoplastic composition.

Colorants such as pigment and/or dye additives can also be present provided they do not adversely affect, for example, any flame retardant performance. Useful pigments can include, for example, inorganic pigments such as metal oxides and mixed metal oxides such as zinc oxide, titanium dioxides, iron oxides, or the like; sulfides such as zinc sulfides, or the like; aluminates; sodium sulfo-silicates sulfates, chromates, or the like; carbon blacks; zinc ferrites; ultramarine blue; organic pigments such as azos, di-azos, quinacridones, perylenes, naphthalene tetracarboxylic acids, flavanthrones, isoindolinones, tetrachloroisoindolinones, anthraquinones, enthrones, dioxazines, phthalocyanines, and azo lakes; Pigment Red 101, Pigment Red 122, Pigment Red 149, Pigment Red 177, Pigment Red 179, Pigment Red 202, Pigment Violet 29, Pigment Blue 15, Pigment Blue 60, Pigment Green 7, Pigment Yellow 119, Pigment Yellow 147, Pigment Yellow 150, and Pigment Brown 24; or combinations comprising at least one of the foregoing pigments. Pigments are generally used in amounts of 0.01 to 10 parts by weight, based on 100 parts by weight of the polymer component of the thermoplastic composition.

Exemplary dyes are generally organic materials and include, for example, coumarin dyes such as coumarin 460 (blue), coumarin 6 (green), nile red or the like; lanthanide complexes; hydrocarbon and substituted hydrocarbon dyes; polycyclic aromatic hydrocarbon dyes; scintillation dyes such as oxazole or oxadiazole dyes; aryl- or heteroaryl-substituted poly(C2-8) olefin dyes; carbocyanine dyes; indanthrone dyes; phthalocyanine dyes; oxazine dyes; carbostyryl dyes; napthalenetetracarboxylic acid dyes; porphyrin dyes; bis(styryl)biphenyl dyes; acridine dyes; anthraquinone dyes; cyanine dyes; methine dyes; arylmethane dyes; azo dyes; indigoid dyes, thioindigoid dyes, diazonium dyes; nitro dyes; quinone imine dyes; aminoketone dyes; tetrazolium dyes; thiazole dyes; perylene dyes, perinone dyes; bis-benzoxazolylthiophene (BBOT); triarylmethane dyes; xanthene dyes; thioxanthene dyes; naphthalimide dyes; lactone dyes; fluorophores such as anti-stokes shift dyes which absorb in the near infrared wavelength and emit in the visible wavelength, or the like; luminescent dyes such as 7-amino-4-methylcoumarin; 3-(2'-benzothiazolyl)-7-diethylaminocoumarin; 2-(4-biphenylyl)-5-(4-t-butylphenyl)-1,3,4-oxadiazole; 2,5-bis-(4-biphenylyl)-oxazole; 2,2'-dimethyl-p-quaterphenyl; 2,2-dimethyl-p-terphenyl; 3,5,3'''',5''''-tetra-t-butyl-p-quinquephenyl; 2,5-diphenylfuran; 2,5-diphenyloxazole; 4,4'-diphenylstilbene; 4-dicyanomethylene-2-methyl-6-(p-dimethylaminostyryl)-4H-pyran; 1,1'-diethyl-2,2'-carbocyanine iodide; 3,3'-diethyl-4,4',5,5'-dibenzothiatricarbocyanine iodide; 7-dimethylamino-1-methyl-4-methoxy-8-azaquinolone-2; 7-dimethylamino-4-methylquinolone-2; 2-(4-(4-dimethylaminophenyl)-1,3-butadienyl)-3-ethylbenzothiazolium perchlorate; 3-diethylamino-7-diethyliminophenoxazonium perchlorate; 2-(1-naphthyl)-5-phenyloxazole; 2,2'-p-phenylen-bis(5-phenyloxazole); rhodamine 700; rhodamine 800; pyrene, chrysene, rubrene, coronene, or the like; or combinations comprising at least one of the foregoing dyes. Dyes are generally used in amounts of 0.01 to 10 parts by weight, based on 100 parts by weight of the polymer component of the thermoplastic composition.

Where a foam is desired, useful blowing agents include, for example, low boiling halohydrocarbons and those that generate carbon dioxide; blowing agents that are solid at room temperature and when heated to temperatures higher than their decomposition temperature, generate gases such as nitrogen, carbon dioxide, and ammonia gas, such as azodicarbonamide, metal salts of azodicarbonamide, 4,4' oxybis (benzenesulfonylhydrazide), sodium bicarbonate, ammonium carbonate, or the like, or combinations comprising at least one of the foregoing blowing agents. Blowing agents are generally used in amounts of 0.01 to 20 parts by weight, based on 100 parts by weight of the polymer component of the thermoplastic composition.

Anti-drip agents can also be used in the thermoplastic composition according to embodiments, for example a fibril forming or non-fibril forming fluoropolymer such as polytetrafluoroethylene (PTFE). The anti-drip agent can be encapsulated by a rigid copolymer as described above, for example styrene-acrylonitrile copolymer (SAN). PTFE encapsulated in SAN is known as TSAN. Encapsulated fluoropolymers can be made by polymerizing the encapsulating polymer in the presence of the fluoropolymer, for example an aqueous dispersion. TSAN can provide significant advantages over PTFE, in that TSAN can be more readily dispersed in the composition. An exemplary TSAN can comprise 50 wt % PTFE and 50 wt % SAN, based on the total weight of the encapsulated fluoropolymer. The SAN can comprise, for example, 75 wt % styrene and 25 wt % acrylonitrile based on the total weight of the copolymer. Alternatively, the fluoropolymer can be pre-blended in some manner with a second polymer, such as, for example, an aromatic polycarbonate or SAN to form an agglomerated material for use as an anti-drip agent. Either method can be used to produce an encapsulated fluoropolymer. Antidrip agents are generally used in amounts of 0.1 to 5 percent by weight, based on 100 parts by weight of the polymer component of the thermoplastic composition.

Radiation stabilizers can also be present, specifically gamma-radiation stabilizers. Exemplary gamma-radiation stabilizers include alkylene polyols such as ethylene glycol, propylene glycol, 1,3-propanediol, 1,2-butanediol, 1,4-butanediol, meso-2,3-butanediol, 1,2-pentanediol, 2,3-pentanediol, 1,4-pentanediol, 1,4-hexandiol, and the like; cycloalkylene polyols such as 1,2-cyclopentanediol, 1,2-cyclohexanediol, and the like; branched alkylenepolyols such as 2,3-dimethyl-2,3-butanediol (pinacol), and the like, as well as alkoxy-substituted cyclic or acyclic alkanes. Unsaturated alkenols are also useful, examples of which include 4-methyl-4-penten-2-ol, 3-methyl-pentene-3-ol, 2-methyl-4-penten-2-ol, 2,4-dimethyl-4-pene-2-ol, and 9 to decen-1-ol, as well as tertiary alcohols that have at least one hydroxy substituted tertiary carbon, for example 2-methyl-2,4-pentanediol (hexylene glycol), 2-phenyl-2-butanol, 3-hydroxy-3-methyl-2-butanone, 2-phenyl-2-butanol, and the like, and cyclic tertiary alcohols such as 1-hydroxy-1-methyl-cyclohexane. Certain hydroxymethyl aromatic compounds that have hydroxy substitution on a saturated carbon attached to an unsaturated carbon in an aromatic ring can also be used. The hydroxy-substituted saturated carbon can be a methylol group ($—CH_2OH$) or it can be a member of a more complex hydrocarbon group such as $—CR^4HOH$ or $—CR^4OH$ wherein $R^4$ is a complex or a simple hydrocarbon. Specific hydroxy methyl aromatic compounds include benzhydrol, 1,3-benzenedimethanol, benzyl alcohol, 4-benzyloxy benzyl alcohol and benzyl benzyl alcohol. 2-Methyl-2,4-pentanediol, polyethylene glycol, and polypropylene glycol are often used for gamma-radiation stabilization. Gamma-radiation stabilizing compounds are typically used in amounts of 0.1 to 10 parts by weight based on 100 parts by weight of the polymer component of the thermoplastic composition.

Thermoplastic compositions according to embodiments can be manufactured by various methods. For example, the desired constituents such as, for example, polycarbonate, flame retardant, impact modifier (if present), and/or other optional components can be first blended in a HENSCHEL-Mixer™ high speed mixer. Other low shear processes, including but not limited to hand mixing, can also accomplish this blending. The blend is then fed into the throat of a single or twin-screw extruder via a hopper. Alternatively, at least one of the components can be incorporated into the composition by feeding directly into the extruder at the throat and/or downstream through a sidestuffer. Additives can also be compounded into a masterbatch with a desired polymeric resin and fed into the extruder. The extruder is generally operated at a temperature higher than that necessary to cause the composition to flow. The extrudate is immediately quenched in a water batch and pelletized. The pellets, so prepared, when cutting the extrudate can be one-fourth inch long or less as desired. Such pellets can be used for subsequent molding, shaping, or forming.

In some embodiments described above, the onset of high-temperature cross-linking can be controlled by adjusting the molecular weight of the endcapped polycarbonate or by the addition of certain flame retardant salts, in particular alkali metal salts of perfluorinated $C_{1-16}$ alkyl sulfonates. In one embodiment, the addition of an inorganic flame retardant (e.g., KSS) increases the temperature of the onset of crosslinking/branching in the polycarbonate by 20 to 80° C., specifically 40 to 60° C.

Various types of conversion material(s) can be utilized in conjunction with a plastic (e.g., polycarbonate) containing composition described in this disclosure. Conversion material(s) are selected and added in an effective quantity so as to facilitate luminescence or transmission of an LED or other light-emitting device. The useful conversion material(s) have a shortlived luminescence lifetime of less than $10^{-4}$ seconds(s). It is noted that, depending upon how a conversion material is made, it may be longlived (luminescence lifetime of greater than minutes) or shortlived.

The conversion material(s) can be coated (e.g., result of applying a material to the surface of the conversion material(s), wherein the coating is on the surface and/or chemically interacts with the surface). Radiometric values (such as radiant power, radiant intensity, irradiance, and radiance) and corresponding photometric values (such as total luminance flux, luminous intensity, illuminance, luminance), luminance efficacy (in lumens per watt (1 m/W)), color rendering index, color quality scale (CQS), correlated color temperature, and chromaticity, are expected to improve compared to the uncoated conversion material(s) when added to a plastic material such as polycarbonate. Desirably, the conversion material(s) can be sufficiently coated so as to maintain melt stability with an MVR change of less than or equal to 30%, specifically less than or equal to 10% (i.e., MVR is determined at 6 minutes and again at 18 minutes, and the difference between these MVRs is less than or equal to 30% of the 6 minute value).

The conversion material(s) can be coated with silicone oil(s) and/or a layer of amorphous silica. Some examples of silicone oils include, but are not limited to: hydrogen-alkyl siloxane oil; polydialkyl siloxane oil; polydimethyl siloxane codiphenyl siloxane, dihydroxy terminated (such as Gelest PDS 1615 commercially available from Gelest, Inc.); as well as combinations comprising at least one of the foregoing. Such silicone oils are considered coatings where the conversion material is first treated with the silicone oil(s) prior to addition to a matrix or binder (collectively referred to as matrix), such as polycarbonate. The coating itself, is neither the binder nor the matrix that contains the conversion material to hold in place for exposure to blue LED radiation. Additionally, the coating does not require a curing method.

The conversion material can be coated with silicone oil e.g., by a method such as spraying the silicon oil. For example, the conversion material can be coated by spraying of the silicone oil in a fluidized bed reactor. The total amount of silicone oil can be 0.05 wt % to 20 wt % with respect to the conversion material, specifically, 0.1 wt % to 10 wt %, and more specifically, 0.5 wt % to 5 wt %, based upon the total weight of the conversion material. When two silicone coatings are used, such as polymethylhydrosiloxane and polydimethylsiloxane, the total amount does not change, and the split ratio between the two oils can be 1:99 to 99:1 depending on the type of protection being sought. In an embodiment, the first coating represents at least about 50 wt % of the total silicone oil content. Coating of conversion materials is further described in commonly assigned U.S. Pat. No. 6,692,659 B2 to Brown et al.

Some examples of oils include polymethylhydrosiloxane (for example, DF1040 commercially available from Momentive Performance Materials) and polydimethyl siloxane (e.g., DF581 commercially available from Momentive Performance Materials). Other examples include diphenyl siloxane, e.g., silanol terminated oils such as silanol terminated diphenylsiloxane (e.g., PDS-1615 commercially available from Gelest, Inc., Morrisville, Pa.). Loading level up to 4 pph by weight, specifically a loading of 0.1 to 0.5 (e.g., 0.2) pph by weight of pigment (e.g., Gelest PDS-1615). Other possible silanol terminated siloxanes include PDS-0338 and PDS-9931 also commercially available from Gelest, Inc. Desirably, the final article comprising the coated conversion material(s) comprises less than or equal to 20 pbw of conversion material(s) to 100 pbw of plastic material.

The conversion material(s), including those of which are surface treated, include: conversion material(s) having formula:

$(A^3)_2SiO_4:Eu^{2+}D^1$ where $A^3$ is a divalent metal selected from Sr, Ca, Ba, Mg, Zn, Cd, and combinations comprising at least one of the foregoing, and $D^1$ is a dopant selected from F, Cl, Br, I, P, S or N, and optionally combinations comprising at least one of the foregoing.

The conversion material(s) can be material(s) having formula: $(A^4)_2SiO_4:Eu^{2+}D^2$ with an optional dopant selected from Al, Co, Fe, Mg, Mo, Na, Ni, Pd, P, Rh, Sb, Ti or Zr, and optionally combinations comprising at least one of the foregoing, wherein $A^4$ is selected from Sr, Ba, Ca, and combinations comprising at least one of the foregoing.

The conversion material(s) can be material(s) having formula:

$(YA^5)_3(AlB)_5(OD^3)_{12}:Ce^{3+}$     (25)

where $A^5$ is a trivalent metal selected from Gd, Tb, La, Sm, or a divalent metal ion such as Sr, Ca, Ba, Mg, Zn, Cd, and combinations comprising at least one of the foregoing; B is selected from Si, B, P, and Ga, and optionally combinations comprising at least one of the foregoing; and $D^3$ is a dopant selected from F, Cl, Br, I, P, S or N, and optionally combinations comprising at least one of the foregoing. Other possible yellow conversion material(s) include: $Y_3Al_5O_{12}:Ce$; $Tb_{3-x}RE_xAl_5O_{12}:Ce$ (TAG), wherein RE=Y, Gd, La, Lu; $Sr_{2-x-y}Ba_xCa_ySiO_4:Eu$; $Sr_{3-x}SiO_5:Eu^{2+}_x$, wherein $0<x\le1$. Possible yellow/green conversion material(s) include: $(Sr,Ca,Ba)(Al,Ga)_2S_4:Eu^{2+}$; $Ba_2(Mg,Zn)Si_2O_7:Eu^{2+}$; $Gd_{0.46}Sr_{0.31}Al_{1.23}O_xF_{1.38}:Eu^{2+}_{0.06}$; $(Ba_{1-x-y}Sr_xCa_y)SiO_4:Eu$; and $Ba_2SiO_4:Eu^{2+}$.

The conversion material(s) can be a material having the following formula: $(YGd)_3Al_5O_{12}:Ce^{3+}$ or $Y_3Al_5(OD^3)_{12}:Ce^{3+}$.

The conversion material(s) can be orange-red silicate-based conversion material(s) having formula:

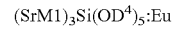

$(SrM1)_3Si(OD^4)_5:Eu$ where M1 is selected from Ba, Ca, Mg, Zn, and combinations comprising at least one of the foregoing; and $D^4$ is selected from F, Cl, S, and N, and optionally combinations comprising at least one of the foregoing; conversion material(s); a $Eu^{2+}$ doped and or $Dy^{3+}$ conversion material(s) having formula:

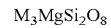

$M_3MgSi_2O_8$ wherein M is selected from Ca, Sr, Ba and combinations comprising at least one of the foregoing.

The conversion material(s) can be red silicon nitride based $Eu^{2+}$ doped conversion material(s) having a formula:

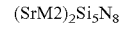

$(SrM2)_2Si_5N_8$ where M2 is selected from Ca, Mg, and Zn. Other nitridosilicates, oxonitridosilicates, oxonitridoaluminosilicates examples include:

$Ba_2SiN_8:Eu^{2+}$ alpha-SiAlON:Re (Re=$Eu^{2+}$, $Ce^{3+}$, $Yb^{2+}$, $Tb^{3+}$, $Pr^{3+}$, $Sm^{3+}$), and optionally combinations comprising at least one of the foregoing.

Beta-SiAlON:$Eu^{2+}$ $Sr_2Si_5N_8$:$Eu^{2+}$,$Ce^{3+}$

Rare earth doped red sulfate based conversion material(s), e.g., have the formula:

(SrM3)S where M3 is selected from Ca, Ba, and Mg, and optionally combinations comprising at least one of the foregoing. Other possible red conversion material(s) include $Sr_xCa_{1-x}S$:Eu, Y, wherein Y is a halide; $CaSiAlN_3$:$Eu^{2+}$; $Sr_{2-y}Ca_ySiO_4$:Eu; $Lu_2O_3$:$Eu^{3+}$; $(Sr_{2-x}La_x)(Ce_{1-x}Eu_x)O_4$; $Sr_2Ce_{1-x}Eu_xO_4$; $Sr_{2-x}Eu_xCeO_4$; $SrTiO_3$:$Pr^{3+}$, $Ga^{3+}$; $CaAlSiN_3$:$Eu^{2+}$; and $Sr_2Si_5N_8$:$Eu^{2+}$.

The conversion material(s) can comprise blue conversion material(s), e.g., having the formula $BaMgAl_{10}O_{17}$:$Eu^{2+}$.

The conversion material(s) can comprise green sulfate based conversion material(s), e.g., having formula:

(SrM3)(GaM4)$_2$S$_4$:Eu where M3 is set forth above, and M4 is selected from Al and In.

The conversion material(s) can include $Tb_{3-x}RE^1_xO_{12}$:Ce (TAG), wherein $RE^1$ is selected from Y, Gd, La, Lu, and combinations comprising at least one of the foregoing; yttrium aluminum garnet (YAG) doped with cerium (e.g., $(Y,Gd)_3Al_5O_{12}$:$Ce^{3+}$; YAG:Ce); terbium aluminum garnet doped with cerium (TAG:Ce); silicate conversion material(s) (BOSE), (e.g. $(Sr)_2SiO_4$:Eu, $(Ba)_2SiO_4$:Eu, $(Ca)_2SiO_4$:Eu); nitride conversion material(s) (e.g., doped with cerium and/or europium); nitrido silicates (e.g., $LaSi_3N_5$:$Eu^{2+}$, $O^{2-}$ or $Ba_2Si_5N_8$:$Eu^{2+}$); nitride orthosilicate (e.g., such as disclosed in DE 10 2006 016 548 A1); or combinations comprising at least one of the foregoing. Other possible green conversion material(s) include: $SrGa2S_4$:Eu, $Sr_{2-y}BaySiO_4$:Eu $SrSiO_2N_2$:Eu, and $Ca_3Si_2O_4N_2$:$Eu^{2+}$.

The various conversion material(s) (e.g., coated conversion material(s)) described above can be used alone or in combination. The conversion material(s) can comprise combinations of yellow conversion material(s) (such as $(Y,Gd)_3Al_5O_{12}$:Ce3+ or $(Sr,Ba,Ca)_2SiO_4$:Eu) with a red conversion material(s) (such as $(Sr,Ca)AlSiN_3$:Eu), e.g., to produce a warm white light. The conversion material(s) comprise combinations of green aluminate (GAL) and a red conversion material(s) (e.g., to produce white light from the RGB of blue LED, green light and red light). Green aluminate and red nitride conversion material(s) can be used alone or combined to generate white light when exposed to blue LED light. Red nitride conversion material(s) may contain ions to promote quantum efficiency. The conversion material(s) can comprise a combination of a semiconductor nanocrystals of cadmium sulfide mixed with manganese; and/or a $La_3Si_6N_{11}$:$Ce^{3+}$. A YAG:Ce conversion material or BOSE (boron ortho-silicate) conversion material, for example, can be utilized to convert the blue light to yellow. A reddish AlInGaP LED can be included to pull yellow light from the conversion material to the black body curve.

Also included are combinations comprising at least one of the foregoing conversion materials.

The YAG:Ce based conversion material(s) can be synthetic aluminum garnets, with garnet structure $A_3^{3+}B_5^{3+}O_{12}^{2-}$ (containing $Al_5O_{12}^{9-}$ and A is a trivalent element such as $Y^{3+}$). Specifically, in some embodiments, the conversion material(s) is not an aluminum spinel, wherein a spinel has the structure $A^{2+}B_2^{3+}O_4^{2-}$ ($Al_2O_4^{2-}$ and A is a divalent alkaline earth element such as $Ca^{2+}$, $Sr^{2+}$, and $Ba^{2+}$). The aluminum garnet is synthetically prepared in such a manner (annealing) as to impart short-lived luminescence lifetime lasting less than $10^{-4}$ s. Another process for forming short-lived luminescence (i.e., avoiding forming long afterglow materials) is disclosed in Advanced Powder Technology to Shii Choua et al., Volume 23, Issue 1, January 2012, Pages 97-103.

The amount of conversion material(s) added to a plastic material to form the plastic composition may vary according to the selected plastic composition and/or the surface coating for the selected conversion material(s). The conversion material(s) can be added to the plastic material in an amount of 0.1 to 40 parts by weight (pbw) of conversion material based on 100 pbw of plastic material, specifically, 4 to 20 pbw of conversion material(s) to 100 pbw of plastic material.

The conversion material(s) can have a median particle size of 10 nanometers (nm) to 100 micrometers (μm), as determined by laser diffraction. The median particle size is sometimes indicated as $D_{50}$-value. The median particle size can be 1 to 30 micrometers, specifically, 5 to 25 micrometers. Examples of median particle sizes include 1 to 5 micrometers, 6 to 10 micrometers, 11 to 15 micrometers, 16 to 20 micrometers, 21 to 25 micrometers, 26 to 30 micrometers, or 31 to 100 micrometers, or larger.

The plastic composition comprising conversion material(s) can take many different shapes. For example, the plastic composition comprising the conversion material(s) can have more or fewer bends such that it is U-shaped or V-shaped, or can have different bends with different radiuses of curvature. There can be multiple bends in different locations and different embodiments the plastic composition comprising the coated conversion material(s) can take more complex compound shapes. The plastic composition comprising the conversion material(s) can be rounded or polygonal, for example, the shape can be circular, oval, rectangular, square, pentagon, hexagon, octagon, etc., and/or it can have a more complex shape such as those illustrated in U.S. Patent Publication No. 2011/0140593 to Negley et al. Examples of some more complex shapes include hyperbolic paraboloid shapes, such as doubly ruled surface shaped like a saddle. Desirably, the radius of curvature for the different sections is such that there are no facing surfaces or the number of facing surfaces is minimized. The shape is generally open when viewed from the top. It is understood that the plastic composition comprising the conversion material(s) can take many different compound shapes beyond those described above. For example, a generally open shape comprising multiple edges and surfaces with different radiuses of curvature.

A silicone-coated conversion material(s) in polycarbonate is expected to maintain melt stability with an MVR change of less than or equal to 10% (i.e., MVR is determined at 6 minutes and again at 18 minutes, and the difference between these MVRs is less than or equal to 10% of the 6 minute value).

When testing the 6 minutes (min) MVR of a plastic composition (conversion material(s) in a plastic material (e.g., polycarbonate (PC)) sample) and comparing to the 6 min MVR of the plastic material (e.g., the same plastic material without the conversion material), the addition of the conversion material(s) to plastic should change the 6 min MVR by less than or equal to 30%, specifically, less than or equal to 15%, and more specifically less than or equal to 5%. Similarly, the MVR of the 18 min dwell of the conversion material(s) plastic sample compared to the plastic material, should change by less than or equal to 30%, specifically less than or equal to 10%, and more specifically, less than or equal to 5%. It is also desirable to have a MVR change from the 6 min MVR of the conversion material(s) containing sample compared to the 18 min MVR for the same sample of less than or equal to 20%, specifically, less than or equal to 10%, and more specifically, less than or equal to 5%.

Notched Izod impact (% ductility) at 3.2 mm as determined according to ASTM D256-10 at room temperature (RT) of 23° C. and low temperature (e.g., 0° C.) can be greater than or equal to 80%, specifically, greater than or equal to 90%, and more specifically, 100%.

Lightness (L*) is expected to be greater as well as measured by CIELAB (Reflectance, with a D65 illuminant, and a 10 degree observer). Coated conversion materials will not scrub the inside of the extruder or injection molding machine. Scrubbing leads to graying of the resin and/or the final part. Any unintended color shift either due to resin yellowing or graying will lead to undesirable effects on the total luminous flux and chromaticity across the lifetime of a solid state lighting device. It is desirable to prevent the solid state lighting device from emitting different amounts of light and different colors through its life.

A stable resin system should enable higher reliability where the luminous flux and color coordinates shift is minor and allows greater lumen maintenance. Lumen maintenance may be evaluated according to IES LM-80-08 method, IES TM-21, IESNA methods or any other type of method used to determine lifetime of a solid state lighting product, but not limited to these methods.

A YAG:Ce conversion material or BOSE (boron orthosilicate) conversion material, for example, can be utilized to convert the blue light to yellow. A reddish AlInGaP LED can be included to pull yellow light from the conversion material to the black body curve. The conversion material can be arranged so that none or a minimal amount of heat from the LEDs passes into the conversion material to avoid heat degradation. The plastic composition can also be shaped to provide a uniform distribution of light from the lamp while minimizing absorption of re-emitted light. In one embodiment, the conversion material comprises YAG:Ce conversion material or BOSE conversion material and a red conversion material so that the lamp emits the desired CRI and color temperature.

The plastic composition can also have different characteristics to provide the desired emission pattern from the lamp. In some embodiments, the conversion material layer can have regions with different thickness, with the sections of greater thickness presenting more conversion material for the light to pass through. In other embodiments the article (e.g., housing) formed from the composition can have different concentrations of conversion materials in different regions. In other embodiments, the plastic composition can also have more than one conversion material mixed throughout, or can have different regions of different conversion materials. The conversion material can also have dispersing agents arranged throughout, or dispersing agents arranged in different concentrations in different regions. The plastic composition can also have regions that are substantially transparent.

Plastic compositions (e.g., polycarbonate) can be manufactured by various methods. For example, a blend of various plastic compositions, e.g. polycarbonate can be fed into the throat of a single or twin-screw extruder via a hopper. Care must be taken so as to not effectuate shear of the conversion material and should limit pressure applied to conversion materials and/polycarbonate material so as to not affect its desired properties.

The final conversion material can be used in plastic material(s) (e.g., polycarbonate or any other thermoplastic resin formulation). During the plastic material's extrusion process, the conversion material(s) can be added upstream or downstream using a side feeder. The conversion material(s) can be added to the melt alone. Optionally, the conversion material(s) can also be added directly to a blender and mixed with resin powder. The advantage of the conversion material(s) in this case is the reduction of the contacts between the abrasive conversion material(s) and the walls or the mixing elements, which reduces the graying issues in the final product and therefore leads to greater luminous flux and color quality in a solid state lighting device that produces white light.

The conversion material can first be compounded into polycarbonate with an appropriate heat stabilizer on a single screw or twin screw extruder in order to wet the surface for production (e.g., a master batch production). Multiple passes through an extruder may be necessary to fully wet the conversion material surface. Such master batches can then be added downstream or at the throat on a dedicated feeder(s) for accurate addition the final polymer formulation in an extruder. When added to the final polymer formulation, only mild distributive mixing is then used to fully disperse the conversion material(s) into the formulation. Examples of processing are further described in commonly assigned U.S. Pat. No. 6,692,659 B2 to Brown et al.

Shaped, formed, or molded articles comprising the thermoplastic compositions are also provided, according to embodiments. The thermoplastic compositions can be molded into useful shaped articles by a variety of means such as injection molding, extrusion, rotational molding, blow molding and thermoforming to form articles such as, for example, computer and business machine housings such as housings for monitors, handheld electronic device housings such as housings for cell phones, electrical connectors, and components of lighting fixtures, ornaments, home appliances, roofs, greenhouses, sun rooms, swimming pool enclosures, thin walled articles such as housing for electronic devices and the like. Additional examples of articles that can be formed from the compositions include electrical parts, such as relays, and enclosures, consumer electronics such as enclosures and parts for laptops, desktops, docking stations, personal digital assistants (PDAs), digital cameras, desktops, and telecommunications parts such as parts for base station terminals. Further examples of articles that can be formed from compositions include light guides, light guide panels, lenses, covers, sheets, films, and the like, e.g., LED lenses, LED covers, and so forth.

In one embodiment, the plastic composition or polycarbonate containing compositions and the conversion material(s) (e.g., coated conversion material(s)) can be employed in a lighting type application, e.g., as a housing for an LED light.

In a further embodiment, the LEDs in a housing formed from the plastic composition can be employed in aviation lighting, automotive lighting, (e.g., brake lamps, turn signals, headlamps, cabin lighting, and indicators), traffic signals, text and video displays and sensors, a backlight of the liquid crystal display device, control units of various products (e.g., for televisions, DVD players, radios, and other domestic appliances), and a dimmable solid state lighting device.

An article (e.g., illumination device such as a light, luminaire, signal, and so forth) can comprise a semiconductor light-emitting element, which emits light (e.g., having a peak wavelength of 370 nm to 470 nm); and a light-emitting portion comprising the composition, wherein the light-emitting portion is excited by the light emitted from the semiconductor light-emitting element to emit light.

A lighting arrangement can comprise: a radiation source configured to emit radiation having a first wavelength range; a conversion material(s) (e.g., coated conversion(s)) material configured to absorb at least a portion of said first wavelength range radiation and emit radiation having a second wavelength range; and an optical component through which at least said first wavelength range radiation passes, wherein the conversion material contained with/dispersed in the optical component.

In a further embodiment, the conversion material is surface coated.

In any of the embodiments disclosed herein, the conversion material(s) can be coated with one or more surface coatings described in this disclosure.

In a further embodiment, the lighting arrangement can further comprise a radiation source, e.g., a light emitting diode (LED) or a light pipe. For example, the lighting arrangement can comprise an LED chip comprising a gallium nitride LED.

Optionally, the radiation source can be operable to emit radiation having a wavelength of 300 nanometers (nm) to 500 nm.

The conversion material can optionally be configured to emit radiation having a wavelength of 450 nm to 700 nm. Desirably, the conversion material emits at a different wavelength than the radiation source.

The lighting arrangement can comprise an optical component (e.g., a lens) having a surface that can be convex, concave, hemispherical, spherical, hollow cylinder, a paraboloid, and planar, as well as combinations comprising at least one of the foregoing. In the various embodiments, the coated conversion material(s) can be within the surface, e.g., can be mixed within the composition that forms the optical component. Optionally, a light diffusing material can be incorporated with the plastic composition. Examples of diffusing materials include: crosslinked polymethylmethacrylate (PMMA), polytetrafluoroethylene (Teflon), and methylsesquioxane (e.g., Tospearl 120 or TSR9004). The housing can be transparent to light from the light source and the coated conversion material, or can comprise a diffusing particle or a diffusing surface to help mix the light as it passes through the housing. Optionally, portions of the housing can be diffusive, while other portions can be transparent or clear.

In an embodiment, an optical component can be for a lighting arrangement of a type comprising a radiation source configured to emit radiation having a first wavelength range. The optical component can comprise a plastic and (e.g., throughout the optical component) a coated conversion material configured to absorb at least a portion of said first wavelength range radiation and emit radiation having a second wavelength range; and said optical component being configured such that at least said first wavelength range radiation passes though the optical component. The radiation source can be a LED (e.g., light emitting diode (LED) chip or die, light emitting polymers (LEPs), polymer light emitting diodes (PLEDs), organic light emitting diodes (OLEDs), or the like) is a solid-state semiconductor device, which can convert electricity directly into light. For example, LED comprises a semiconductor chip, one side of the chip is attached to a stent, the end is negative ("n"), the other side connects to the positive ("p") terminal of the power. The whole chip can optionally be packaged (e.g., coated, encapsulated, and so forth). LEDs, e.g., in the form of an array, can be fashioned on a base (substrate or "PCB" printed circuit board) in thermal communication with a heat sink.

In other words, the semiconductor chip has two parts, one is p-type semiconductor and the other part is the n-type semiconductor. A p-n junction is formed between them when the two semiconductors are connected. An electrical path for supplying control signals to the LEDs can be provided through conductors. The conductors are electrical elements (e.g., strips) applied to a surface of an insulative layer. The insulative layer is mounted to a heat sink. The insulative layer can be a circuit board. The conductor may be any suitable electrically conductive material. Examples of electrically conductive materials include copper, aluminum, or the like, and combinations comprising at least one of the foregoing.

The current acting on the chip causes the emission of energy (e.g., in the form of photons). The wavelength of the light or the color is determined by the material of p-n junction.

Interfacial Polymerization

In accordance with embodiments, polycarbonates having enhanced optical qualities can be manufactured by an interfacial polymerization process. Although the reaction conditions for interfacial polymerization can vary, an exemplary process generally involves dissolving or dispersing a dihydric phenol reactant in aqueous caustic soda or potash, adding the resulting mixture to a water-immiscible solvent medium, and contacting the reactants with a carbonate precursor in the presence of a catalyst such as, for example, triethylamine or a phase transfer catalyst, under controlled pH conditions, e.g., 8 to 11. The most commonly used water immiscible solvents include methylene chloride, 1,2-dichloroethane, chlorobenzene, toluene, and the like.

Exemplary carbonate precursors include, for example, a carbonyl halide such as carbonyl bromide or carbonyl chloride, or a haloformate such as a bishaloformates of a dihydric phenol (e.g., the bischloroformates of bisphenol-A, hydroquinone, or the like) or a glycol (e.g., the bishaloformate of ethylene glycol, neopentyl glycol, polyethylene glycol, or the like). Combinations comprising at least one of the foregoing types of carbonate precursors can also be used. In an exemplary embodiment, an interfacial polymerization reaction to form carbonate linkages uses phosgene as a carbonate precursor, and is referred to as a phosgenation reaction.

Among the phase transfer catalysts that can be used are catalysts of the formula $(R_3)_4Q+X$, wherein each $R_3$ is the same or different, and is a $C_{1-10}$ alkyl group; Q is a nitrogen or phosphorus atom; and X is a halogen atom or a $C_{1-8}$ alkoxy group or $C_{6-18}$ aryloxy group. Exemplary phase transfer catalysts include, for example, $[CH_3(CH_2)_3]_4NX$, $[CH_3(CH_2)_3]_4PX$, $[CH_3(CH_2)_5]_4NX$, $[CH_3(CH_2)_6]_4NX$, $[CH_3(CH_2)_4]_4NX$, $CH_3[CH_3(CH_2)_3]_3NX$, and $CH_3[CH_3(CH_2)_2]_3NX$, wherein X is Cl—, Br—, a $C_{1-8}$ alkoxy group or a $C_{6-18}$ aryloxy group. An effective amount of a phase transfer catalyst can be 0.1 to 10 wt % based on the weight of bisphenol in the phosgenation mixture. In another embodiment an effective amount of phase transfer catalyst can be 0.5 to 2 wt % based on the weight of bisphenol in the phosgenation mixture.

In one embodiment, the polycarbonate encompassed by this disclosure is made by an interfacial polymerization process. One of ordinary skill in the art would be able to carry out an interfacial process without undue experimentation.

In another embodiment, the polycarbonate encompassed by this disclosure excludes the utilization of a melt polymerization process to make at least one of said polycarbonates.

Protocols may be adjusted so as to obtain a desired product within the scope of the disclosure and this can be done without undue experimentation. A desired product is in one embodiment to achieve a molded article of the composition having a transmission level higher than 90.0%, as measured by ASTM D1003, at 2.5 mm thickness and a YI lower than 1.5, as measured by ASTM D1925, with an increase in YI lower than 2 during 2000 hours of heat aging at 130° C. made by an interfacial process.

Embodiments are further illustrated by the following non-limiting example/experimentation.

EXAMPLE

In order to test the effect of process parameters on resin color, all resins were tested in a simple, fixed formulation with only 0.05% tris(di-t-butylphenyl)phosphite. Such a formulation may not give optimal results but allows differences in resin color to be observed. Granulate was molded into 2.5 mm thickness color plaques which were used for color measurements. Transmission was measured on a Gardner Dual Hazeguard according to ASTM D1003-00 as disclosed above. Yellowness Index (YI) was calculated from the absorption spectrum from a MacBeth 9000A according to ASTM D1925. Heat aging was done by placing color plaques in an oven at 130° C. Color was measured at regular intervals over a period of 5,000 hours (hrs).

It is noted that in addition to the afore-referenced heat stabilizer tris(di-t-butylphenyl)phosphite (Irgafos 168), the inventors have determined that triphenyl phosphine (TPP) and Octadecyl 3-(3,5-di-tert-butyl-4-hydroxyphenyl)propionate (Ultranxo 1076) also can be effective, according to embodiments.

PC resin was depolymerized by adding 3 ml of tetrahydrofuran and 3 milliliters (ml) of 10% w KOH in methanol to about 200 mg of resin or plastic. After shaking the solution for 60 minutes, the carbonate precipitate was dissolved by adding 3 ml glacial acetic acid. The resulting mixture was analyzed using a method similar to the one described by J. Poskrobko et al., Journal of Chromatography A., 883, 291-297 (2000), which is herein incorporated by reference. Note that the results are essentially the sum of any residual, unreacted monomer and impurities that are in the plastic and those that have reacted and have been incorporated in the chain.

BPX-1 was synthesized according to a procedure by Nowakowska et al., Polish J. Appl. Chem. X1(3), 247-254 (1996) and 9,9' Dimethyxanthene (DMX) 96% was purchased from Sigma-Aldrich and used without any further purification.

4-(4'-hydroxyphenyl)2,2,4-trimethylchroman (chroman), was prepared from the melted mixture of mesityl oxide and phenol. The mixture, containing the excess of phenol was saturated with dry hydrogen chloride and left for 48 hours at room temperature. The crude product was collected by filtration and crystallized several times from toluene.

Spiking experiments of impurities were conducted in a pilot facility for interfacial PC polymerization at 5 kg scale. Five batches were made at each setting.

RESULTS AND DISCUSSION

In an initial phase of this study samples were collected across the bisphenol-A (BPA) monomer plant, the resin plant and the finishing facility.

The BPA plant transforms phenol and acetone into BPA in an acid catalyzed process. The resulting crude mixture of BPA, Phenol and by-products is subjected to a series of purification steps to yield BPA crystals of the required purity.

In the resin plant, BPA and phosgene are reacted in the presence of water and dichloromethane (DCM) while the pH is kept high through the addition of caustic. The result is a mixture containing PC resin dissolved in DCM and brine. The organic solution goes through washing and purification steps and is dried to isolate the PC resin.

Finally the finishing plant extrudes the resin into granulates while adding additives such as heat stabilizers, colorants, UV stabilizers and the like.

A method was developed which allows impurities that are formed during BPA synthesis to be traced back during all stages of making and using the polycarbonate and derived products, according to embodiments. A mild depolymerization procedure destroys carbonate and ester linkages and restores the BPA monomer together with its impurities, which can then be analyzed. The method can be applied to plant streams, resin powder, granulate or molded products including items taken from the market for competitive analyses.

Samples were taken in such a way that monomer, resin and granulate samples would match one another, i.e. the monomer sample would be the one used to make the resin sample and the resin sample would be the material that was used in generating the plastic granulate. Twenty of such sample sets were taken. Every sample was subjected to various tests to determine metal and ion contamination levels, organic purity, polymer end groups, etc. Finally, all of the analytical results were inspected for correlation to the color and transmission of molded plaques of the granulate.

The results of this baseline study are summarized in Table 1, which lists those measured properties, which were found to give a statistically relevant correlation to YI.

Table 1 set forth below discloses sample properties correlated to yellowness index.

TABLE 1

|  | Initial color | Heat aged color |
| --- | --- | --- |
| BPA process | BPX-1, chroman, spirobisindane, BPX-2, DMX<br>BPA organic purity<br>sum of unknowns | BPX-2<br>BPA organic purity |
| Resin process | resin oligomers<br>residual [1]PCP, BPA<br>OH endgroups<br>$Cl^-$, $Na^+$, $Ca^{++}$, $Fe^{3+}$, $Ni^{++}$, $Cu^{++}$, $Zn^{++}$ | resin oligomers<br>residual PCP, BPA<br>ortho OH groups |

[1]para-cumylphenol

Table 2 set forth below shows the average percent change in organic impurities during plant processes. Only those numbers are reported which are statistically significantly different from zero in the sample set. Species which are constant along the process are not reported therein.

TABLE 2

|  | reaction | extrusion | STD molding | ABU molding | heat ageing |
| --- | --- | --- | --- | --- | --- |
| Phenol |  |  |  |  | +36 |
| IPP | +76 |  |  |  |  |
| opBPA |  |  | −11 | −11 | −8 |
| BPX-1 |  |  | −9 | −8 | −15 |
| SBI |  |  | +53 | +59 |  |
| BPX-2 |  |  | −32 | −31 |  |
| DMX |  |  |  |  | −54 |
| unknowns | −66 |  | +240 | +305 | +210 |

During reaction, the concentration of most impurities does not change. This is also not expected since all of these impurities have at least one para-substituted OH group, which will react in a similar manner as BPA and result in incorporation in the polymer backbone. Besides, if any new impurities are formed during the reaction at low temperature and high pH, it is unlikely that these will have a similar nature as those formed in an acidic environment at high temperatures. Most of the impurities being constant indicates the applicability of this method. IPP (4-isopropenyl phenol) is the only species going up during the resin reaction and unknowns are going down. The latter can be explained by the washing out of unreactive impurities during the resin cleaning steps. During extrusion no significant changes in impurity levels take place. A more significant heat input is given to the materials during molding. Both during standard and abusive molding the levels of spirobisindane (SBI) and unknowns go up.

SBI is utilized as a monomer for polycarbonates with specific optical properties and enhanced glass transition temperature. Although polymers with high levels of SBI do not have the same color stability as BPA based polycarbonate, this compound is not expected to be a significant factor in discoloration at trace levels. A considerable effort was undertaken in looking at the peaks of individual unknown species, correlating them to color and trying to identify their structure. This has not led to the identification of a color body, unfortunately. Rather than looking at what is formed during molding and heat aging, it may be interesting to look at what disappears. Both opBPA and BPX-1 are components whose concentration decreases as color increases. In earlier reports opBPA or BPX-1 have never been suspect with regard to discoloration. Their ortho OH groups have been considered mostly harmless.

Figure 3:
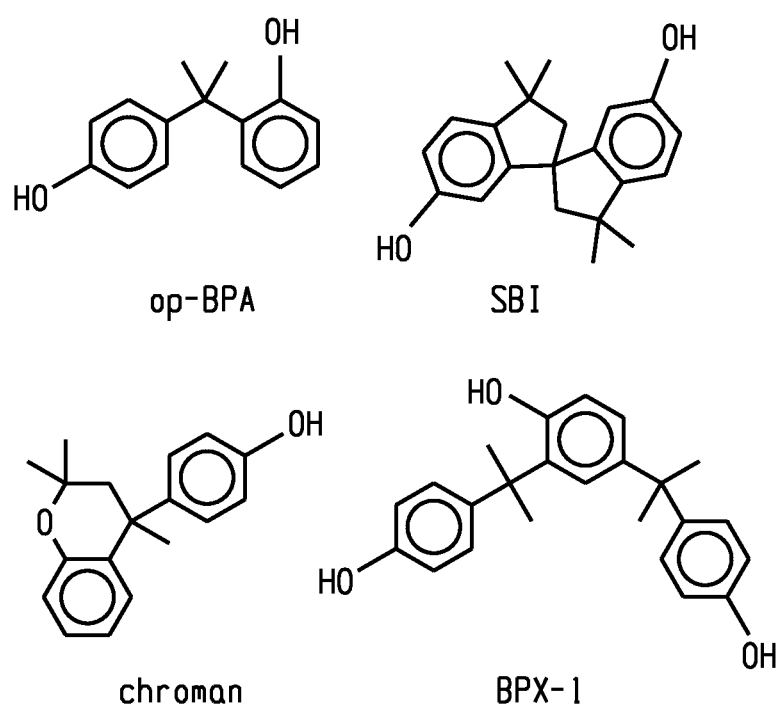
FIG. 3 is a schematic illustration of selected BPA impurities potentially related to color.

Based on the results of the correlations (Table 1), as well as the particular profiles of opBPA and BPX-1 along the process (Table 2), it was decided to run a number of polymerization experiments with specific impurities independently spiked in at various concentrations. BPX-1, chroman and DMX were synthesized and isolated for this purpose. opBPA was expected to behave in a comparable manner to BPX-1 due to the similarity of the structure (FIG. 3) and in concentration profile (Table 2) and was not tested. FIG. 3 is a schematic illustration of selected BPA impurities potentially related to color.

Figure 4:
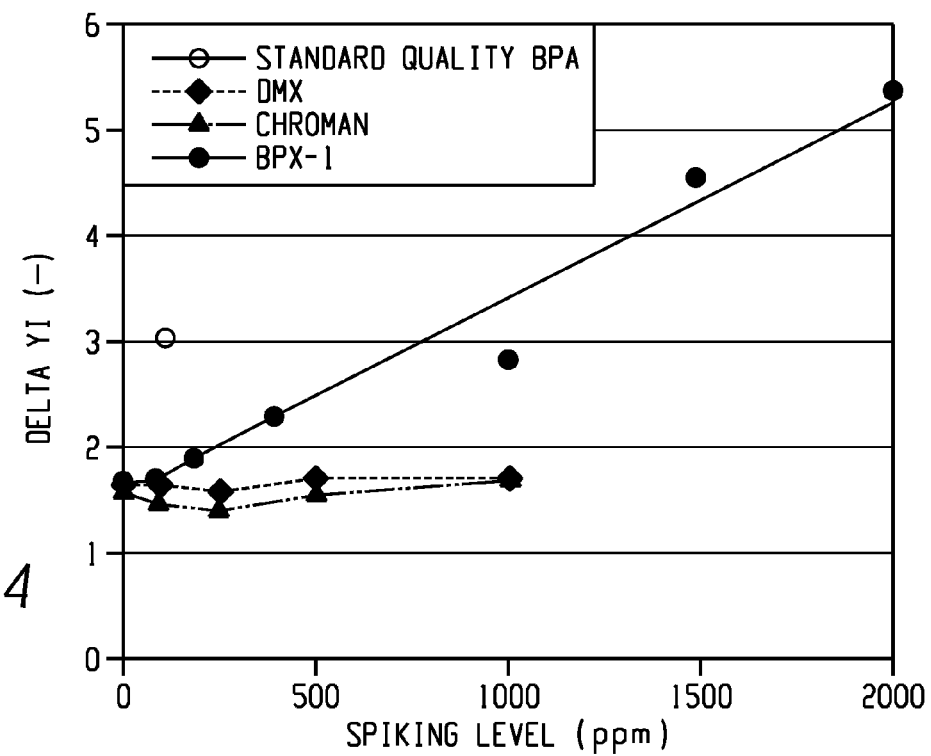
FIG. 4 is a graph depicting changes in YI after 2000 hours, heat aging at 130° C. as a function of spiking level of three different impurities (delta YI(–) versus spiking level (ppm)).

Chroman and DMX were spiked at four levels in the range of 100 to 1,000 ppm relative to BPA. BPX-1 was spiked at 5 levels in the range of 200 to 2,000 ppm. High purity BPA (99.92 wt %) was used for the polymerizations to minimize the effects of other impurities on the final color. Reference samples without any spiked impurity were generated for comparison. The initial color results had YI in the range of 1.5 to 2.0, but none of the variation was correlated to the spiked impurities. The results for the color shift upon 2,000 hours of heat aging is shown in FIG. 4. In particular, FIG. 4 shows changes in YI after 2,000 hours, heat aging at 130° C. as a function of spiking level of three different impurities (delta YI(−) versus spiking level (ppm).

The profiles for DMX and chroman are flat indicating these species are not related to color stability. However, BPX-1 clearly increases yellowness in the material after aging. This relationship between BPX-1 and color stability only holds if the BPX-1 is spiked in a fixed, high purity BPA. A data point for a sample derived from a regular quality of BPA is plotted at its BPX-1 level of 150 ppm, but clearly there are other components in this sample which further increase the discoloration. A second datapoint based on yet another BPA sample of different quality is placed at 400 ppm and δYI of 9.2, off the scale of the graph.

Figure 5:
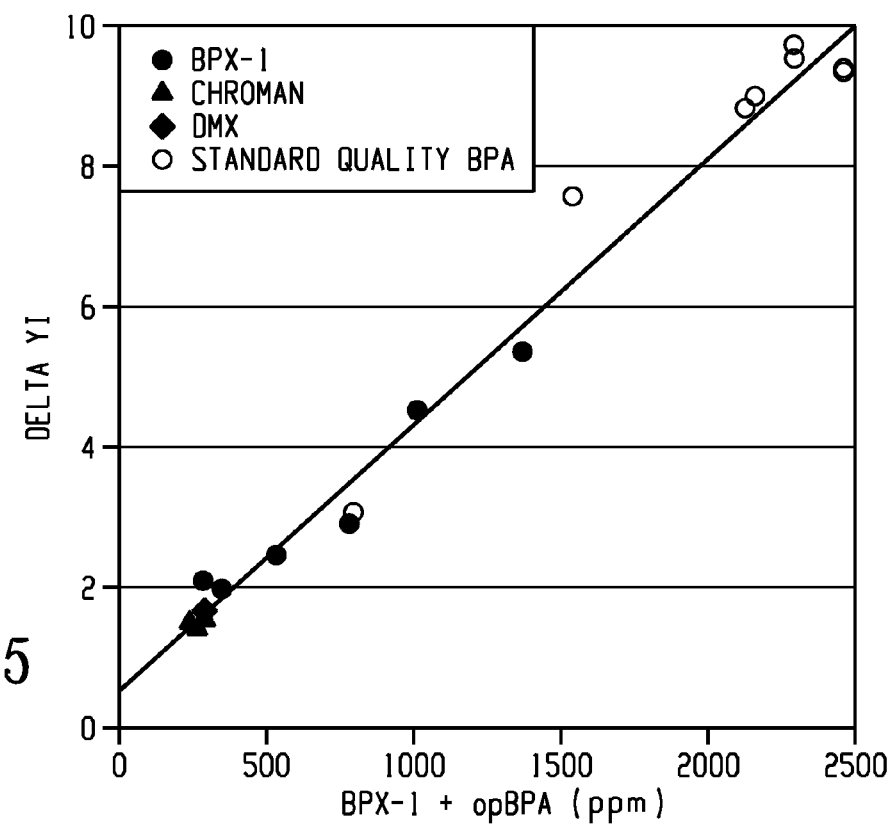
FIG. 5 is a graph depicting the change in YI after 2,000 hours, heat aging at 130° C. as a function of the summed level of BPX-1 and opBPA as determined analytically (delta YI versus BPX-1+opBPA (ppm)).

If BPX-1 degradation lies at the root of this discoloration, it can be hypothesized that a scission reaction takes places that splits the BPX-1 unit into a ppBPA unit and an IPP unit and that this IPP unit leads to colored by products. Note that these units are not present in the material in the form in which they are presented in FIG. 3, but have reacted to their carbonate equivalent in-chain units. Likewise, then, opBPA can undergo a scission reaction to give phenol and IPP. Indeed, if all datapoints are plotted as a function of the total level of opBPA and BPX-1 together, then a straight line is found (FIG. 5). FIG. 5 is a graph depicting the change in YI after 2,000 hours, heat aging at 130° C. as a function of the summed level of BPX-1 and opBPA as determined analytically (delta YI versus BPX-1+opBPA (ppm)).

Note that the standard quality BPA dataset in this plot is based on samples from three different BPA sources with varying quality levels polymerized at pilot plant and commercial scale in three different facilities. Both samples which have been spiked as well as those in which the opBPA and BPX-1 components are present as the residuals from BPA synthesis fall on the same line, which justifies the conclusion that these species lie at the origin of discoloration during heat aging and are not just correlated to discoloration in a non-causal fashion.

Interestingly, extrapolating the fitted line shows that in absence of BPX-1 and opBPA, the discoloration would be reduced to δYI 0.5, which is only a small fraction of the discoloration observed in the samples derived from regular BPA, meaning that these two components are the main contributors to discoloration.

Knowing which monomer impurities are detrimental to color stability is a good thing; the downside however is that opBPA is the most prominent impurity that is formed during BPA synthesis and not a component whose formation can be easily prevented in reaction or which is easily reduced in a selective way during in downstream purification steps. Therefore, improving the purification steps for BPA in a general sense proves the more cost effective way of improving resin color stability.

Figure 6:
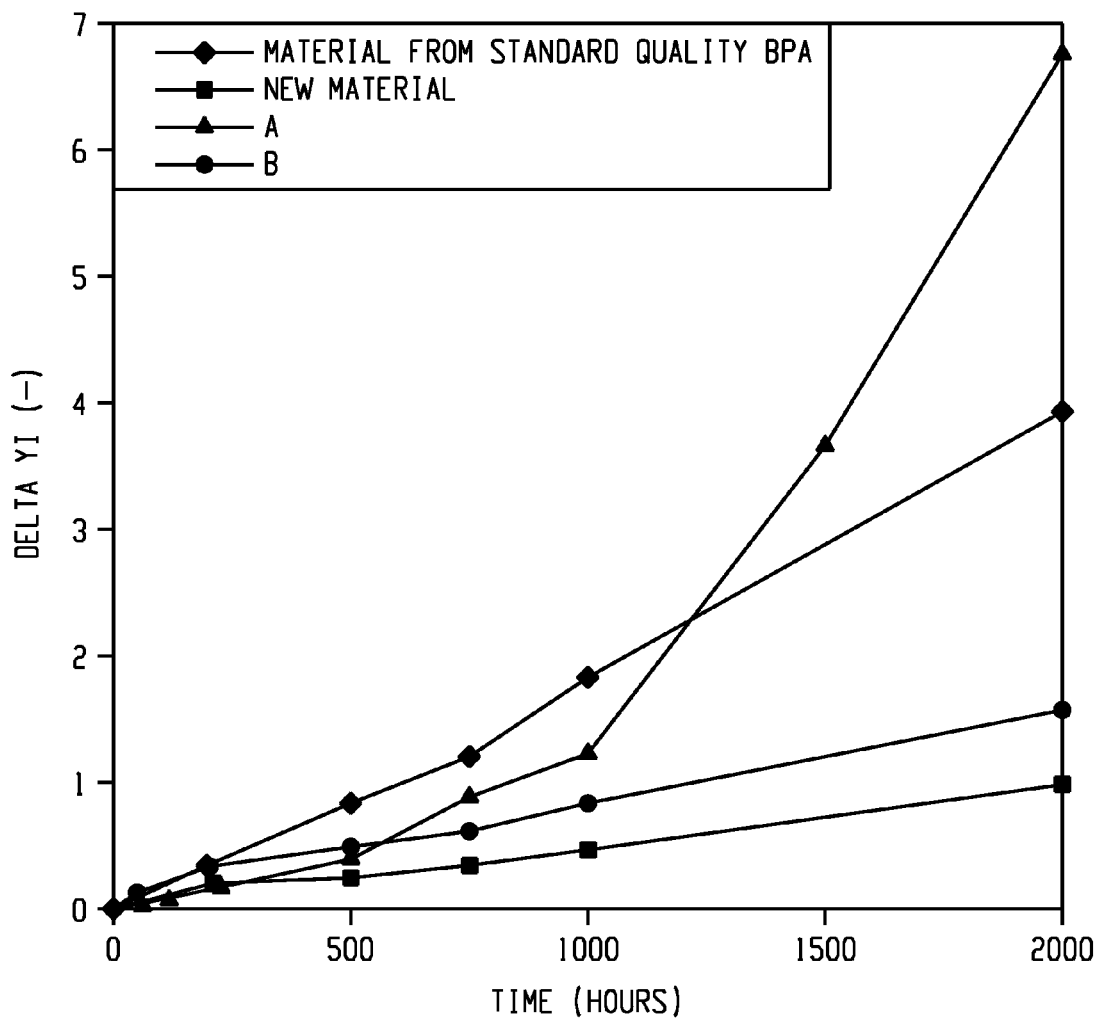
FIG. 6 is a graph depicting implementation of the described process improvements combined with an optimized formulation improved the polycarbonate (PC) grade beyond comparison performance (delta YI(–) versus time (hours)).

Besides this work on BPA impurities, further efforts were undertaken to work on the overall resin manufacturing process parameters (Table 1) and on formulation and compounding aspects to produce the final granulated product. The advantages of this combined approach become apparent in FIG. 6. FIG. 6 is a graph depicting implementation of the described process improvements combined with an optimized formulation improved the PC grade (delta YI(−) versus time (hours)).

Improving the manufacturing processes leads to a more sustainable performance gain than what can be achieved through color stabilizing and compensating additives alone. Additives may lose their effectiveness over time as can be seen in the product of 'A', that suddenly develops color in an accelerated way after 1,000 hours (hrs) of aging. Both our materials as well as the product of 'B' exhibit a predictable aging behavior and with the improvements that we have implemented, our PC products offer state of the art performance.

It has been shown that the major source of color instability lies as early in the manufacturing process as during monomer synthesis. The combined efforts of process improvement and product development have led to products which combine a high light transmission, low color and excellent retention of these properties in heat aging which makes them well suited for applications in which long lifetimes are required such as LED bulbs and lenses and those in which long path lengths are used such as lightguides.

It is noted that the afore-described experimental results regarding LEXAN™ polycarbonate is particularly advantageous in that LEXAN™ polycarbonate has excellent mechanical properties, which combined with its inherent transparency, make it the material of choice for lighting applications such as lenses, lightguides and bulbs, as well as construction of roofing, greenhouses, verandas, and so forth. With the advent of LED technology, the functional lifetime of lighting products has increased impressively and will further expand in the years to come. Also, in construction application, durability is important. Plastics will age, however, under the influence of heat, light and time, causing reduced light transmission and color changes. The inventors have herein addressed the above concerns and others, according to embodiments, to explain the factors such as BPA purity level, sulfur level, hydroxy level, type of process employed (interfacial) that can determine the optical material performance. The inventors have advantageously determined how optimization of such parameters during monomer and resin production can lead to further enhancement of color and color stability of the resulting plastic.

As further shown in Table 3, the polymerization type and BPA purity can dictate heat aging color stability. Table 3 depicts YI (2000 hours, 130° C. and BPA purity (%)). A higher purity BPA can lead to 85% reduction of discoloration.

TABLE 3

| resin process | BPA organic purity | YI (2000 hrs @ 130° C.) |
| --- | --- | --- |
| Interfacial | 99.45 | 13.3 |
| Interfacial | 99.51 | 13.0 |
| Interfacial | 99.63 | 10.7 |
| Interfacial | 99.78 | 7.3 |
| Melt | 99.78 | 15.5 |
| Melt | 99.77 | 16.1 |
| Melt | 99.78 | 19.1 |

Figure 7:
FIG. 7 is an exemplary chemical formula illustrating the formation of BPA.
Figure 8:
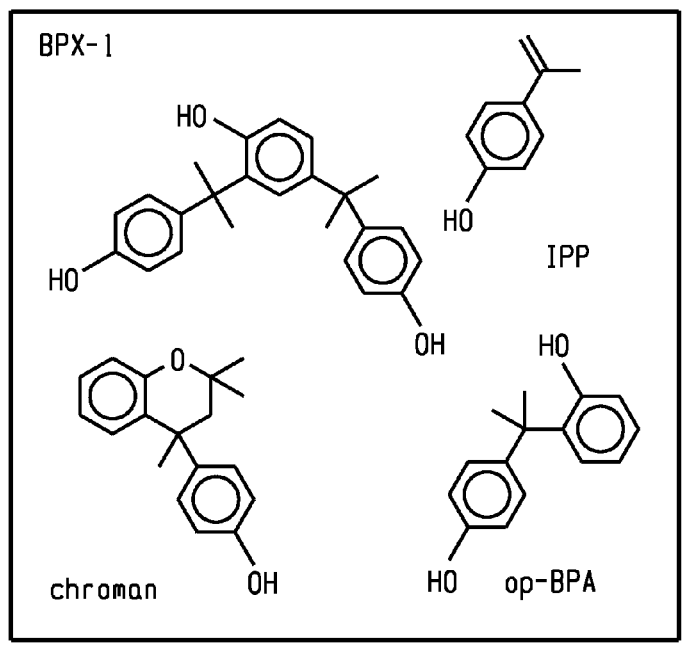
FIG. 8 is an example of an exemplary bound catalyst (attached to an insoluble resin for the reduction of sulfur in BPA).

FIG. 7 is an exemplary chemical formula illustrating the formation of BPA; the reaction is catalyzed through either a soluble organic thiol containing acidic compound (referred to as 'old catalyst' or a insoluble resin with acidic and thiol functionality which is insoluble in BPA and the reaction mixture of BPA synthesis).

The catalyst can be attached to an insoluble resin for the reduction of sulfur in BPA, e.g., down to less than 0.5 ppm, which resulted in a significant reduction in YI (e.g., from greater than 1.4, specifically up to 1.8, down to less than 1.4 and even down to 1.2).

Figure 9:
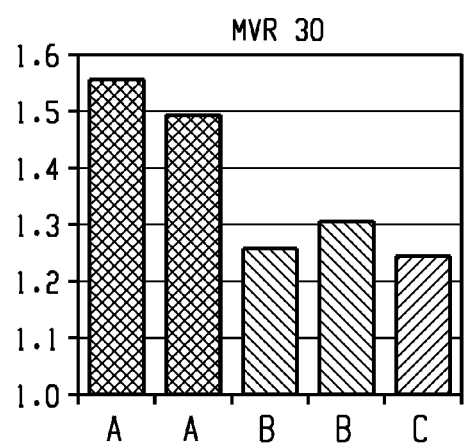
FIG. 9 is a bar graph comparing the yellowness index (YI) for an exemplary polycarbonate (LEXAN™ polycarbonate grade PC175 having a melt volume rate of 30) with the bulk catalyst ("A"), the attached catalyst ("B"), and with the attached catalyst and a BPA purity of 99.65 wt %.

FIG. 9 is a bar graph comparing the yellowness index (YI) for an exemplary polycarbonate (LEXAN™ polycarbonate grade PC175 having a melt volume rate of 30) with the bulk catalyst (bars "A"), the attached catalyst (bars "B"), and with the attached catalyst and a BPA purity of 99.65 wt % (bar "C").

Figure 10:
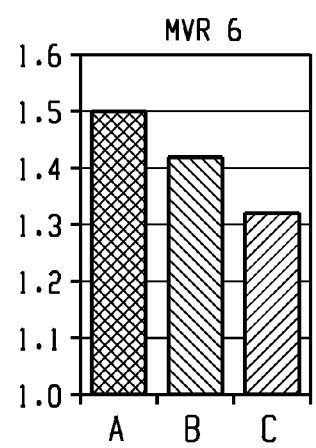
FIG. 10 is a bar graph comparing the yellowness index (YI) for an exemplary polycarbonate (LEXAN™ polycarbonate grade PC105 having a melt volume rate of 6) with the bulk catalyst ("A"), the attached catalyst ("B"), and with the attached catalyst and a BPA purity of 99.65 wt % (also referred to as "new BPA").

FIG. 10 is a bar graph comparing the yellowness index (YI) for an exemplary polycarbonate (LEXAN™ polycarbonate grade PC105 having a melt volume rate of 6) with the bulk catalyst (bars "A"), the attached catalyst (bars "B"), and with the attached catalyst and a BPA purity of 99.65 wt % (bars "C").

Figure 11:
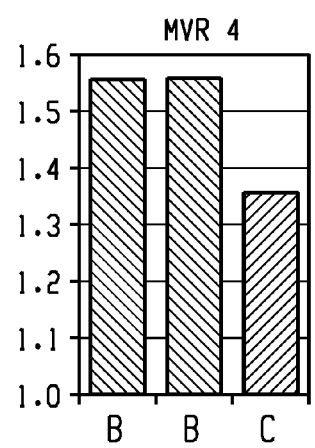
FIG. 11 is a bar graph comparing the yellowness index (YI) for an exemplary polycarbonate (LEXAN™ polycarbonate grade PC135 having a melt volume rate of 4) with the attached catalyst ("B"), and with the attached catalyst and a BPA purity of 99.65 wt %.

FIG. 11 shows a comparison of the yellowness index (YI) for an exemplary polycarbonate (LEXAN™ polycarbonate grade PC135 having a melt volume rate of 4) with the attached catalyst (bars "B"), and with the attached catalyst and a BPA purity of 99.65 wt % (bars "C").

Figure 12:
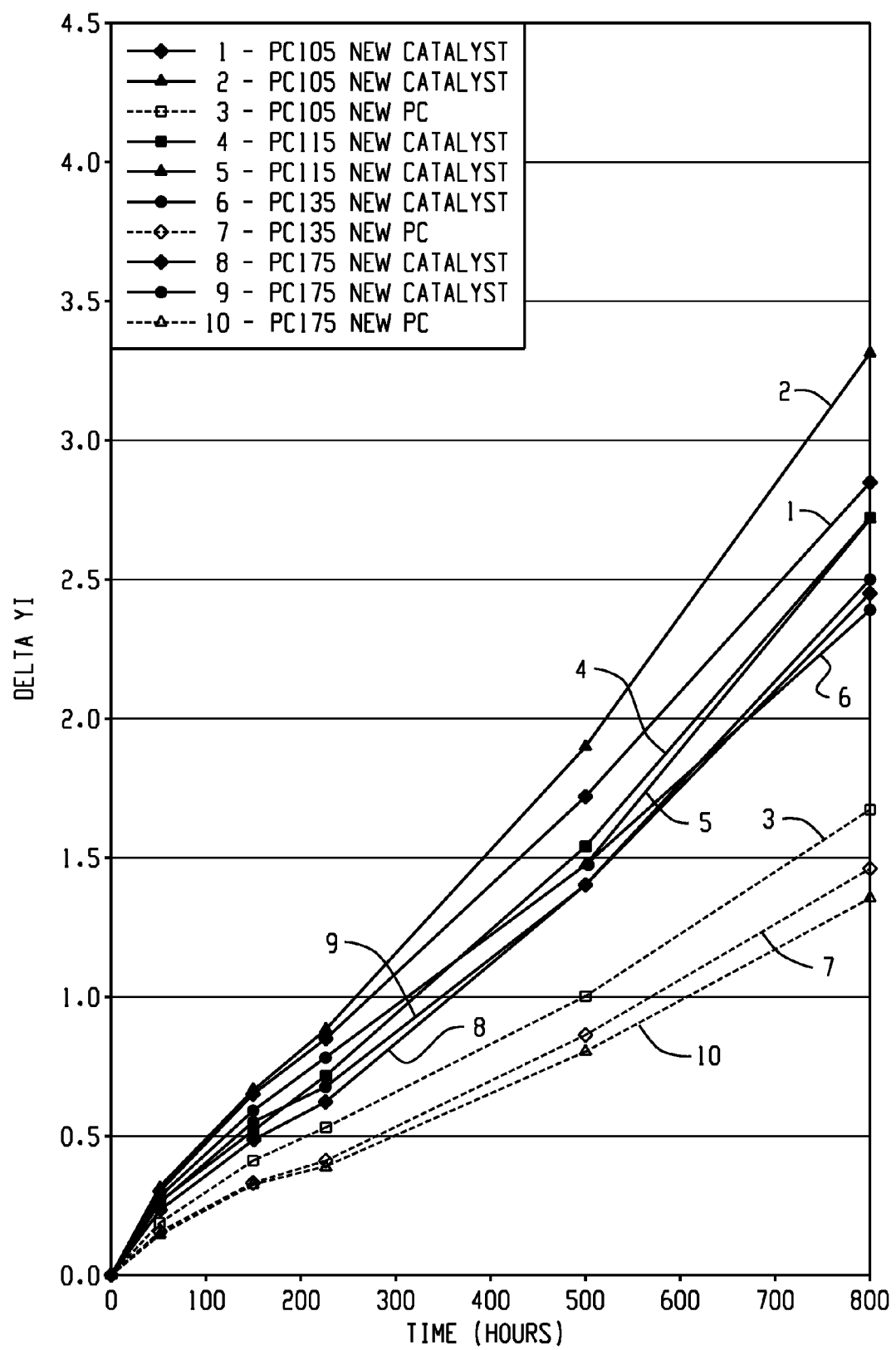
FIG. 12 is a graphical illustration of change in yellowness index (YI) over time for various grades of LEXAN™ polycarbonate formed with the new catalyst or with the new BPA using a free hydroxyl concentration of less than 150 ppm.
Figure 13:
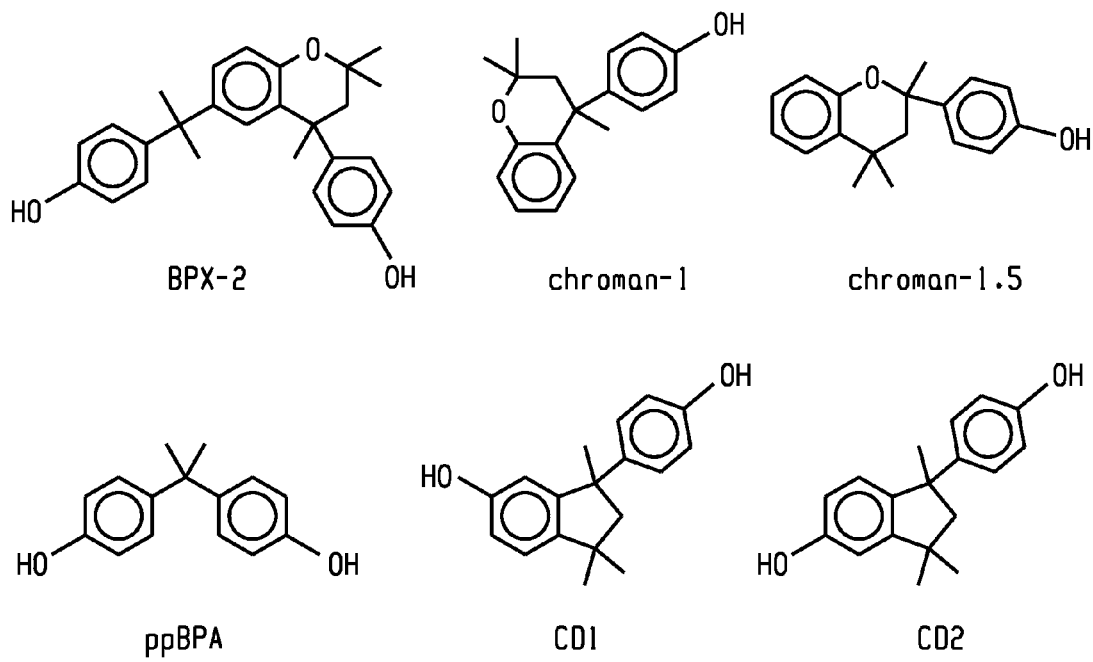
FIG. 13 is various chemical structures for materials discussed herein.
Figure 13:
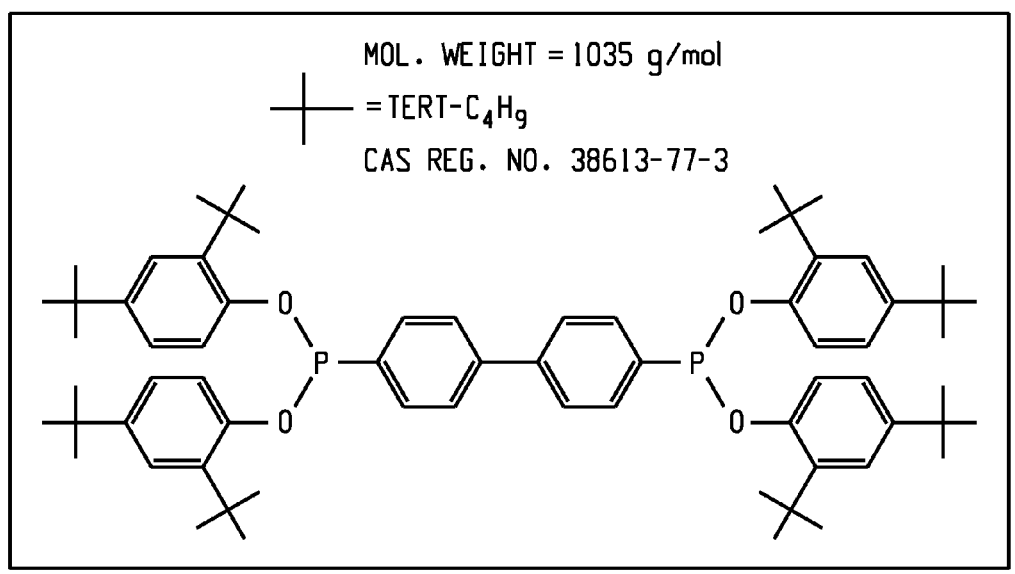

FIG. 12 is a graphical illustration of change in YI over time for various grades of LEXAN™ polycarbonate formed with the new catalyst or with the new BPA using a free hydroxyl concentration of less than 150 ppm.

Table 4 shows various formulations tested.

TABLE 4

| | initial YI | HA YI** | hydrolytic stability | MVR change |
| --- | --- | --- | --- | --- |
| [1]Irgafos 168 | + | + | + | + |
| [2]Doverphos | + | + | − | + |
| [3]PEPQ | + | O | − | + |
| [4]Ultranox 626 | + | + | − | + |
| [5]TNPP | + | −− | − | + |
| [6]TPP | ++ | O | + | + |
| H3PO3 | − | −− | −− | + |
| [7]DPDP | + | −− | −− | + |
| [8]Ultranox 1076* | + | + | O | + |
| [9]Ultranox 1010* | + | − | + | + |
| [10]HALS 770* | − | −− | − | + |
| [11]PAO* | − | −− | + | + |

[1]Tris (2,4-di-tert-butylphenyl)phosphite
[2]Dioleyl hydrogen phosphite commercially available from Dover Chemical, Dover, OH
[3]4-[4-bis(2,4-ditert-butylphenoxy)phosphanylphenyl]
[4]bis(2,4-di-ti-butylphenyl) pentaerythritol diphosphite commercially available from Chemtura Corporation, Middlebury, CT
[5]tris(nonylphenyl)phosphite
[6]triphenyl phosphine
[7]diphenyl isodecyl phosphite
[8]octadecyl3(3,5ditertbutyl4hydroxyphenyl)propionate commercially available from Chemtura Corporation
[9]pentaerythritol-tetrakis(3-(3,5-di-tert•butyl-4-hydroxy-phenyl-)propionate) commercially available from Chemtura Corporation
[10]bis(2,2,6,6-tetramethyl-4-piperidyl) sebacate
[11]phenolic antioxidant = N,N-hexane-1,6-diylbis[3-(3,5-di-tert-butyl-4-hydroxyphenylpropionamide)]
*tested in combination with 500 ppm Irgafos 168
**based upon 750 hours at 130° C.

Resin was compounded with various heat stabilizers at two different levels each. The dependency of initial color, color stability in heat aging and hydrolitic stability (molar mass stability in autoclaving) on additive concentration was evaluated and rated quantitatively as ++ (highly desirable), + (desirable), O (neutral), − (undesirable), −− (highly undesirable).

As noted above, HPLC (high performance liquid chromatography or high pressure liquid chromatography) can be used to determine BPA purity. Set forth below are further details, according to embodiments.

Sample Preparation:

About 200 milligrams (mg) of the sample is weighed accurately. It is dissolved in 5 ml of tetrahydrofuran (THF) and 2 ml of a 10% solution of potassium hydroxide diluted in methanol. The depolymerization of polycarbonate is carried out with the use of these solvents.

The solution is shaken for 2 hours. Then, 2 milliliters (ml) of acetic acid are added to protonate the BPA carbonate salts and decrease the pH. The solution is shaken again for half an hour for homogenization and dissolution of all precipitates.

Standard Sample Preparation:

These samples containing only one impurity determine the retention time and the calibration coefficient of each impurity. The impurity is dissolved in 10 ml of methanol. The mass is calculated in order to obtain a concentration in vial between 50 and 100 ppm. One ml of this solution is taken and diluted in 10 ml of methanol.

All the different solutions are put in vials by the aid of a syringe with a filter. For both impurities and samples, a blank is made in order to explain a strange peak or a problem in the solvent. The blank has the same solvent composition as the sample. It means that for the standard sample the blank contains only methanol. For the samples, the blank corresponds to a mix of 5 ml of THF, 2 ml of Methanol and 2 ml of Acetic Acid.

Experiments:

The device used for the HPLC analysis is an Agilent 1100 system. The software used is Agilent ChemStation. The analysis is carried out on a C18 column. A gradient of polar solvents is used. It is a mixture of water and methanol. THF is used at the end of the analysis to clean the column. Table 5 sets forth the solvent gradient profile.

TABLE 5

| Time (min) | H$_2$O + 0.1% H$_3$PO$_3$ (%) | MeOH (%) | THF (%) |
|---|---|---|---|
| 7 | 60 | 40 | 0 |
| 31 | 10 | 90 | 0 |
| 33 | 0 | 60 | 40 |
| 34 | 0 | 60 | 40 |
| 35 | 60 | 40 | 0 |
| 44 | 60 | 40 | 0 |

The applied flow is 1.2 milliliters per minute (ml/min) The output is recorded as a series of peaks, each one representing a compound. All peaks are integrated on the chromatogram to obtain the peak area. For all impurities except for DMX, the integration is done at 280 nm. For the DMX, the integration is performed at 254 nm because the peak is more visible. To identify each peak, the retention time can be used but with caution because in function of the conditions the retention time can change (pressure, solvent, column, temperature . . . ). Table 6 summarizes the different studied impurities (impurities contained in PC with their corresponding retention times).

TABLE 6

| Impurity | Retention time (min) |
|---|---|
| Phenol | 2.44 |
| IPP | 7.49 |
| ppBPA | 10.69 |
| opBPA | 14.66 |
| 1CD2 | 17.32 |
| $^2$CD1 | 18.49 |
| PCP | 18.98 |
| BPX 1 | 20.20 |
| Chroman 1 | 20.66 |
| Chroman 1,5 | 22.49 |
| SBI | 23.38 |
| BPX 2 | 24.11 |
| DMX (254 nm) | 24.58 |

$^1$cyclic dimer-2, a1H-Inden-5-ol, 2,3-dihydro-1-(4-hydroxyphenyl)-1,3,3-trimethyl-
$^2$a cyclic dimer of isopropenylphenol 1H-Inden-5-ol, 2,3-dihydro-3-(4-hydroxyphenyl)-1,1,3-trimethyl- Determination of the Impurities Concentration in Polycarbonate:

The impurities concentration in polycarbonate is found from the chromatograms analysis. Then, the BPA purity can be deduced. Using the area corresponding to the retention time for impurities, the impurities concentration in the vial can be calculated. For that, the area of each peak is multiplied by 1,000 to obtain a concentration in milligrams per liter (mg/L) of each impurity in the vial. Then, it is divided by each impurity calibration coefficient.

$$\text{concentration of impurity (vial)} = \frac{\text{peak area} * 100}{\text{calibration coefficient}}$$

From the accurate amount weighted at the beginning for each sample, the initial concentration of the vial is calculated in mg/L.

The concentration of impurities in polycarbonate is determined by multiplying the concentration of impurities in the vial by 1,000,000 in order to convert the concentration in ppm. Then, this result is divided by the concentration of the sample.

$$\text{concentration of impurity (PC)} = \frac{\text{concentration of impurity (vial)} * 1000000}{\text{sample concentration}}$$

Determination of the Impurities Weight Percentage in PC:

The areas of unknown peaks that appear before the DMX peak are summed. The concentration of unknowns is determined by using the BPX-2 coefficient. The use of this coefficient was chosen arbitrarily. All the concentrations of known and unknown impurities (except BPA, phenol and PCP) are added. The concentration found in parts per million (ppm) is transformed to wt % by dividing by 10,000. Like that, the wt % of impurities is found in the resin.

$$\text{wt \% of impurities} = \frac{\sum \text{Concentration of impurities}}{10000}$$

BPA Purity Determination:

After, a coefficient is applied to determine the wt % of impurities in BPA. The samples are weighted before depolymerization. The BPA molar mass is different from the carbonated BPA. For that, we multiply by 254 grams per mole (g/mol) and divide by 228 g/mol. 254 g/mol corresponds to the resin molar mass and the BPA molar mass is equal to 228 g/mol.

$$\text{wt \% of impurities in } BPA = \frac{\text{wt \% of impurities} * 254}{228}$$

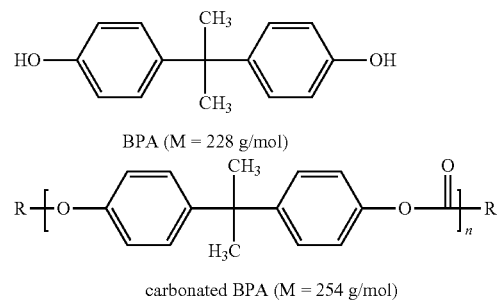

BPA (M = 228 g/mol)

carbonated BPA (M = 254 g/mol)

The BPA purity is determined by subtracting the wt % of impurities in initial BPA from 100. BPA purity=100%−wt of impurities in BPA.

Set forth below are some examples of the composition and device disclosed herein.

Embodiment 1

A polycarbonate composition comprising: bisphenol-A polycarbonate, wherein a molded article of the bisphenol-A polycarbonate has transmission level greater than or equal to 90.0% at 2.5 mm thickness as measured by ASTM D1003-00 and a yellow index (YI) less than or equal to 1.5 as measured by ASTM D1925.

Embodiment 2

The composition as in Embodiment 1, wherein the bisphenol-A polycarbonate comprises less than or equal to 150 ppm free hydroxyl groups.

Embodiment 3

The composition as in any of the preceding Embodiments, wherein the bisphenol-A polycarbonate comprises sulfur in an amount less than or equal to 2 ppm sulfur.

Embodiment 4

The composition as in any of the preceding Embodiments, wherein the molded article comprises an increase in yellow index (YI) of less than 2 during 2,000 hours of heat aging at 130° C.

Embodiment 5

The composition as in any of the preceding Embodiments, wherein the bisphenol-A polycarbonate is an interfacially polymerized polycarbonate.

Embodiment 6

The composition as in any of the preceding Embodiments, wherein the composition comprises a flame retardant.

Embodiment 7

The composition as in any of the preceding Embodiments, further comprising a second polycarbonate derived from bisphenol-A, wherein the second polycarbonate is different than the bisphenol-A polycarbonate.

Embodiment 8

The composition as in Embodiment 7, further comprising a second polycarbonate, wherein the second polycarbonate is selected from at least one of the following: a homopolycarbonate derived from a bisphenol; a copolycarbonate derived from more than on bisphenol; and a copolymer derived from one or more bisphenols and comprising one or more aliphatic ester units or aromatic ester units or siloxane units.

Embodiment 9

The composition as in any of the preceding Embodiments, further comprising one or more additives selected from at least one of the following: UV stabilizing additives, thermal stabilizing additives, mold release agents, colorants, organic fillers, inorganic fillers, and gamma-stabilizing agents.

Embodiment 10

A light emitting device, comprising: a lighting element located in a housing, wherein the housing is formed from a plastic composition comprising: the polycarbonate composition of Embodiments 1-9; and a conversion material, wherein the conversion material comprises yttrium aluminum garnet (YAG) doped with a rare earth element, terbium aluminum garnet doped with a rare earth element, silicate (BOSE) doped with a rare earth element; nitrido silicates doped with a rare earth element; nitride orthosilicate doped with a rare earth element, oxonitridoaluminosilicates doped with a rare earth element, and combinations comprising at least one of the foregoing; wherein after the conversion material has been exposed to an excitation source, the conversion material has a luminescence lifetime of less than 1-4 seconds when the excitation source is removed.

Embodiment 11

A plastic molded device, wherein the molded device is formed from the plastic composition comprising the polycarbonate composition of Embodiments 1-9; and a conversion material, wherein the conversion material comprises yttrium aluminum garnet (YAG) doped with a rare earth element, terbium aluminum garnet doped with a rare earth element, silicate (BOSE) doped with a rare earth element; nitrido silicates doped with a rare earth element; nitride orthosilicate doped with a rare earth element, oxonitridoaluminosilicates doped with a rare earth element, and combinations comprising at least one of the foregoing; wherein after the conversion material has been exposed to an excitation source, the conversion material has a luminescence lifetime of less than $10^4$ seconds when the excitation source is removed.

Embodiment 12

A light emitting device, comprising: a radiation source; and an emitting portion in optical communication with the radiation source, wherein the emitting portion is formed from a plastic composition, wherein the plastic composition comprises: the polycarbonate composition of Embodiments 1-9; a conversion material, wherein the conversion material comprises yttrium aluminum garnet (YAG) doped with a rare earth element, terbium aluminum garnet doped with a rare earth element, silicate (BOSE) doped with a rare earth element; nitrido silicates doped with a rare earth element; nitride orthosilicate doped with a rare earth element, oxonitridoaluminosilicates doped with a rare earth element, and combinations comprising at least one of the foregoing; wherein after the conversion material has been exposed to an excitation source, the conversion material has a luminescence lifetime of less than $10^{-4}$ seconds when the excitation source is removed.

Embodiment 13

A lighting device, comprising: a radiation source configured to emit radiation having a first wavelength range; an optical component comprising the plastic composition comprising: the polycarbonate composition of Embodiments 1-9; and a conversion material, wherein the conversion material comprises yttrium aluminum garnet (YAG) doped with a rare earth element, terbium aluminum garnet doped with a rare earth element, silicate (BOSE) doped with a rare earth element; nitrido silicates doped with a rare earth element; nitride orthosilicate doped with a rare earth element, oxonitridoaluminosilicates doped with a rare earth element, and combinations comprising at least one of the foregoing; wherein the conversion material is configured to absorb at least a portion of the first wavelength range radiation and emit radiation having a second wavelength range; wherein the optical component is configured such that at least the first wavelength range radiation passes though the optical component; and wherein after the conversion material has been exposed to an excitation source, the conversion material has a luminescence lifetime of less than $10^{-4}$ seconds when the excitation source is removed.

Embodiment 14

The device of any of Embodiments 1-13, wherein the conversion material is coated with 0.05 wt % to 20 wt % silicone oil based upon the weight of the conversion material and silicone oil.

Embodiment 15

The device of any of Embodiments 1-14, wherein the plastic composition comprises 0.1 to 40 pbw of the conversion material based on 100 pbw of polycarbonate composition.

Embodiment 16

The device of any of Embodiments 1-15, wherein the plastic composition comprises 4 to 20 pbw of the conversion material based on 100 pbw of polycarbonate composition.

Embodiment 17

The device of any of Embodiments 10-16, wherein the plastic composition has a 6 min MVR that is less than or equal to 30% greater than a polycarbonate composition 6 min MVR.

Embodiment 18

The device of any of Embodiments 10-17, wherein the plastic composition, after extrusion, has a 6 minute dwell time MVR and an 18 minute dwell time MVR, and wherein a difference between the 6 minute dwell time MVR and the 18 minute dwell time MVR is less than or equal to 30% of the 6 minute dwell time MVR.

Embodiment 19

The device of Embodiment 18, wherein the plastic composition has a 6 min MVR that is less than or equal to 5% greater than a polycarbonate composition 6 min MVR.

Embodiment 20

The device of any of Embodiments 10-19, wherein the plastic composition further comprises greater than 0 to 1 pbw particles, based upon 100 pbw of polycarbonate composition, wherein the particles are selected from at least one of the following scattering particles, interference particles, and color absorbing particles.

Embodiment 21

The device of any of Embodiments 10-20, wherein the plastic composition comprises 0.001 pbw to 0.3 pbw scattering particles, based upon 100 pbw of polycarbonate composition.

Embodiment 22

The device of Embodiments 1-21, wherein the conversion material comprises a luminescent material having the formula: $(A^3)_2SiO_4:Eu^{2+}D^1$
wherein $A^3$ is a divalent metal selected from at least one of the following Sr, Ca, Ba, Mg, Zn, Cd, and combinations comprising at least one of the foregoing; and $D^1$ is a dopant selected from at least one of the following F, Cl, Br, I, P, S and N and combinations comprising at least one of the foregoing.

Embodiment 23

The device of Embodiments 10-22, wherein the conversion material comprises a luminescent material having formula:

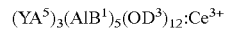

$(YA^5)_3(AlB^1)_5(OD^3)_{12}:Ce^{3+}$ where $A^5$ is a trivalent metal selected from at least one of the following Gd, Tb, La, Sm, luminescence, or a divalent metal ion selected from Sr, Ca, Ba, Mg, Zn and Cd, and combinations comprising at least one of the foregoing; $B^1$ is selected from at least one of the following Si, B, P, and Ga, and combinations comprising at least one of the foregoing; and $D^3$ is a dopant selected from F, Cl, Br, I, P, S, and N, and combinations comprising at least one of the foregoing.

Embodiment 24

The device of Embodiments 10-23, wherein the conversion material comprises an orange-red silicate-based conversion material having formula:

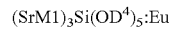

$(SrM1)_3Si(OD^4)_5:Eu$ wherein M1 is selected from at least one of the following Ba, Ca, Mg, Zn, and combinations comprising at least one of the foregoing; and $D^4$ is selected from F, Cl, S, N, and combinations comprising at least one of the foregoing.

Embodiment 25

The device of Embodiments 10-24, wherein the conversion material comprises an $Eu^{2+}$ and/or $Dy^{3+}$ doped conversion material having formula:

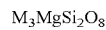

$M_3MgSi_2O_8$ wherein M is selected from at least one of the following Ca, Sr, Ba, and combinations comprising at least one of the foregoing.

Embodiment 26

The device of Embodiments 10-25, wherein the conversion material comprises a rare earth doped a red silicon nitride based conversion material having a formula:

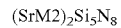

$(SrM2)_2Si_5N_8$ wherein M2 is selected from at least one of the following Sr, Ca, Mg, Zn, and combinations comprising at least one of the foregoing.

Embodiment 27

The device of Embodiments 10-26, wherein the conversion material comprises a rare earth doped a red sulfate based conversion material having formula:

$(SrM3)S$ wherein M3 is selected from at least one of the following Ca, Ba, Mg, and combinations comprising at least one of the foregoing.

Embodiment 28

The device of Embodiments 10-27, wherein the conversion material is a green sulfate based conversion material having formula:

(SrM3)(GaM4)$_2$S$_4$:Eu wherein M3 is selected from at least one of the following Ca, Ba, Mg, and combinations comprising at least one of the foregoing; and M4 is selected from at least one of the following Al and In, and combinations comprising at least one of the foregoing.

Embodiment 29

The device of Embodiments 10-21, wherein the conversion material is selected from at least one of the following: a strontium silicate yellow conversion material; yttrium aluminum garnet doped with rare earth element; terbium aluminum garnet doped with a rare earth element; silicate conversion materials; nitride conversion materials; nitrido silicates; nitride orthosilicate; oxonitridoaluminosilicates; and combinations comprising at least one of the foregoing.

Embodiment 30

The device of Embodiments 10-21, wherein the conversion material is a selected from at least one of the following: combinations of yellow conversion material with a red conversion material; combinations of green and red conversion material; a semiconductor nanocrystals of cadmium sulfide mixed with manganese; and combinations comprising at least one of the foregoing.

Embodiment 31

The device of Embodiments 10-30, wherein the conversion material comprises a silicone oil coating.

Embodiment 32

The device of Embodiment 31, wherein the silicone oil is selected from at least one of the following: hydrogen-alkyl siloxane oil; polydialkyl siloxane oil; polydimethyl siloxane codiphenyl siloxane, dihydroxy terminated, and combinations comprising at least one of the foregoing.

Embodiment 33

The device of Embodiments 10-30, wherein the conversion material comprises an amorphous silica coating.

Embodiment 34

The device of Embodiments 10-33, wherein the polycarbonate composition is selected from at least one of the following a polycarbonate, polyethylene terephthalate, polybutylene terephthalate, polymethyl methacrylate, polyamide, and combinations comprising at least one of the foregoing.

Embodiment 35

The device of Embodiments 10-34, wherein the molded device, housing, optical component, and/or emitting portion, has a transparency of greater than or equal to 30% measured according to ASTM D100-00, Procedure B, illuminant C, on a spectrophotometer, at a thickness of 1.04 mm.

Embodiment 36

The device of Embodiments 10-35, wherein the plastic composition further comprises a light diffusing material selected from crosslinked polymethylmethacrylate (PMMA), polytetrafluoroethylene, and methylsesquioxane, and combinations comprising at least one of the foregoing.

Embodiment 37

The device of Embodiments 10-36, wherein the plastic composition comprises polycarbonate having a repeating structural background of the following formula

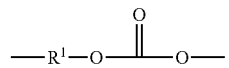

wherein greater than or equal to 60 percent of the total number of R$_1$ groups contain aromatic organic groups and the balance thereof are aliphatic, alicyclic, or aromatic groups.

Embodiment 38

The device of Embodiments 10-37, wherein the polycarbonate composition comprises polycarbonate having a glass transition temperature of greater than 170° C. as measured using a differential scanning calorimetry method, wherein the polycarbonate is derived from:
a monomer having the structure

HO-A$_1$-Y$_1$-A$_2$-OH wherein each of A$_1$ and A$_2$ comprise a monocyclic divalent arylene group, and Y$_1$ is a bridging group; or
polyester monomer units having the structure

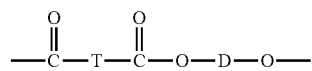

wherein D comprises an alkyl containing C$_6$-C$_{20}$ aromatic group, or a C$_6$-C$_{20}$ aromatic group, and T comprises a C$_6$-C$_{20}$ aromatic group.

Embodiment 39

The device of Embodiment 38, wherein carbonate units of the polycarbonate are derived from a monomer selected from 3,3-bis(4-hydroxyphenyl)-2-phenylisoindolin-1-one (PP-PBP), 1,1-bis(4-hydroxyphenyl)-1-phenyl-ethane(Bisphenol-AP), and 1,1-bis(4-hydroxyphenyl)-3,3,5-trimethyl-cyclohexane (Bisphenol-TMC), adamantyl containing aromatic dihydroxy compound, fluorene containing aromatic dihydroxy compound, 3,3-bis(4-hydroxyphenyl)-2-methylisoindolin-1-one, and combinations comprising at least one of the foregoing.

Embodiment 40

The device of Embodiments 38 or 39, wherein the polycarbonate further comprises carbonate units derived from 2,2-bis(4-hydroxyphenyl)propane (Bisphenol-A).

Embodiment 41

The device of Embodiments 10-36, wherein the polycarbonate composition comprises polycarbonate comprising carbonate units derived from the polysiloxane block copolymer derived from
the structure

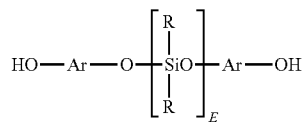

wherein R comprises a $C_1$-$C_{30}$ aliphatic, a $C_6$-$C_{30}$ aromatic group, or a combination thereof, wherein Ar comprises a $C_6$-$C_{30}$ aromatic group, or an alkyl containing a $C_6$-$C_{30}$ aromatic group, and wherein E has an average value of 2-200, or the structure

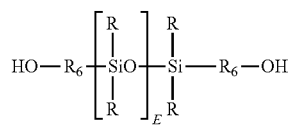

wherein R comprises a $C_1$-$C_{30}$ aliphatic, a $C_6$-$C_{30}$ aromatic group, or a combination thereof, wherein $R_6$ comprise $C_6$-$C_{30}$ aromatic group, or a combination of a $C_6$-$C_{30}$ aromatic group and a $C_1$-$C_{30}$ aliphatic group; wherein E has an average value of 2-200;

wherein the weight % siloxane of (iv) is 1-25%.

Embodiment 42

The device of Embodiment 41, wherein the weight % siloxane of (iv) is 8-15%.

Embodiment 43

The device of Embodiments 41-42, wherein the plastic composition comprises polycarbonate further comprises carbonate units derived from 2,2-bis(4-hydroxyphenyl)propane.

Embodiment 44

The device of Embodiments 41-43, wherein the carbonate units are derived from the polysiloxane blocks having the structure

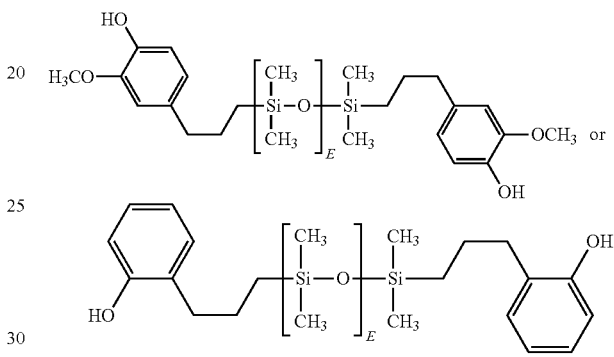

wherein E has an average value of between 20 and 200.

Embodiment 45

The device of Embodiments 41-43, wherein the carbonate units are derived from the polysiloxane blocks are derived from repeating units that are derived from dihydroxy aromatic compounds of formula:

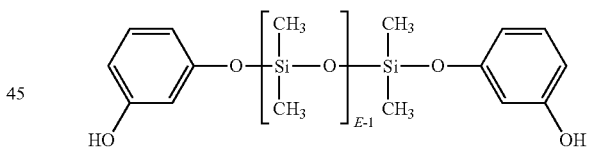

or, wherein the dihydroxy aromatic compounds have a formula:

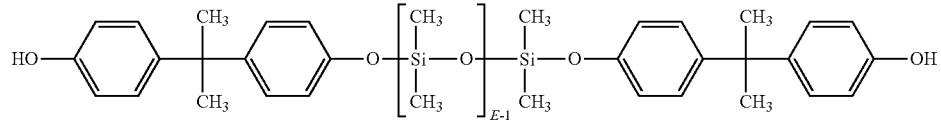

wherein E has an average value of between 20 and 200.

Embodiment 46

The device of Embodiments 10-36, wherein the plastic composition comprises polycarbonate comprising carbonate units derived from one or more polycarbonates wherein at least one of the polycarbonates is a polyesterpolycarbonate having at least one unit derived from sebacic acid and at least one unit is derived from an aromatic dihydroxy carbonate or 2,2-bis(4-hydroxyphenyl)propane; formula

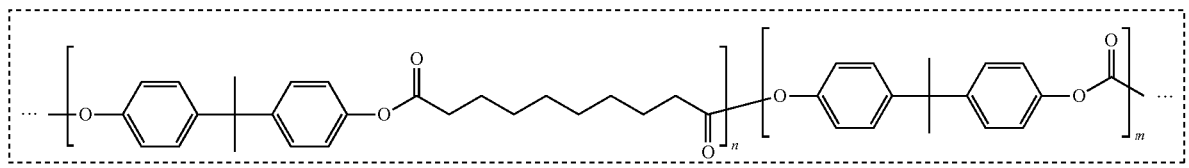

Embodiment 47

The device of Embodiment 46, wherein the sebacic acid derived polycarbonate biocontent is greater than or equal to 7% (±3%) in accordance with ASTM D686-11.

Embodiment 48

The device of Embodiments 10-36, wherein the plastic composition comprises polycarbonate having a repeating structural background of the following formula

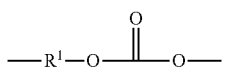

wherein greater than or equal to 60 percent of the total number of $R_1$ groups contain aromatic organic groups and the balance thereof are aliphatic, alicyclic, or aromatic groups; wherein the polycarbonate comprises an end capping agent; and wherein the polycarbonate comprises a branching agent.

Embodiment 49

The device of Embodiment 48, wherein the polycarbonate containing the branching agent and the end-capping agent has a peak melt viscosity of greater than or equal to 8,000 poise when measured using a parallel plate melt rheology test at a heating rate of 10° C./min at a temperature of 350° C. to about 450° C.; and wherein a molded article of the composition has a UL94 V0 rating at a thickness of 1 mm, and a flame retardant.

Embodiment 50

The device of Embodiments 48-49, wherein the end-capping agent has a peak melt viscosity of greater than or equal to 7,000.

Embodiment 51

The device of Embodiments 48-50, wherein the end-capping agent has a pKa of 8.0 to 11.

Embodiment 52

The device of Embodiments 48-51, wherein the end-capping agent has a pKa of 8.2 to 10.2.

Embodiment 53

The device of Embodiments 48-52, wherein the end-capping agent is selected based upon the molecular weight of said polycarbonate and said branching level imparted by said branching agent.

Embodiment 54

The device of Embodiments 48-53, wherein the end-capping agent comprises phenol or a phenol containing one or more substitutions comprising aliphatic groups, olefinic groups, aromatic groups, halogens, ester groups, ether groups, or halogens, or combinations thereof.

Embodiment 55

The device of Embodiments 48-54, wherein the end-capping agent comprises phenol, p-t-butylphenol, p-cumylphenol, p-cyanophenol, and combinations thereof.

Embodiment 56

The device of Embodiments 48-55, wherein the polycarbonate has an MVR of greater than or equal to 3 cm$^3$/10 min.

Embodiment 57

The device of Embodiments 48-56, wherein the polycarbonate has a branching level of greater than or equal to 1%.

Embodiment 58

The device of Embodiments 48-57, wherein the polycarbonate has a branching level of greater than or equal to 2%.

Embodiment 59

The device of Embodiments 48-58, wherein the polycarbonate has a branching level of greater than or equal to 3%.

Embodiment 60

The device of Embodiments 49-59, wherein the flame-retardant comprises alkali metal salts of perfluorinated $C_{1-16}$ alkyl sulfonates; potassium perfluorobutane sulfonate; potassium perfluoroctane sulfonate; tetraethylammonium perfluorohexane sulfonate; potassium diphenylsulfone sulfonate, and combinations comprising at least one of the foregoing.

Embodiment 61

The device of Embodiments 49-60, wherein the flame-retardant comprises a potassium perfluorobutane sulfonate salt greater than about 0.04 wt % based upon the total weight of polycarbonate resin in the composition.

Embodiment 62

The device of Embodiments 49-61, wherein the flame-retardant excludes a chlorine or bromine containing composition.

Embodiment 63

The device of Embodiments 48-62, wherein the branching agent comprises THPE, TMTC, isatin-bis-phenol, and combinations comprising at least one of the foregoing.

Embodiment 64

The device of Embodiments 48-63, wherein the polycarbonate containing said branching agent and said end-capping agent has a weight-average molecular weight of between about 20,000 g/mole to about 40,000 g/mole as measured by gel permeation 7 chromatography using polycarbonate standards.

Embodiment 65

The device of Embodiments 48-64, wherein the polycarbonate is a homopolycarbonate.

Embodiment 66

The device of Embodiments 48-64, wherein the polycarbonate is a copolycarbonate derived from more than one bisphenol.

Embodiment 67

The device of Embodiment 48-64, wherein the polycarbonate is a copolymer derived from one or more bisphenols and containing one or more aliphatic ester units or aromatic ester units or siloxane units.

Embodiment 68

The device of Embodiments 65-67, wherein the polycarbonate comprises units derived from bisphenol A.

Embodiment 69

The device of Embodiments 48-68, further comprising a second polycarbonate, wherein said second polycarbonate comprises the formula:

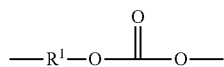

wherein said second polycarbonate is different from said polycarbonate and wherein at least 60 percent of the total number of $R^1$ groups contain aromatic organic groups and the balance thereof are aliphatic, alicyclic, or aromatic groups.

Embodiment 70

The device of Embodiment 69, wherein the second polycarbonate comprises units derived from bisphenol A.

Embodiment 71

The device of Embodiments 4-70, further comprising one or more additives.

Embodiment 72

The device of Embodiments 4-71, wherein the additives comprise UV stabilizing additives, thermal stabilizing additives, mold release agents, colorants, organic fillers, inorganic fillers, gamma-stabilizing agents, or combinations thereof.

Embodiment 73

The device of Embodiments 4-72, wherein the polycarbonate containing said branching agent and said end-capping agent has a peak melt viscosity of at least 7000 poise when calculated from the equation of wherein said peak melt viscosity equals: $-57135.91+36961.39*BL+14001.13*MW^{1/3}-46944.24*pKa-322.51*BL*MW^{1/3}-2669.19*BL*pKa+215.83*MW^{1/3}*pKa+1125.63*BL^2-200.11*MW^{2/3}+2231.15*pKa^2$, wherein BL is the mole ratio of the branching agent in the formulation determined by dividing the number of moles of branching agent by the total number of moles of bisphenol or bisphenols in the composition, the MW is the weight-averaged molecular weight of said polycarbonate containing said branching agent and said end-capping agent as determined by gel permeation chromatography using polycarbonate standards, and the pKa is the pKa of the end-capping agent; and wherein a molded article of the composition has a UL94 V0 rating at a thickness of 1 mm, 1.5 mm, 2.0 mm, or between 1.0 mm and 2.0 mm.

Embodiment 74

The device of Embodiments 4-73, wherein the device has a UL94 V0 rating at a thickness of 1.5 mm.

Embodiment 75

The device of Embodiments 4-74, wherein the device has a UL94 V0 rating at a thickness of 1.0 mm.

Embodiment 76

The device of Embodiments 1-75, further comprising an additional polycarbonate, wherein said polycarbonate is linear and/or branched polycarbonate.

Embodiment 77

The device of Embodiments 1-76, further comprising one or more additives, wherein said additives do not have an adverse effect on a required emission profile of said device.

Embodiment 78

A device of Embodiments 1-77, wherein the device is a lighting element comprising an LED.

Embodiment 79

A device of Embodiments 1-78, wherein the device is at least one of the following: a lamp, illumination device, lighting device for applications in the interior and exterior area, vehicle lighting, internal lighting of residential and work rooms, backlight units of LCD screens, and accent lighting.

Embodiment 80

The device of Embodiment 79, further comprising a dimmer configured to reduce an amount of light emitted from the device.

Embodiment 81

A light-emitting device, comprising: a means for emitting radiation having a first wavelength range, wherein the means for emitting radiation is located in a housing, wherein the housing is formed from a plastic composition comprising: the polycarbonate composition of Embodiments 1-9; and means for absorbing at least a portion of the first wavelength range radiation and emitting radiation having a second wavelength range; wherein after the means for absorbing has been exposed to the radiation, the means for absorbing has a luminescence lifetime of less than $10^{-4}$ seconds when the radiation exposure stops; wherein the means for absorbing comprises greater than 0 ppm of a first material selected from at least one of the following Si, Sr, Ba, Ca, Eu, and combinations comprising at least one of the foregoing first materials, and less than 50 ppm of a second material selected from at least one of the following Al, Co, Fe, Mg, Mo, Na, Ni, Pd, P, Rh, Sb, Ti, Zr, and combinations comprising at least one of the foregoing second materials.

Embodiment 82

The use of a plastic composition as a housing for a light emitting element, wherein the plastic composition comprises the polycarbonate composition of Embodiments 1-9; and a conversion material, wherein the conversion material comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials; wherein after the conversion material has been exposed to an excitation source, the conversion material has a luminescence lifetime of less than 1-4 seconds when the excitation source is removed.

Embodiment 83

The use of a plastic composition as described in Embodiments 1-9 for a light emitting element.

Embodiment 84

A light-emitting device containing the plastic composition of Embodiments 1-9, and a is 0.001 to 2 wt % of an inorganic particle having an average particle diameter of 0.1 to 1 micrometers and a refractive index of 1.9 to 3.2; b is 0.01 to 10 wt % of a polymeric particle as described in Embodiments 1-80 having an average particle size in the range if from 0.2 to 20 microns that differs in refractive index at 589 nm by at least 0.05 from that of the thermoplastic resin polymer and one or mixtures of c, d, or a mixture thereof wherein c is 0.1 to 1,000 ppm of wavelength downshifting material, and d is 0.005 to 2 weight percent of an interference pigment.

Embodiment 85

A lighting device, comprising: a radiation source configured to emit radiation having a first wavelength range; an optical component comprising the plastic composition comprising: the polycarbonate composition of Embodiments 1-9; and a conversion material, wherein the conversion material comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials; wherein after the conversion material has been exposed to an excitation source, the conversion material has a luminescence lifetime of less than $10^{-4}$ seconds when the excitation source is removed.

Embodiment 86

A lighting device, comprising: a radiation source configured to emit radiation having a first wavelength range; an optical component comprising the plastic composition comprising: the polycarbonate composition of Embodiments 1-9; and a conversion material, wherein the conversion material comprises yttrium aluminum garnet (YAG) doped with a rare earth element, terbium aluminum garnet doped with a rare earth element; nitrido silicates doped with a rare earth element; nitride orthosilicate doped with a rare earth element, oxonitridoaluminosilicates doped with a rare earth element, and combinations comprising at least one of the foregoing; wherein after the conversion material has been exposed to an excitation source, the conversion material has a luminescence lifetime of less than $10^{-4}$ seconds when the excitation source is removed.

It is noted herein that all weight percents do not exceed 100 wt %.

Also, all ranges disclosed herein are inclusive of the endpoints, and the endpoints are independently combinable with each other, and inclusive of all intermediate values of the ranges. Thus, ranges articulated within this disclosure, e.g. numerics/values, shall include disclosure for possession purposes and claim purposes of the individual points within the range, sub-ranges, and combinations thereof.

Reference throughout the specification to "one embodiment", "another embodiment", "an embodiment", and so forth means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments. Various combinations of elements of this disclosure are encompassed by the embodiments disclosed herein, e.g. combinations of elements from dependent claims that depend upon the same independent claim.

The suffix "(s)" as used herein is intended to include both the singular and the plural of the term that it modifies, thereby including one or more of that term (e.g., the colorant(s) includes one or more colorants).

In general, the compositions or methods may alternatively comprise, consist of, or consist essentially of, any appropriate components or steps herein disclosed. The invention may additionally, or alternatively, be formulated so as to be devoid, or substantially free, of any components, materials, ingredients, adjuvants, or species, or steps used in the prior art compositions or that are otherwise not necessary to the achievement of the function and/or objectives of the present claims.

As used herein, "combination" is inclusive of blends, mixtures, alloys, reaction products, and the like.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications, variations, improvements, and substantial equivalents.

What is claimed is:

1. A composition comprising:
   a conversion material and a bisphenol-A polycarbonate;
   wherein a molded article of the bisphenol-A polycarbonate has a transmission level of greater than or equal to 90.0% at a thickness of 2.5 mm as measured by ASTM D1003-00; and
   wherein the molded article comprises an increase in the yellow index of less than 2 during 2,000 hours of heat aging at 130° C.; and
   wherein the conversion material comprises a yellow conversion material, a green conversion material, a red conversion material, or a combination comprising at least one of the foregoing.

2. The composition of claim 1, wherein the conversion material absorbs an absorbed portion of a first radiation with a first wavelength of 300 nm to 500 nm and emits a second radiation at a different wavelength than the first wavelength.

3. The composition of claim 1, wherein the different wavelength is 450 nm to 700 nm.

4. The composition of claim 1, wherein the conversion material comprises a green aluminate.

5. The composition of claim 1, wherein the conversion material comprises a yellow conversion material.

6. The composition of claim 1, wherein the conversion material comprises yttrium aluminum garnet doped with cerium.

7. The composition of claim 1, wherein the conversion material comprises a nitride conversion material that is optionally doped with cerium and/or europium, a nitrido silicate, a nitride orthosilicate, an oxonitridoaluminosilicate, or a combination comprising at least one of the foregoing.

8. The composition of claim 1, wherein the conversion material is doped with europium.

9. The composition of claim 1, wherein the conversion material has a median particle size of 1 to 20 micrometers.

10. The composition of claim 1, wherein the conversion material comprises greater than 0 ppm of a first material comprising at least one of the following Si, Sr, Ba, Ca, Eu, and combinations comprising at least one of the foregoing first materials; and less than 50 ppm of a second material comprising at least one of the following Al, Co, Fe, Mg, Mo, Na, Ni, Pd, P, Rh, Sb, Ti, Zr, and combinations comprising at least one of the foregoing second materials.

11. The composition of claim 1, wherein the conversion material comprises a red conversion material.

12. The composition of claim 11, wherein the red conversion material comprises $(Sr,Ca)AlSiN_3:Eu$.

13. An article comprising
   a composition comprising
      a conversion material and a bisphenol-A polycarbonate;
      wherein a molded article of the bisphenol-A polycarbonate has a transmission level of greater than or equal to 90.0% at a thickness of 2.5 mm as measured by ASTM D1003-00; and wherein the molded article comprises an increase in the yellow index of less than 2 during 2,000 hours of heat aging at 130° C.; and
      wherein the conversion material comprises a yellow conversion material, a green conversion material, a red conversion material, or a combination comprising at least one of the foregoing;
   wherein the article is an illumination device.

14. The article of claim 13, further comprising a LED that emits a first radiation that excites the conversion material to emit radiation at a different wavelength than the first radiation.

15. The article of claim 13, wherein the article is a backlight of a liquid crystal display device or a dimmable solid state lighting device.

16. The article of claim 13, wherein the article is for use in aviation lighting or automotive lighting.

17. The article of claim 13, wherein the conversion material comprises a green aluminate.

18. The article of claim 13, wherein the conversion material comprises a red conversion material.

19. The article of claim 18, wherein the red conversion material comprises $(Sr,Ca)AlSiN_3:Eu$.

20. The article of claim 18, wherein the illumination device comprises a semiconductor light-emitting element and a light-emitting portion comprising the composition;
   wherein the semiconductor light-emitting element emits a first radiation at a first radiation wavelength of 300 nm to 500 nm; and wherein the conversion material is excited by the first radiation.

* * * * *